(12) United States Patent  
Koyama et al.

(10) Patent No.: US 9,147,462 B2  
(45) Date of Patent: Sep. 29, 2015

(54) SIGNAL PROCESSING CIRCUIT AND METHOD FOR DRIVING THE SAME

(71) Applicant: Semiconductor Energy Laboratory Co., Ltd., Atsugi-shi, Kanagawa-ken (JP)

(72) Inventors: Jun Koyama, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/088,498

(22) Filed: Nov. 25, 2013

(65) Prior Publication Data

US 2014/0078816 A1   Mar. 20, 2014

Related U.S. Application Data

(62) Division of application No. 13/008,049, filed on Jan. 18, 2011, now Pat. No. 8,593,856.

(30) Foreign Application Priority Data

Jan. 20, 2010   (JP) ................................. 2010-009908

(51) Int. Cl.
*G11C 11/24* (2006.01)
*G11C 11/4074* (2006.01)
(Continued)

(52) U.S. Cl.
CPC .......... *G11C 11/4074* (2013.01); *G11C 11/412* (2013.01); *G11C 27/024* (2013.01);
(Continued)

(58) Field of Classification Search
CPC ...................................................... G11C 11/24
USPC ................................................... 365/149, 145
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

CN         001758380 A    4/2006
CN         001991947 A    7/2007
(Continued)

OTHER PUBLICATIONS

International Search Report, PCT Application No. PCT/JP2010/073888, dated Feb. 1, 2011, 2 pages.
(Continued)

*Primary Examiner* — Harry W Byrne
(74) *Attorney, Agent, or Firm* — Fish & Richardson P.C.

(57) ABSTRACT

It is an object to provide a memory device for which a complex manufacturing process is not necessary and whose power consumption can be suppressed and a signal processing circuit including the memory device. In a memory element including a phase-inversion element by which the phase of an input signal is inverted and the signal is output such as an inverter or a clocked inverter, a capacitor which holds data and a switching element which controls storing and releasing of electric charge in the capacitor are provided. For the switching element, a transistor including an oxide semiconductor in a channel formation region is used. The memory element is applied to a memory device such as a register or a cache memory included in a signal processing circuit.

17 Claims, 29 Drawing Sheets

(51) Int. Cl.

| | | |
|---|---|---|
| G11C 11/412 | (2006.01) | |
| G11C 27/02 | (2006.01) | |
| H03K 3/037 | (2006.01) | |
| H03K 3/356 | (2006.01) | |
| H01L 27/12 | (2006.01) | |

(52) U.S. Cl.
CPC ........ *H01L27/1222* (2013.01); *H01L 27/1225* (2013.01); *H01L 27/1251* (2013.01); *H03K 3/0375* (2013.01); *H03K 3/356008* (2013.01)

(56) References Cited

U.S. PATENT DOCUMENTS

| | | | |
|---|---|---|---|
| 6,294,274 B1 | 9/2001 | Kawazoe et al. | |
| 6,426,908 B1 | 7/2002 | Hidaka | |
| 6,487,136 B2 | 11/2002 | Hidaka | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,189,992 B2 | 3/2007 | Wager, III et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,187 B2 | 3/2008 | Wager, III et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,516,171 B2 * | 4/2009 | Uehara | 708/490 |
| 7,663,165 B2 | 2/2010 | Mouli | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,796,102 B2 | 9/2010 | Ishizuka et al. | |
| 7,888,207 B2 | 2/2011 | Wager, III et al. | |
| 7,935,582 B2 | 5/2011 | Iwasaki | |
| 7,956,361 B2 | 6/2011 | Iwasaki | |
| 8,004,481 B2 | 8/2011 | Yamazaki et al. | |
| 8,154,024 B2 | 4/2012 | Iwasaki | |
| 8,212,750 B2 | 7/2012 | Yamazaki et al. | |
| 8,314,637 B2 * | 11/2012 | Kato et al. | 326/102 |
| 8,531,364 B2 | 9/2013 | Yamazaki et al. | |
| 8,687,918 B2 | 4/2014 | Tamura | |
| 8,742,412 B2 | 6/2014 | Goyal et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0095975 A1 | 5/2006 | Yamada et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0019460 A1 * | 1/2007 | Kang et al. | 365/145 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0126666 A1 | 6/2007 | Yamazaki et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108198 A1 | 5/2008 | Wager et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0170028 A1 | 7/2008 | Yoshida | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0276689 A1 | 11/2010 | Iwasaki | |
| 2010/0279462 A1 | 11/2010 | Iwasaki | |
| 2011/0156024 A1 | 6/2011 | Koyama et al. | |
| 2011/0193082 A1 | 8/2011 | Iwasaki | |
| 2013/0127497 A1 | 5/2013 | Koyama | |

FOREIGN PATENT DOCUMENTS

| | | |
|---|---|---|
| CN | 101258607 A | 9/2008 |
| EP | 1074993 A | 2/2001 |
| EP | 1130602 A | 9/2001 |
| EP | 1152431 A | 11/2001 |
| EP | 1 737 044 A1 | 12/2006 |
| EP | 2 226 847 A2 | 9/2010 |
| EP | 2 517 355 A1 | 6/2011 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63239117 A | 10/1988 |
| JP | 63-265818 A | 11/1988 |

(56) References Cited

FOREIGN PATENT DOCUMENTS

| | | |
|---|---|---|
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-052476 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-078772 A | 3/2004 |
| JP | 2004-103957 A | 4/2004 |
| JP | 2004-273614 A | 9/2004 |
| JP | 2004-273732 A | 9/2004 |
| JP | 2006-502597 | 1/2006 |
| JP | 2006-050208 A | 2/2006 |
| JP | 2007-096055 A | 4/2007 |
| JP | 2007-123861 A | 5/2007 |
| JP | 2007-125823 A | 5/2007 |
| JP | 2007-179021 A | 7/2007 |
| JP | 2009-206508 A | 9/2009 |
| JP | 2009-535819 | 10/2009 |
| TW | 200535759 | 11/2005 |
| TW | 200952470 | 12/2009 |
| WO | WO-2004/038757 | 5/2004 |
| WO | WO 2004/114391 A1 | 12/2004 |
| WO | WO-2007/029844 | 3/2007 |
| WO | WO-2008/027392 | 3/2008 |
| WO | WO-2009/096608 | 8/2009 |
| WO | WO 2011/078373 A1 | 6/2011 |

OTHER PUBLICATIONS

Written Opinion, PCT Application No. PCT/JP2010/073888, dated Feb. 1, 2011, 4 pages.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,$YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

(56) References Cited

OTHER PUBLICATIONS

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMo3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.
Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Orita, M et al., "Amorphous transprarent conductive oxide InGaO3(ZnO3)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-19.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by PEALD Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
European Search Report (EP Application No. 10844011.6) dated Oct. 2, 2013, 8 pages.
Chinese Office Action (Application No. 201080065583.6) Dated Jul. 24, 2014.
J. Park et al., "High performance amorphous oxide thin film transistors with self-aligned top-gate structure"; IEDM 09: Technical Digest of International Electron Devices Meeting; Dec. 7, 2009; pp. 191-194.
Taiwanese Office Action (Application No. 100101963) Dated Jul. 29, 2015.

* cited by examiner

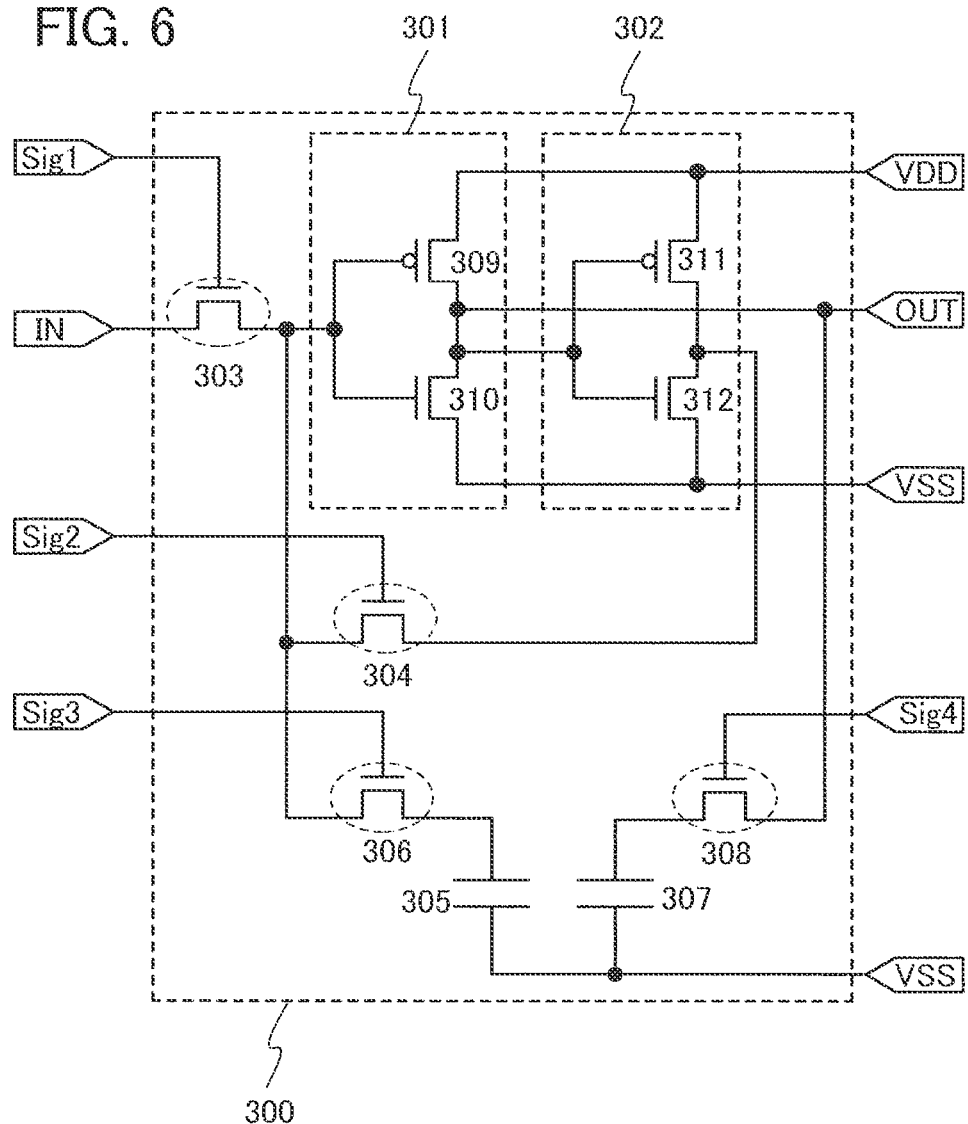

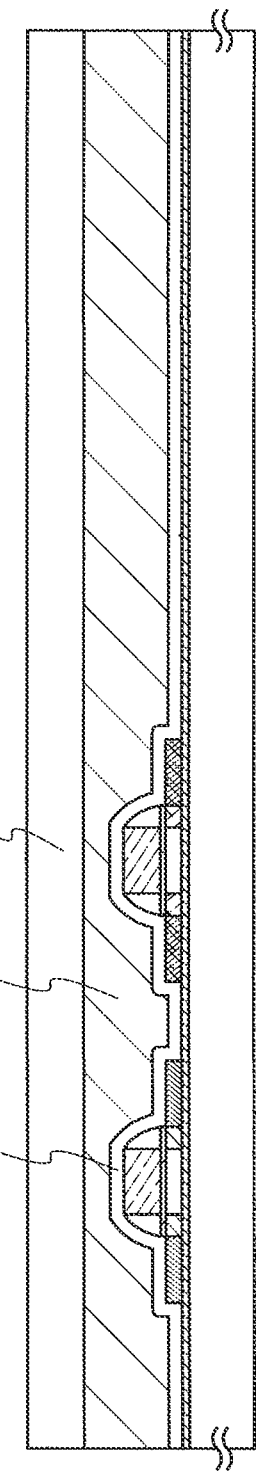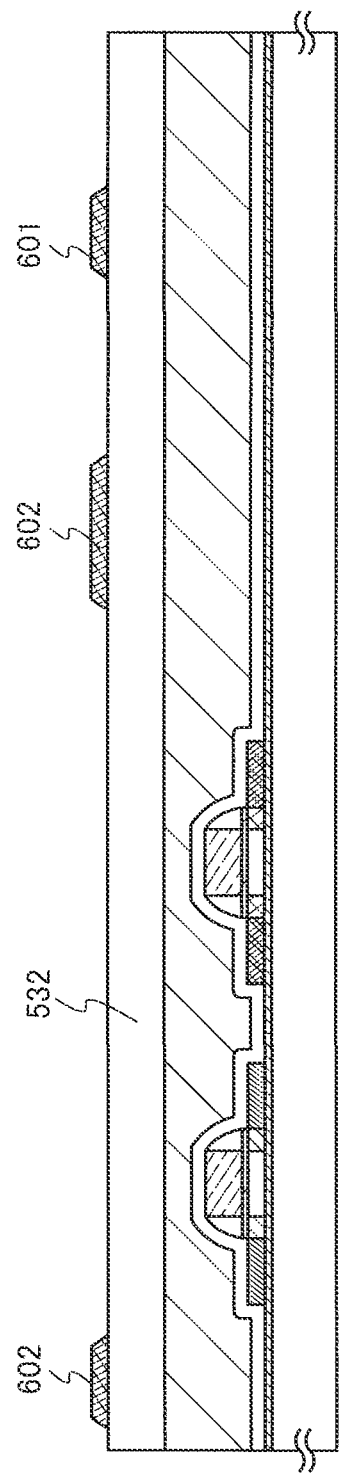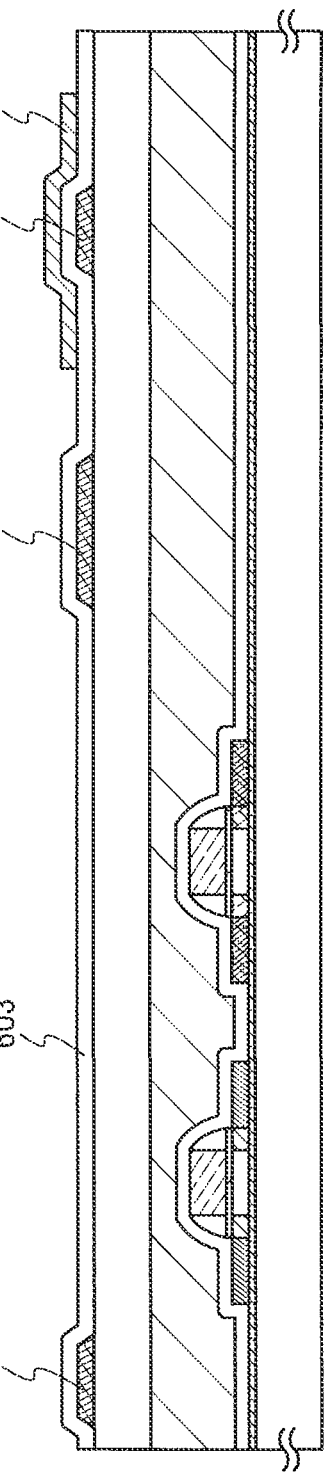

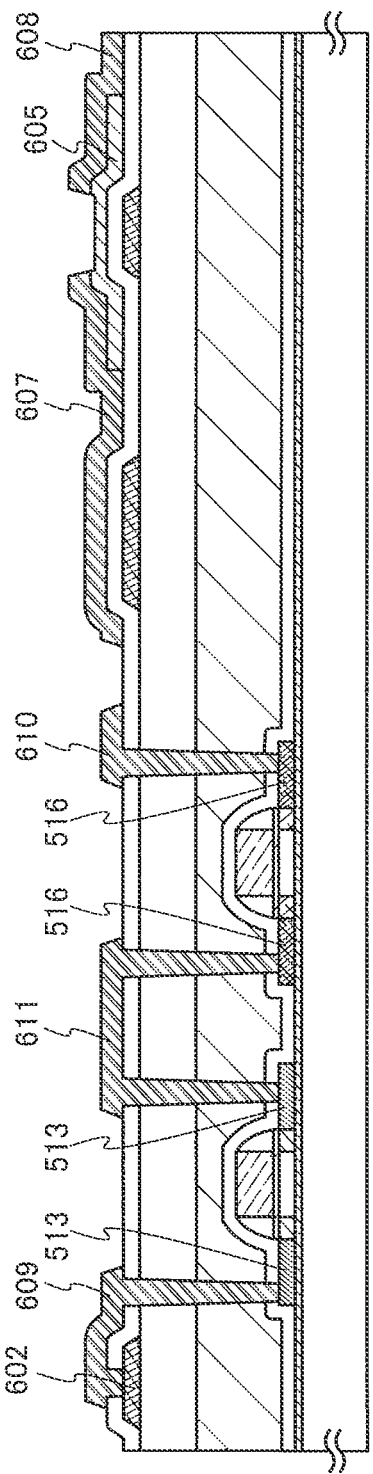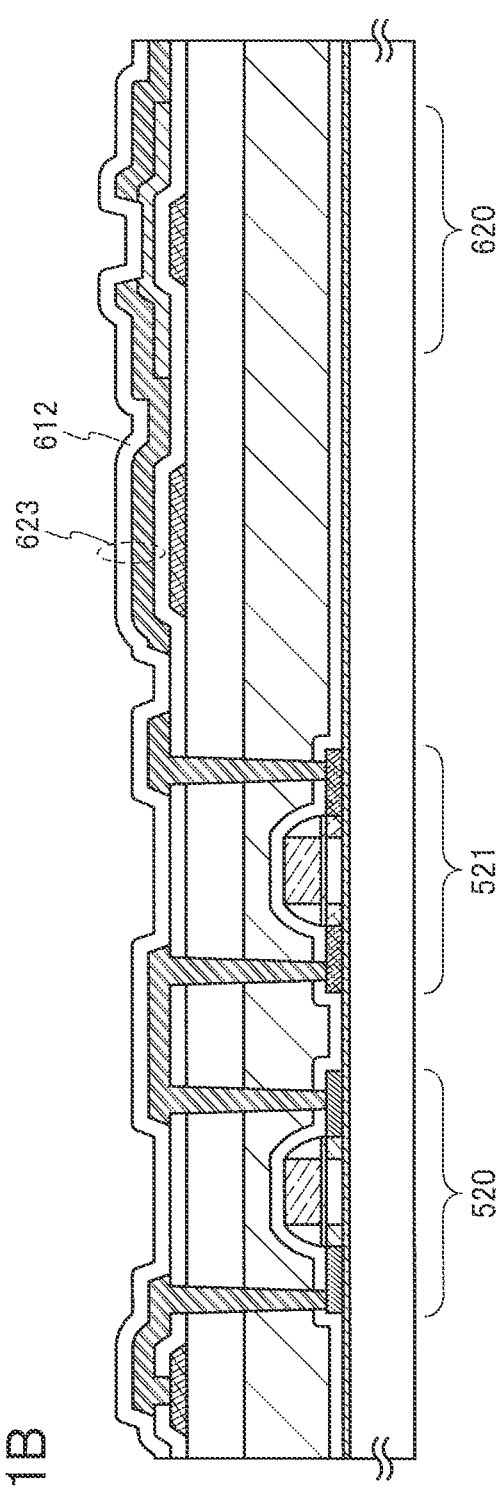

(VG>0)

(VG<0)

SIGNAL PROCESSING CIRCUIT AND METHOD FOR DRIVING THE SAME

CROSS-REFERENCE TO RELATED APPLICATIONS

This application is a divisional of U.S. application Ser. No. 13/008,049, filed Jan. 18, 2011, now allowed, which claims the benefit of a foreign priority application filed in Japan as Serial No. 2010-009908 on Jan. 20, 2010, both of which are incorporated by reference.

TECHNICAL FIELD

The present invention relates to a signal processing circuit in which a nonvolatile semiconductor memory device is used, and a method for driving the signal processing circuit.

BACKGROUND ART

In recent years, a metal oxide having semiconductor characteristics, which is called an oxide semiconductor, has attracted attention as a novel semiconductor material having high mobility as in the case of polysilicon or microcrystalline silicon and having uniform element characteristics as in the case of amorphous silicon. A metal oxide is used for various applications. For example, indium oxide is a well-known metal oxide and used as a material of a transparent electrode included in a liquid crystal display device or the like. Examples of the metal oxide having semiconductor characteristics include tungsten oxide, tin oxide, indium oxide, and zinc oxide. Transistors in which a channel formation region is formed using such a metal oxide having semiconductor characteristics are already known (Patent Documents 1 and 2).

REFERENCE

Patent Document

[Patent Document 1] Japanese Published Patent Application No. 2007-123861
[Patent Document 2] Japanese Published Patent Application No. 2007-096055

DISCLOSURE OF INVENTION

A signal processing circuit such as a central processing unit (CPU) has a variety of configurations depending on its application but is generally provided with various semiconductor memory devices (hereinafter simply referred to as memory devices) such as a register and a cache memory as well as a main memory for storing data or a program. A register has a function of temporarily holding data for carrying out arithmetic processing, holding a program execution state, or the like. In addition, a cache memory is provided in a CPU so as to be located between an arithmetic unit and a main memory in order to reduce low-speed access to the main memory and speed up the arithmetic processing.

In a memory device such as a register or a cache memory, writing of data needs to be performed at higher speed than in a main memory. Therefore, in general, a flip-flop is used as a register and an SRAM or the like is used as a cache memory.

In FIG. 16A, a memory element which constitutes a register, in which inverters are used, is illustrated. A register 1300 illustrated in FIG. 16A includes an inverter 1301, an inverter 1302, a switching element 1303, and a switching element 1304. Input of a signal IN to an input terminal of the inverter 1301 is controlled by the switching element 1303. A potential of an output terminal of the inverter 1301 is supplied to a circuit of a subsequent stage as a signal OUT. The output terminal of the inverter 1301 is connected to an input terminal of the inverter 1302, and an output terminal of the inverter 1302 is connected to the input terminal of the inverter 1301 via the switching element 1304.

When the switching element 1303 is turned off and the switching element 1304 is turned on, a potential of the signal IN which is input via the switching element 1303 is held in the register 1300.

A more specific circuit configuration of the register 1300 in FIG. 16A is illustrated in FIG. 16B. The register 1300 illustrated in FIG. 16B includes the inverter 1301, the inverter 1302, the switching element 1303, and the switching element 1304. The connection structure of these circuit elements are the same as that in FIG. 16A.

The inverter 1301 includes a p-channel transistor 1310 and an n-channel transistor 1311 whose gate electrodes are connected to each other. In addition, the p-channel transistor 1310 and the n-channel transistor 1311 are connected in series between a node to which a high-level power supply potential VDD is supplied and a node to which a low-level power supply potential VSS is supplied. In a similar manner, the inverter 1302 includes a p-channel transistor 1312 and an n-channel transistor 1313 whose gate electrodes are connected to each other. In addition, the p-channel transistor 1312 and the n-channel transistor 1313 are connected in series between a node to which the high-level power supply potential VDD is supplied and a node to which the low-level power supply potential VSS is supplied.

The inverter 1301 illustrated in FIG. 16B operates such that one of the p-channel transistor 1310 and the n-channel transistor 1311 is turned on and the other is turned off according to levels of potentials supplied to the gate electrodes thereof. Thus, current between the node to which the power supply potential VDD is supplied and the node to which the power supply potential VSS is supplied should be ideally zero. However, actually, a minute amount of off-state current flows in the transistor which should be off; therefore, the current between the nodes cannot be completely zero. A similar phenomenon also occurs in the inverter 1302; as a result, power is consumed in the register 1300 even in a hold state where writing of data is not performed.

In the case of an inverter manufactured using bulk silicon for example, an off-state current of about 1 pA is generated at room temperature at a voltage between nodes of about 3 V, although it depends on the size of a transistor. The memory element illustrated in FIGS. 16A and 16B includes two inverters: the inverter 1301 and the inverter 1302; therefore, an off-state current of about 2 pA is generated. In the case of a register including about $10^7$ memory elements, the off-state current of the register is 20 μA. As the temperature of an IC chip in which the register is provided becomes higher, the power consumption becomes larger and the off-state current of only the register is several milliamperes.

Like the register, an SRAM also includes an inverter, and thus power is consumed due to the off-state current of a transistor. In addition, a DRAM which is highly integrated is mainly used for a main memory. In the DRAM, electric charge is released from a capacitor for holding data with passage of time, which makes refresh operation necessary; thus, power is consumed. As described above, as in the case of the register, power is consumed in a cache memory including the SRAM and a main memory including the DRAM even in a hold state where writing of data is not performed.

In order to suppress power consumption, a method for temporarily stopping the supply of a power supply potential to a memory device in a period during which data is not input and output has been suggested. A volatile memory device in which data is erased when the supply of a power supply potential is stopped is used for a register, a cache memory, and a main memory. Therefore, in the method, a nonvolatile memory device is provided around the volatile memory device and the data is temporarily transferred to the nonvolatile memory device. However, since such a nonvolatile memory device is mainly formed using a magnetic element or a ferroelectric, the manufacturing process is complex.

In addition, in the case where the power supply is stopped for a long time in a CPU, data in a memory device is transferred to an external memory device such as a hard disk or a flash memory before the power supply is stopped, so that the data can be prevented from being erased. However, it takes time to place the data back in a register, a cache memory, and a main memory from such an external memory device. Therefore, back up of data using the external memory device such as a hard disk or a flash memory is not suitable in the case where the power supply is stopped for a short time so as to reduce power consumption.

In view of the above-described problems, it is an object of one embodiment of the present invention to provide a signal processing circuit for which a complex manufacturing process is not necessary and whose power consumption can be suppressed and a method for driving the signal processing circuit. In particular, it is an object to provide a signal processing circuit whose power consumption can be suppressed by stopping the power supply for a short time and a method for driving the signal processing circuit.

In a memory element including a logic element by which the phase of an input signal is inverted and the signal is output (hereinafter referred to as a phase-inversion element) such as an inverter or a clocked inverter, a capacitor which holds data and a switching element which controls storing and releasing of electric charge in the capacitor are provided. For the switching element, a transistor including an oxide semiconductor in a channel formation region is used. The above memory element is used for a memory device such as a register, a cache memory, or a main memory in a signal processing circuit.

Further, the signal processing circuit includes various logic circuits such as an arithmetic circuit which transmits/receives data to/from the memory device in addition to the memory device. Not only the supply of power supply voltage to the memory device but also the supply of power supply voltage to the arithmetic circuit which transmits/receives data to/from the memory device may be stopped.

The memory device may have a switching element which controls the supply of power supply voltage to a plurality of memory elements. In the case where the supply of power supply voltage to the arithmetic circuit is stopped, the arithmetic circuit may include, as well as a logic circuit which carries out arithmetic processing, a switching element which controls the supply of power supply voltage to the logic circuit.

Specifically, a memory element at least includes two phase-inversion elements, a capacitor, and a switching element which controls storing and releasing of electric charge in the capacitor. A signal including data that is input to the memory element is supplied to an input terminal of a first phase-inversion element. An output terminal of the first phase-inversion element is connected to an input terminal of a second phase-inversion element. An output terminal of the second phase-inversion element is connected to the input terminal of the first phase-inversion element. A potential of the output terminal of the first phase-inversion element or the input terminal of the second phase-inversion element is output to a memory element or another circuit of a subsequent stage as a signal.

Each of the phase-inversion elements has a structure in which at least one p-channel transistor and at least one n-channel transistor whose gate electrodes are connected to each other are connected in series between a first node and a second node.

In order to store data of a signal that is input to the memory element as needed, the capacitor is connected to a node to which a potential of the signal is supplied, via the switching element.

In the state where power supply voltage is applied between the first node and the second node, when a signal including data is input to the input terminal of the first phase-inversion element, the data is held in the first phase-inversion element and the second phase-inversion element. In the case where the application of the power supply voltage between the first node and the second node is stopped, before the application of the power supply voltage is stopped, the switching element is turned on and the data of the signal is stored in the capacitor. With the above-described structure, even when the application of the power supply voltage to the phase-inversion elements is stopped, data can be held in the memory element.

A channel formation region of a transistor used for the switching element includes a highly purified oxide semiconductor, and therefore, the transistor has a characteristic of extremely low off-state current.

The oxide semiconductor is a metal oxide having semiconductor characteristics, and has high mobility as in the case of microcrystalline or polycrystalline silicon, and uniform element characteristics as in the case of amorphous silicon. In addition, an oxide semiconductor which is highly purified (a purified OS) by reduction of impurities such as moisture or hydrogen which serve as electron donors (donors) is an i-type semiconductor (an intrinsic semiconductor) or a semiconductor extremely close to an i-type semiconductor (a substantially i-type semiconductor). Specifically, impurities such as moisture or hydrogen contained in the oxide semiconductor are removed so that the value of the hydrogen concentration in the oxide semiconductor measured by secondary ion mass spectrometry (SIMS) can be less than or equal to $5\times10^{19}/cm^3$, preferably less than or equal to $5\times10^{18}/cm^3$, more preferably less than or equal to $5\times10^{17}/cm^3$, still more preferably less than or equal to $1\times10^{16}/cm^3$. With the above-described structure, the carrier density of an oxide semiconductor film, which can be measured by Hall effect measurement, can be less than $1\times10^{14}$ cm$^{-3}$, preferably less than $1\times10^{12}$ cm$^{-3}$, more preferably less than $1\times10^{11}$ cm$^{-3}$ that is less than or equal to the measurement limit. That is, the carrier density of the oxide semiconductor film can be extremely close to zero. Furthermore, the band gap of the oxide semiconductor is greater than or equal to 2 eV, preferably greater than or equal to 2.5 eV, more preferably greater than or equal to 3 eV. Thus, with the use of the oxide semiconductor film which is highly purified by sufficiently reducing the concentration of impurities such as moisture or hydrogen, the off-state current of the transistor can be reduced.

The analysis of the hydrogen concentration in an oxide semiconductor film and a conductive film is described here. The hydrogen concentration in the oxide semiconductor film and the conductive film is measured by SIMS. It is known that it is difficult to obtain accurate data of the proximity of a surface of a sample or the proximity of an interface between stacked films formed using different materials in SIMS due to its principle. Thus, in the case where distribution of the hydrogen concentration in a film in a thickness direction is analyzed by SIMS, an average value of a region in a range in which the film that is a measurement object is provided is employed as the hydrogen concentration. In the region, the value is not greatly changed and can be substantially constant. However, in the case where the thickness of the film that is a measurement object is small, a region where the value can be substantially constant cannot be found in some cases due to the influence of the hydrogen concentration of an adjacent film. In such a case, the maximal value or the minimal value of the hydrogen concentration in a region where the film is provided is employed as the hydrogen concentration of the film. Furthermore, in the case where there are no mountain-shaped peak indicating the maximal value and no valley-shaped peak indicating the minimal value in the region where the film is provided, the value of the inflection point is employed as the hydrogen concentration.

It is found that an oxide semiconductor film formed by sputtering or the like contains a large amount of moisture or hydrogen that is an impurity. Moisture or hydrogen easily forms a donor level and thus serve as an impurity in the oxide semiconductor. Therefore, in one embodiment of the present invention, in order to reduce impurities such as moisture or hydrogen in the oxide semiconductor film, the oxide semiconductor film is subjected to heat treatment in a reduced pressure atmosphere, an atmosphere of an inert gas such as nitrogen or a rare gas, an oxygen gas atmosphere, or an ultra dry air atmosphere (the moisture amount is less than or equal to 20 ppm (−55° C. by conversion into a dew point), preferably less than or equal to 1 ppm, more preferably less than or equal to 10 ppb, in the case where measurement is performed with the use of a dew point meter of a cavity ring down laser spectroscopy (CRDS) system). The temperature of the heat treatment is greater than or equal to 500° C. and less than or equal to 850° C. (or less than or equal to the strain point of a glass substrate), preferably greater than or equal to 550° C. and less than or equal to 750° C. Note that this heat treatment is performed at a temperature that does not exceed the allowable temperature limit of a substrate used. An effect of elimination of moisture or hydrogen by the heat treatment has been confirmed by thermal desorption spectrometry (TDS).

Heat treatment in a furnace or a rapid thermal annealing (RTA) method is used for the heat treatment. As an RTA method, a method using a lamp light source or a method in which heat treatment is performed for a short time while a substrate is transferred to a heated gas can be employed. With the use of an RTA method, time necessary for the heat treatment can be shorter than 0.1 hour.

Specifically, a transistor including an oxide semiconductor film that is highly purified by the above-described heat treatment as an active layer has an extremely low off-state current. For example, even when the element has a channel width (W) of $1\times10^6$ μm and a channel length (L) of 10 μm, off-state current (drain current when the voltage between a gate electrode and a source electrode is less than or equal to 0 V) can be less than or equal to the measurement limit of a semiconductor parameter analyzer, i.e., less than or equal to $1\times10^{-13}$ A, at a voltage (drain voltage) between the source electrode and a drain electrode of from 1 V to 10 V. Therefore, off-state current density that is a numerical value which is calculated by dividing the off-state current by the channel width of the transistor is less than or equal to 100 zA/μm. Further, when a transistor including a highly purified oxide semiconductor film and a 100-nm-thick gate insulating film was used for a switching element for holding electric charge of a storage capacitor and the off-state current of the transistor was measured with the use of a change in the amount of electric charge in the storage capacitor per unit hour, it was found that the transistor has a much lower off-state current density, which is from 10 zA/μm to 100 zA/μm, at a voltage between a source electrode and a drain electrode of 3 V. Thus, in the memory device which is one embodiment of the present invention, the off-state current density of the transistor including the highly purified oxide semiconductor film as an active layer can be less than or equal to 100 zA/μm, preferably less than or equal to 10 zA/μm, more preferably less than or equal to 1 zA/μm. Accordingly, the transistor including the highly purified oxide semiconductor film as an active layer has much lower off-state current than a transistor including silicon having crystallinity.

In addition, a transistor including a highly purified oxide semiconductor shows almost no temperature dependence of off-state current. One of the reasons is that the conductivity type becomes extremely close to intrinsic and the Fermi level is located in the middle of the forbidden band as the oxide semiconductor is highly purified by removal of impurities which serve as electron donors (donors) in the oxide semiconductor. Another reason is that the oxide semiconductor has an energy gap of greater than or equal to 3 eV and includes very few thermally excited carriers. Still another reason for almost no temperature dependence is that a source electrode and a drain electrode are in a degenerate state. The operation of the transistor is mostly performed by carriers injected to the oxide semiconductor from the degenerate source electrode, and the carrier density does not have temperature dependence; therefore, there is almost no temperature dependence of off-state current.

By using the transistor having the above-described structure as a switching element for holding electric charge stored in the capacitor, leakage of electric charge from the capacitor can be prevented; therefore, even without application of power supply voltage, data is not erased but can be held. In a period during which data is held in the capacitor, the power supply voltage is not necessarily supplied to the phase-inversion elements; as a result, surplus power consumption due to the off-state current of transistors used for the phase-inversion elements can be reduced, and the power consumption of the memory device and further the signal processing circuit including the memory device can be suppressed to be low.

Note that in the transistor used for the phase-inversion element, a semiconductor other than an oxide semiconductor can be used, such as amorphous silicon, microcrystalline silicon, polycrystalline silicon, single crystal silicon, amorphous germanium, microcrystalline germanium, polycrystalline germanium, or single crystal germanium. In addition, in the above-described transistor, a thin semiconductor film or a bulk semiconductor substrate may be used. If a p-channel transistor including an oxide semiconductor film can be manufactured, all of the transistors in the memory element can include the oxide semiconductor film as an active layer, so that the process can be simplified.

In addition, in one embodiment of the present invention, the supply of power supply voltage to the memory element can be controlled with the use of a transistor including an oxide semiconductor in a channel formation region. As described above, the transistor including an oxide semiconductor in a channel formation region has a large band gap of 3.0 eV to 3.5 eV, which is about three times as large as that of silicon. Since the transistor including an oxide semiconductor in a channel formation region has a high withstand voltage, by controlling the supply of power supply voltage to the memory element with the use of the transistor, the reliability of the signal processing circuit can be increased.

As the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, an In—O-based oxide semiconductor, a Sn—O-based oxide semiconductor, or a Zn—O-based oxide semiconductor can be used. In this specification, for example, an In—Sn—Ga—Zn—O-based oxide semiconductor means a metal oxide including indium (In), tin (Sn), gallium (Ga), and zinc (Zn), and there is no particular limitation on the stoichiometric proportion. The above oxide semiconductor may contain silicon.

Alternatively, an oxide semiconductor can be represented by the chemical formula, $InMO_3(ZnO)_m$ (m>0). Here, M represents one or more metal elements selected from Ga, Al, Mn, and Co.

By applying the memory element having the above structure to a memory device such as a register or a cache memory included in a signal processing circuit, data in the memory device can be prevented from being erased owing to the stop of the power supply. Therefore, the power supply can be stopped even for a short time in the signal processing circuit or one or a plurality of logic circuits included in the signal processing circuit. Accordingly, it is possible to provide a signal processing circuit whose power consumption can be suppressed and a method for driving the signal processing circuit whose power consumption can be suppressed.

BRIEF DESCRIPTION OF DRAWINGS

FIG. 6 is a circuit diagram of a memory element.

FIGS. 10A to 10C are diagrams illustrating a method for manufacturing a memory device.

FIGS. 11A and 11B are diagrams illustrating a method for manufacturing a memory device.

BEST MODE FOR CARRYING OUT THE INVENTION

Hereinafter, embodiments and an example of the present invention will be described in detail with reference to the accompanying drawings. However, the present invention is not limited to the following description and it is easily understood by those skilled in the art that modes and details thereof can be variously changed without departing from the spirit and the scope of the present invention. Accordingly, the present invention should not be construed as being limited to the description of the embodiments and the example below.

A signal processing circuit of the present invention includes in its category an integrated circuit such as a large scale integrated circuit (LSI) including a microprocessor, an image processing circuit, a digital signal processor (DSP), or a microcontroller.

Embodiment 1

Figure 1A:
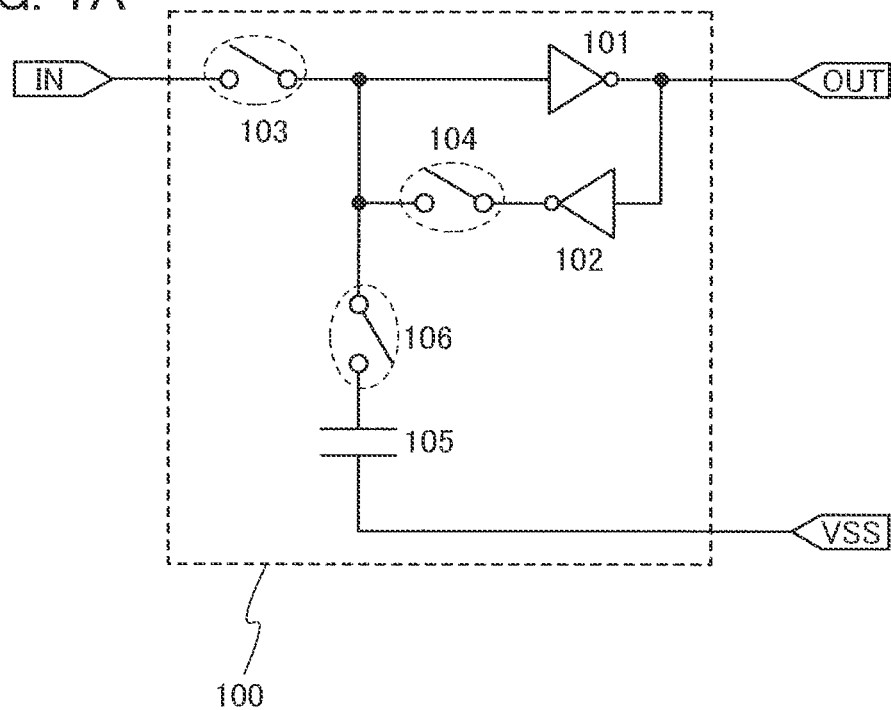
FIGS. 1A and 1B are a circuit diagram of a memory element and a block diagram of a signal processing circuit.

A memory device which is one embodiment of the present invention includes one or a plurality of memory elements capable of storing 1-bit data. In FIG. 1A, an example of a circuit diagram of a memory element included in a memory device of the present invention is illustrated. A memory element 100 illustrated in FIG. 1A at least includes a first phase-inversion element 101 and a second phase-inversion element 102 by which the phase of an input signal is inverted and the signal is output, a switching element 103, a switching element 104, a capacitor 105, and a capacitor switching element 106.

A signal IN including data that is input to the memory element 100 is supplied to an input terminal of the first phase-inversion element 101 via the switching element 103. An output terminal of the first phase-inversion element 101 is connected to an input terminal of the second phase-inversion element 102. An output terminal of the second phase-inversion element 102 is connected to the input terminal of the first phase-inversion element 101 via the switching element 104. A potential of the output terminal of the first phase-inversion element 101 or the input terminal of the second phase-inversion element 102 is output to a memory element or another circuit of a subsequent stage as a signal OUT.

Note that in FIG. 1A, an example in which inverters are used as the first phase-inversion element 101 and the second phase-inversion element 102 is illustrated; however, a clocked inverter can also be used as the first phase-inversion element 101 or the second phase-inversion element 102 besides the inverter.

The capacitor 105 is connected to an input terminal of the memory element 100, i.e., a node to which a potential of the signal IN is supplied, via the switching element 103 and the capacitor switching element 106 so that the data of the signal IN that is input to the memory element 100 can be stored as needed. Specifically, the capacitor 105 includes a dielectric between a pair of electrodes. One of the electrodes is connected to the input terminal of the first phase-inversion element 101 via the capacitor switching element 106. The other of the electrodes is connected to a node to which a low-level power supply potential VSS or a fixed potential such as a ground potential is supplied.

For the capacitor switching element 106, a transistor including a highly purified oxide semiconductor in a channel formation region is used.

Note that the memory element 100 may further include another circuit element such as a diode, a resistor, or an inductor, as needed.

Figure 2:
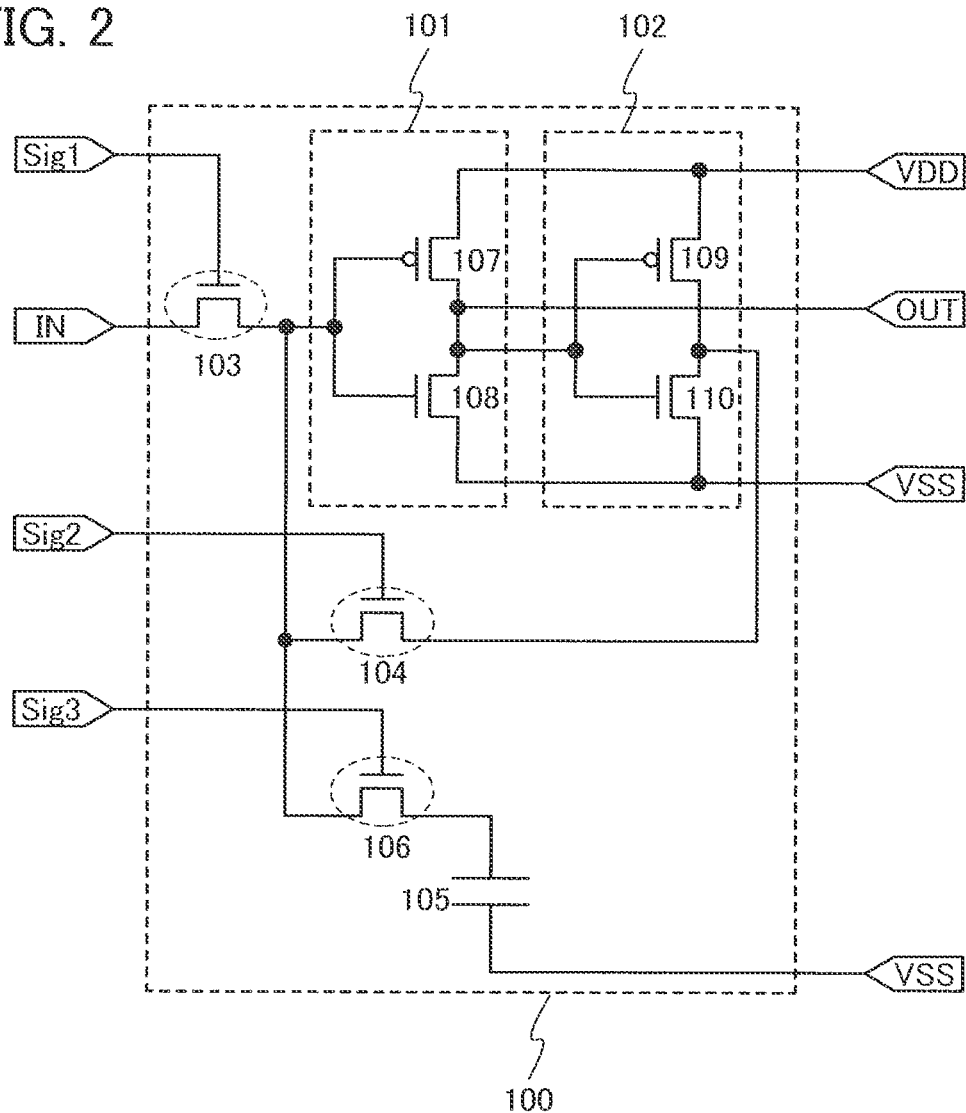
FIG. 2 is a circuit diagram of a memory element.

Next, an example of a more specific circuit diagram of the memory element in FIG. 1A is illustrated in FIG. 2. The memory element 100 illustrated in FIG. 2 includes the first phase-inversion element 101, the second phase-inversion element 102, the switching element 103, the switching element 104, the capacitor 105, and the capacitor switching element 106. The connection structure of these circuit elements are the same as that in FIG. 1A.

The first phase-inversion element 101 in FIG. 2 has a structure in which a p-channel transistor 107 and an n-channel transistor 108 whose gate electrodes are connected to each other are connected in series between a first node to which a high-level power supply potential VDD is supplied and a second node to which a low-level power supply potential VSS is supplied. Specifically, a source electrode of the p-channel transistor 107 is connected to the first node to which the power supply potential VDD is supplied, and a source electrode of the n-channel transistor 108 is connected to the second node to which the power supply potential VSS is supplied. In addition, a drain electrode of the p-channel transistor 107 is connected to a drain electrode of the n-channel transistor 108, and potentials of the two drain electrodes can be regarded as a potential of the output terminal of the first phase-inversion element 101. In addition, potentials of the gate electrode of the p-channel transistor 107 and the gate electrode of the n-channel transistor 108 can be regarded as a potential of the input terminal of the first phase-inversion element 101.

The second phase-inversion element 102 in FIG. 2 has a structure in which a p-channel transistor 109 and an n-channel transistor 110 whose gate electrodes are connected to each other are connected in series between the first node to which the high-level power supply potential VDD is supplied and the second node to which the low-level power supply potential VSS is supplied. Specifically, a source electrode of the p-channel transistor 109 is connected to the first node to which the power supply potential VDD is supplied, and a source electrode of the n-channel transistor 110 is connected to the second node to which the power supply potential VSS is supplied. In addition, a drain electrode of the p-channel transistor 109 is connected to a drain electrode of the n-channel transistor 110, and potentials of the two drain electrodes can be regarded as a potential of the output terminal of the second phase-inversion element 102. In addition, potentials of the gate electrode of the p-channel transistor 109 and the gate electrode of the n-channel transistor 110 can be regarded as a potential of the input terminal of the second phase-inversion element 102.

In FIG. 2, the case where a transistor is used for the switching element 103 is illustrated as an example, and the switching of the transistor is controlled by a signal Sig 1 supplied to a gate electrode thereof. In addition, the case where a transistor is used for the switching element 104 is illustrated as an example, and the switching of the transistor is controlled by a signal Sig 2 supplied to a gate electrode thereof.

Note that in FIG. 2, a structure in which each of the switching element 103 and the switching element 104 includes only one transistor is illustrated; however, the present invention is not limited to this structure. In one embodiment of the present invention, the switching element 103 or the switching element 104 may include a plurality of transistors. In the case where a plurality of transistors which serve as a switching element are included in the switching element 103 or the switching element 104, the plurality of transistors may be connected to each other in parallel, in series, or in combination of parallel connection and series connection.

In FIG. 2, a transistor including an oxide semiconductor in a channel formation region is used for the capacitor switching element 106, and the switching of the transistor is controlled by a signal Sig 3 supplied to a gate electrode thereof. Since the transistor used for the capacitor switching element 106 includes a highly purified oxide semiconductor in a channel formation region, off-state current thereof is extremely low as described above.

Note that in FIG. 2, a structure in which the capacitor switching element 106 includes only one transistor is illustrated; however, the present invention is not limited to this structure. In one embodiment of the present invention, the capacitor switching element 106 may include a plurality of transistors. In the case where a plurality of transistors which serve as a switching element are included in the capacitor switching element 106, the plurality of transistors may be connected to each other in parallel, in series, or in combination of parallel connection and series connection.

Note that in this specification, the state where the transistors are connected to each other in series means a state where only one of a source electrode and a drain electrode of a first transistor is connected to only one of a source electrode and a drain electrode of a second transistor. In addition, the state where the transistors are connected to each other in parallel means a state where one of a source electrode and a drain electrode of a first transistor is connected to one of a source electrode and a drain electrode of a second transistor, and the other of the source electrode and the drain electrode of the first transistor is connected to the other of the source electrode and the drain electrode of the second transistor.

In addition, in one embodiment of the present invention, at least a transistor used for a switching element in the capacitor switching element 106 may include a highly purified oxide semiconductor in a channel formation region. Accordingly, a transistor used for the first phase-inversion element 101, the second phase-inversion element 102, the switching element 103, or the switching element 104 can include a semiconductor other than an oxide semiconductor, such as amorphous silicon, microcrystalline silicon, polycrystalline silicon, single crystal silicon, amorphous germanium, microcrystalline germanium, polycrystalline germanium, or signal crystal germanium. In addition, in the above-described transistor, a thin semiconductor film or a bulk semiconductor substrate may be used. If a p-channel transistor including an oxide semiconductor film can be manufactured, all of the transistors in the memory element can include an oxide semiconductor film as an active layer, so that the process can be simplified.

Note that "connection" in this specification means electrical connection and corresponds to the state where current, voltage, or potential can be supplied, applied, or conducted. Therefore, the state of connection does not always mean a state of direct connection, but includes in its category a state of indirect connection via a circuit element such as a wiring, a resistor, a diode, or a transistor, in which current, voltage, or potential can be supplied, applied, or conducted.

In addition, even when a circuit diagram shows independent components as if they are connected to each other, there is actually a case where one conductive film has functions of a plurality of components such as a case where part of a wiring also functions as an electrode. The "connection" in this specification includes in its category such a case where one conductive film has functions of a plurality of components.

The names of the "source electrode" and the "drain electrode" included in the transistor interchange with each other depending on the polarity of the transistor or difference between the levels of potentials applied to both the electrodes. In general, in an n-channel transistor, an electrode to which a lower potential is supplied is called a source electrode, and an electrode to which a higher potential is supplied is called a drain electrode. Further, in a p-channel transistor, an electrode to which a lower potential is supplied is called a drain electrode, and an electrode to which a higher potential is supplied is called a source electrode. In this specification, although connection relation of the transistor is described assuming that the source electrode and the drain electrode are fixed in some cases for convenience, actually, the names of the source electrode and the drain electrode interchange with each other depending on the relation of the potentials.

Next, an example of the operation of the memory element illustrated in FIG. 1A will be described.

First, in writing of data, the switching element 103 is turned on, the switching element 104 is turned off, and the capacitor switching element 106 is turned off. Then, the power supply potential VDD is supplied to the first node and the power supply potential VSS is supplied to the second node, whereby power supply voltage is applied between the first node and the second node. A potential of the signal IN supplied to the memory element 100 is supplied to the input terminal of the first phase-inversion element 101 via the switching element 103, whereby the potential of the output terminal of the first phase-inversion element 101 is a phase-inverted potential of the signal IN. Then, the switching element 104 is turned on and the input terminal of the first phase-inversion element 101 is connected to the output terminal of the second phase-inversion element 102, whereby data is written into the first phase-inversion element 101 and the second phase-inversion element 102.

Next, in order to hold the input data in the first phase-inversion element 101 and the second phase-inversion element 102, in the state where the switching element 104 remains in an on state and the capacitor switching element 106 remains in an off state, the switching element 103 is turned off. By turning off the switching element 103, the input data is held in the first phase-inversion element 101 and the second phase-inversion element 102. At this time, the power supply potential VDD is supplied to the first node and the power supply potential VSS is supplied to the second node, whereby the state where the power supply voltage is applied between the first node and the second node is maintained.

The potential of the output terminal of the first phase-inversion element 101 reflects the data held in the first phase-inversion element 101 and the second phase-inversion element 102. Therefore, by reading out the potential, the data can be read out from the memory element 100.

Note that in the case where the input data is held in the capacitor 105 in order to reduce power consumption in holding the data, first, the switching element 103 is turned off, the switching element 104 is turned on, and the capacitor switching element 106 is turned on. Then, via the capacitor switching element 106, electric charge with an amount corresponding to the value of the data held in the first phase-inversion element 101 and the second phase-inversion element 102 is stored in the capacitor 105, whereby the data is written into the capacitor 105. After the data is stored in the capacitor 105, the capacitor switching element 106 is turned off, whereby the data stored in the capacitor 105 is held. After turning off the capacitor switching element 106, for example, the power supply potential VSS is supplied to each of the first node and the second node so that the nodes have equal potentials, and the application of the power supply voltage between the first node and the second node is stopped. Note that after the data is stored in the capacitor 105, the switching element 104 may be turned off.

In such a manner, in the case where the input data is held in the capacitor 105, the application of the power supply voltage between the first node and the second node is unnecessary; therefore, the off-state current flowing between the first node and the second node via the p-channel transistor 107 and the n-channel transistor 108 which are included in the first phase-inversion element 101, or via the p-channel transistor 109 and the n-channel transistor 110 which are included in the second phase-inversion element 102 can be extremely close to zero. As a result, power consumption due to the off-state current of the memory element in holding the data can be significantly reduced, and the power consumption of the memory device and further the signal processing circuit including the memory device can be suppressed to be low.

Since the transistor used for the capacitor switching element 106 includes a highly purified oxide semiconductor in a channel formation region, off-state current density can be less than or equal to 100 zA/μm, preferably less than or equal to 10 zA/μm, more preferably less than or equal to 1 zA/μm. Accordingly, the transistor including the highly purified oxide semiconductor film as an active layer has far lower off-state current than a transistor including silicon having crystallinity. As a result, when the capacitor switching element 106 for which the above transistor is used is in an off state, electric charge stored in the capacitor 105 is hardly released; therefore, the data is held.

In the case where the data stored in the capacitor 105 is read out, the switching element 103 is turned off. Then, the power supply potential VDD is again supplied to the first node and the power supply potential VSS is again supplied to the second node, whereby the power supply voltage is applied between the first node and the second node. Then, by turning on the capacitor switching element 106, the signal OUT having a potential that reflects the data can be read out from the memory element 100.

Figure 24:
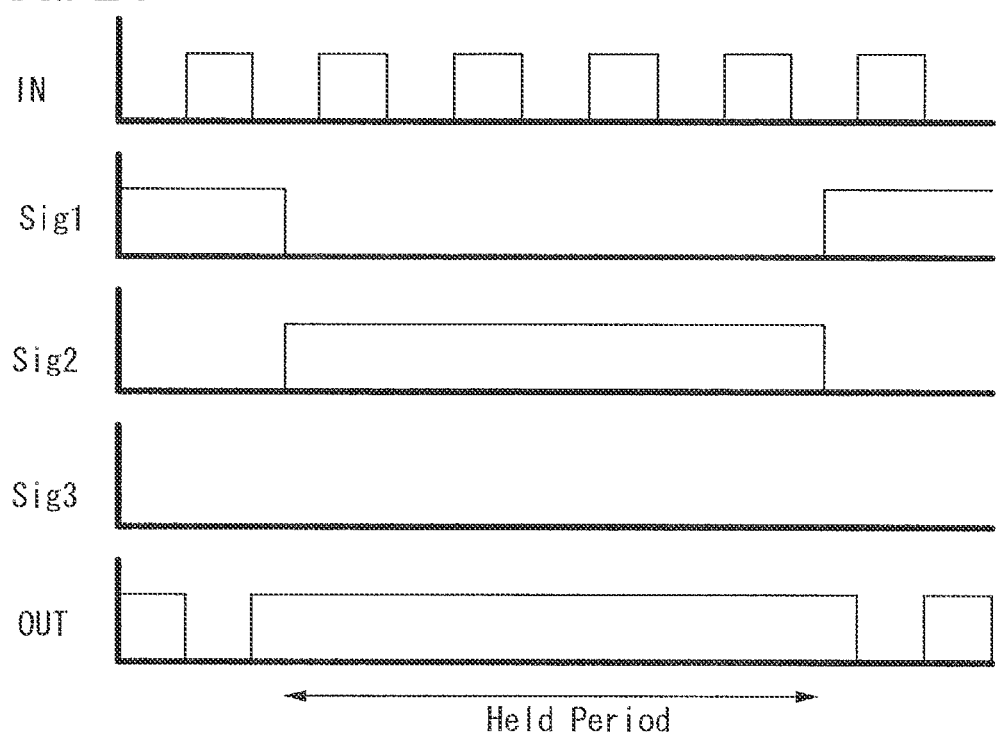
FIG. 24 is a timing chart showing the operation of a memory device.

Next, FIG. 24 is an example of a timing chart in the case where the supply of the power supply potential VDD is not stopped in the circuit illustrated in FIG. 2. When the signal Sig 1 is set to a low level and the signal Sig 2 is set to a high level, the signal IN is blocked and a feedback loop is formed, and the state can be held. When the signal Sig 1 is set to a high level again and the signal Sig 2 is a set to a low level, the signal IN is input and output via the first phase-inversion element 101. At this time, the signal Sig 3 is set to a low level.

Figure 25:
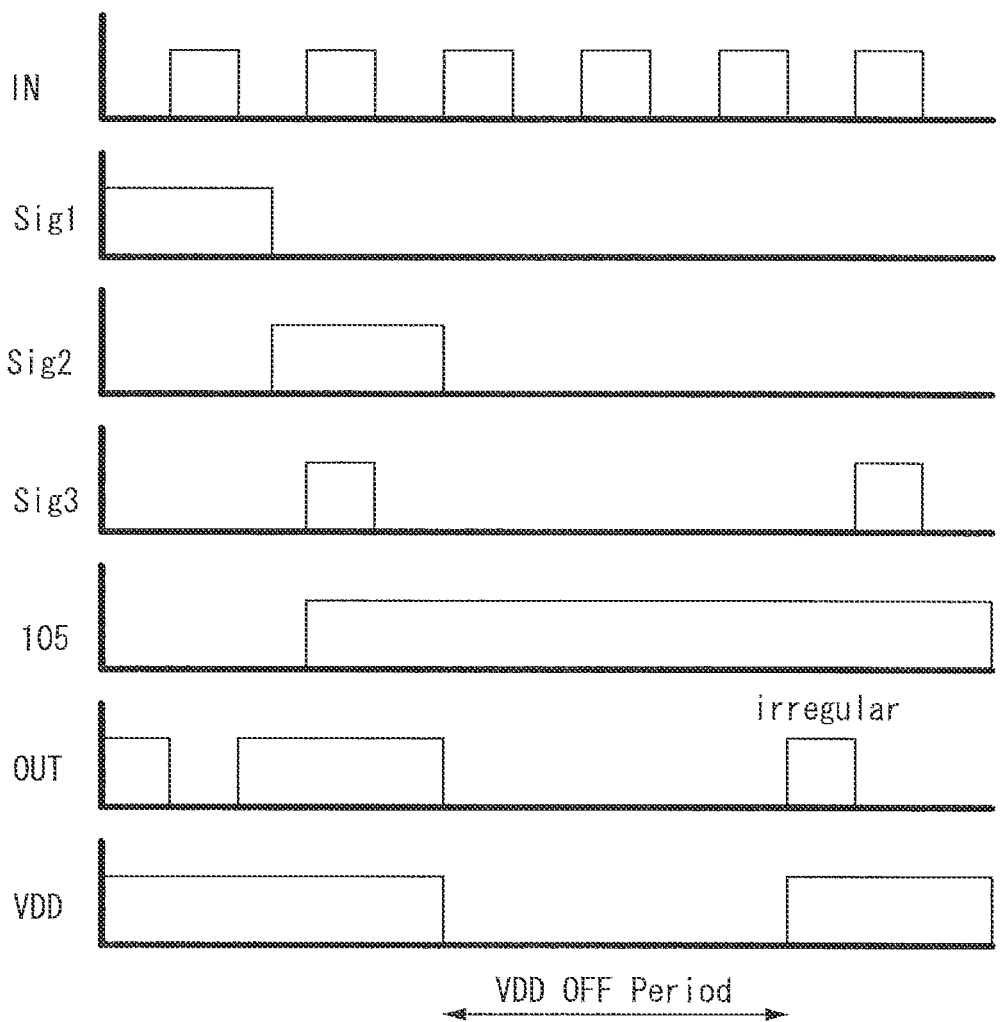
FIG. 25 is a timing chart showing the operation of a memory device.

FIG. 25 is an example of a timing chart in the case where the supply of the power supply potential VDD is stopped in the circuit illustrated in FIG. 2. When the signal Sig 1 is set to a low level and the signal Sig 2 is set to a high level, the signal IN is blocked and a feedback loop is formed, and the state can be held. After that, the signal Sig 3 is set to a high level, whereby the capacitor 105 stores the data (in FIG. 25, this state is shown as a high level). Even when the supply of the power supply potential VDD is stopped after that, a potential of the capacitor 105 is held. Then, when the power supply potential VDD is supplied and the signal Sig 3 is set to a high level again, the potential of the capacitor 105 is output via the first phase-inversion element 101 (in FIG. 25, this state is shown as a low level).

Figure 1B:
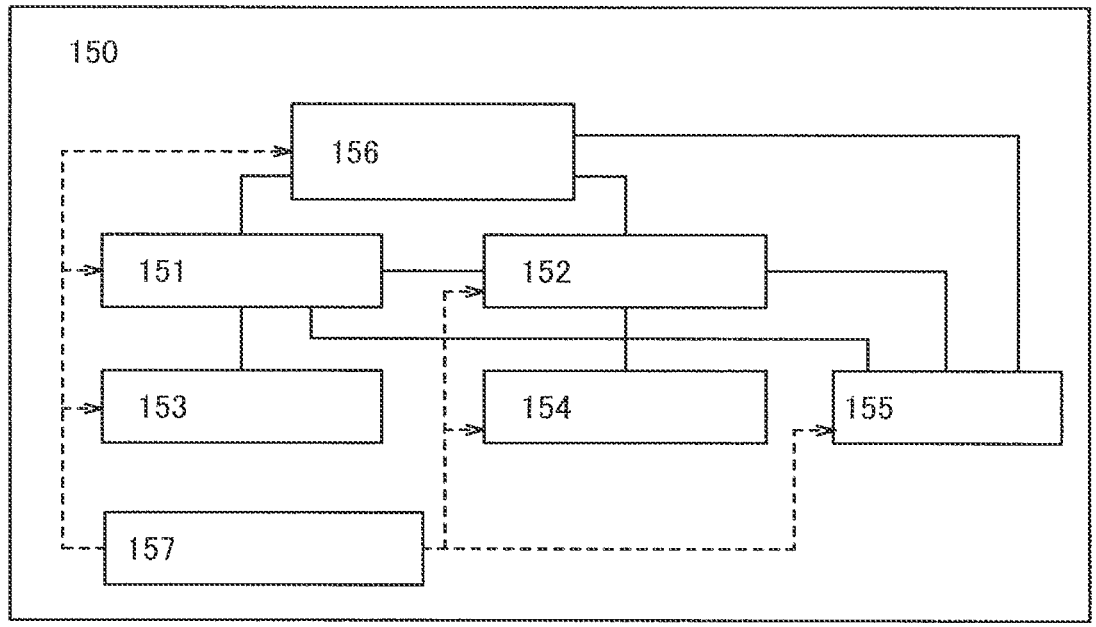

In FIG. 1B, an example of a signal processing circuit according to one embodiment of the present invention, in which the above memory element is used for a memory device, is illustrated. The signal processing circuit according to one embodiment of the present invention at least includes one or a plurality of arithmetic units and one or a plurality of memory devices. Specifically, a signal processing circuit 150 illustrated in FIG. 1B includes an arithmetic circuit 151, an arithmetic circuit 152, a memory device 153, a memory device 154, a memory device 155, a control device 156, and a power supply control circuit 157.

The arithmetic circuits 151 and 152 each include, as well as a logic circuit which carries out simple logic arithmetic processing, an adder, a multiplier, and various arithmetic units. The memory device 153 functions as a register for temporarily holding data when the arithmetic processing is carried out in the arithmetic circuit 151. The memory device 154 functions as a register for temporarily holding data when the arithmetic processing is carried out in the arithmetic circuit 152.

In addition, the memory device 155 can be used as a main memory and can store a program executed by the control device 156 as data or can store data from the arithmetic circuit 151 and the arithmetic circuit 152.

The control device 156 is a circuit which collectively controls operations of the arithmetic circuit 151, the arithmetic circuit 152, the memory device 153, the memory device 154, and the memory device 155 included in the signal processing circuit 150. Note that in FIG. 1B, a structure in which the control device 156 is provided in the signal processing circuit 150 as a part thereof is illustrated, but the control device 156 may be provided outside the signal processing circuit 150.

By using the above-described memory element for the memory device 153, the memory device 154, and the memory device 155, data can be held even when the supply of power supply voltage to the memory device 153, the memory device 154, and the memory device 155 is stopped. In the above manner, the supply of the power supply voltage to the entire signal processing circuit 150 can be stopped, whereby power consumption can be suppressed. Alternatively, the supply of the power supply voltage to one or more of the memory device 153, the memory device 154, and the memory device 155 can be stopped, whereby power consumption can be suppressed.

In addition, as well as the supply of the power supply voltage to the memory device, the supply of the power supply voltage to the control circuit or the arithmetic circuit which transmits/receives data to/from the memory device may be stopped. For example, when the arithmetic circuit 151 and the memory device 153 are not operated, the supply of the power supply voltage to the arithmetic circuit 151 and the memory device 153 may be stopped.

In addition, the power supply control circuit 157 controls the level of the power supply voltage which is supplied to the arithmetic circuit 151, the arithmetic circuit 152, the memory device 153, the memory device 154, the memory device 155, and the control device 156 included in the signal processing circuit 150.

When the supply of the power supply voltage is stopped, the supply of the power supply voltage to the power supply control circuit 157 may be stopped, or the supply of the power supply voltage to the arithmetic circuit 151, the arithmetic circuit 152, the memory device 153, the memory device 154, the memory device 155, and the control device 156 may be stopped. That is, a switching element for stopping the supply of the power supply voltage may be provided for the power supply control circuit 157, or each of the arithmetic circuit 151, the arithmetic circuit 152, the memory device 153, the memory device 154, the memory device 155, and the control device 156. In the latter case, the power supply control circuit 157 is not necessarily provided in the signal processing circuit according to the present invention.

A memory device which functions as a cache memory may be provided between the memory device 155 that is a main memory and each of the arithmetic circuit 151, the arithmetic circuit 152, and the control device 156. By providing the cache memory, low-speed access to the main memory can be reduced and the speed of the signal processing such as arithmetic processing can be higher. By applying the above-described memory element also to the memory device functioning as a cache memory, power consumption of the signal processing circuit 150 can be suppressed.

Embodiment 2

Figure 3:
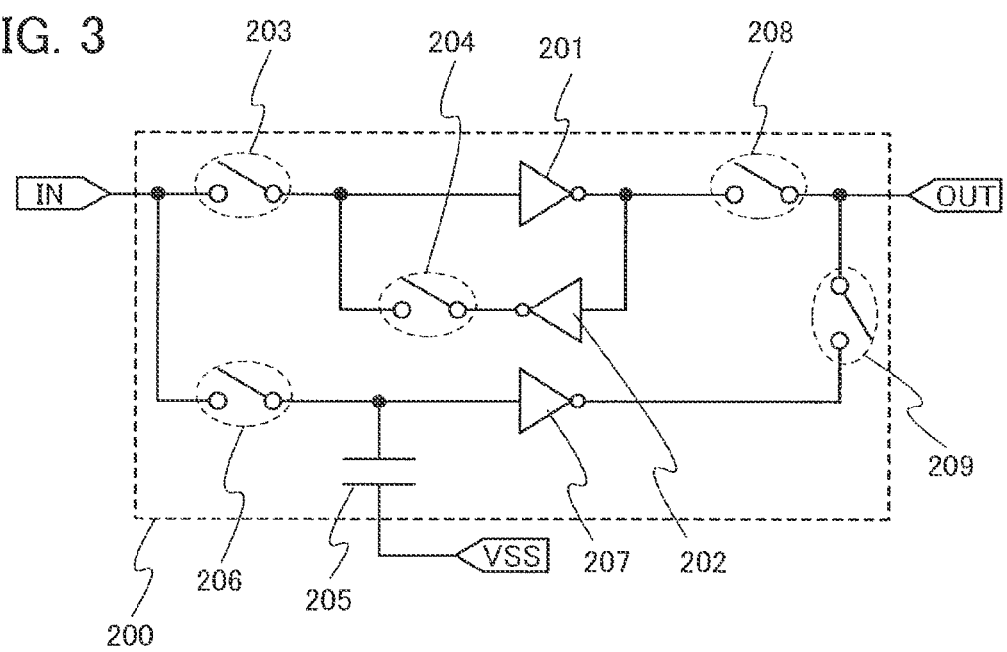
FIG. 3 is a circuit diagram of a memory element.

In this embodiment, another example of a memory element included in a memory device of the present invention will be described. In FIG. 3, a circuit diagram of a memory element of this embodiment is illustrated as an example.

A memory element 200 illustrated in FIG. 3 at least includes a first phase-inversion element 201, a second phase-inversion element 202, and a third phase-inversion element 207 by which the phase of an input signal is inverted and the signal is output, a switching element 203, a switching element 204, a switching element 208, a switching element 209, a capacitor 205, and a capacitor switching element 206.

A signal IN including data that is input to the memory element 200 is supplied to an input terminal of the first phase-inversion element 201 via the switching element 203. An output terminal of the first phase-inversion element 201 is connected to an input terminal of the second phase-inversion element 202. An output terminal of the second phase-inversion element 202 is connected to the input terminal of the first phase-inversion element 201 via the switching element 204. A potential of the output terminal of the first phase-inversion element 201 or the input terminal of the second phase-inversion element 202 is output to a memory element or another circuit of a subsequent stage as a signal OUT via the switching element 208.

The capacitor 205 is connected to an input terminal of the memory element 200, i.e., a node to which a potential of the signal IN is supplied, via the capacitor switching element 206 so that the data of the signal IN that is input to the memory element 200 can be stored as needed. Specifically, the capacitor 205 includes a dielectric between a pair of electrodes. One of the electrodes is connected to the node to which the potential of the signal IN is supplied via the capacitor switching element 206. The other of the electrodes is connected to a node to which a low-level power supply potential VSS or a fixed potential such as a ground potential is supplied.

In addition, the one of the electrodes of the capacitor 205 is connected to an input terminal of the third phase-inversion element 207. A potential of an output terminal of the third phase-inversion element 207 is output via the switching element 209 to a memory element or another circuit of a subsequent stage as a signal OUT.

Note that in FIG. 3, an example in which inverters are used as the first phase-inversion element 201, the second phase-inversion element 202, and the third phase-inversion element 207 is illustrated; however, a clocked inverter can also be used as the first phase-inversion element 201, the second phase-inversion element 202, or the third phase-inversion element 207 besides the inverter.

For the capacitor switching element 206, a transistor including a highly purified oxide semiconductor in a channel formation region is used.

Note that the memory element 200 may further include another circuit element such as a diode, a resistor, or an inductor, as needed.

Figure 4:
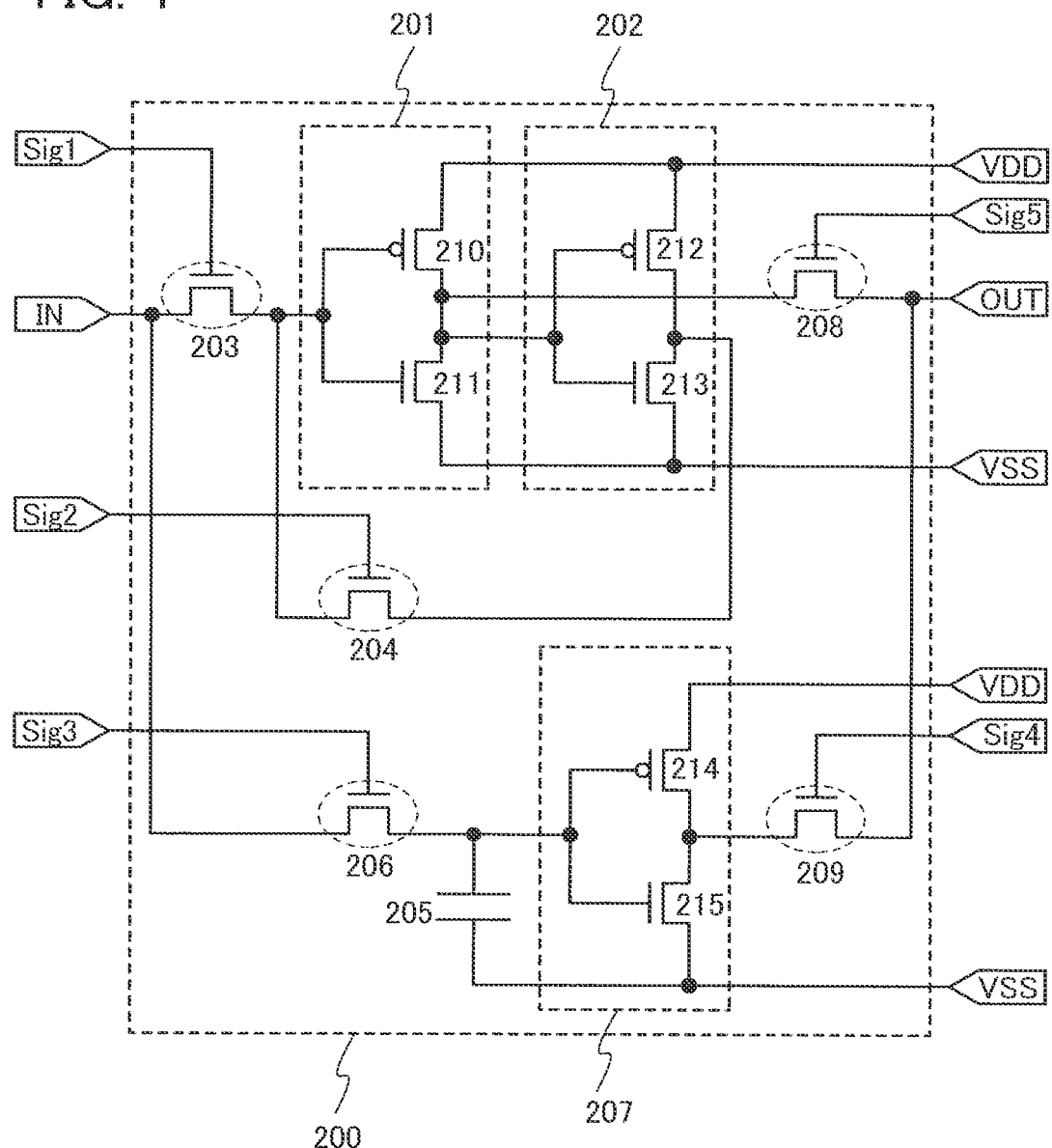
FIG. 4 is a circuit diagram of a memory element.

Next, an example of a more specific circuit diagram of the memory element in FIG. 3 is illustrated in FIG. 4. The memory element 200 illustrated in FIG. 4 at least includes the first phase-inversion element 201, the second phase-inversion element 202, the third phase-inversion element 207, the switching element 203, the switching element 204, the switching element 208, the switching element 209, the capacitor 205, and the capacitor switching element 206. The connection structure of these circuit elements are the same as that in FIG. 3.

The first phase-inversion element 201 in FIG. 4 has a structure in which a p-channel transistor 210 and an n-channel transistor 211 whose gate electrodes are connected to each other are connected in series between a first node to which a high-level power supply potential VDD is supplied and a second node to which a low-level power supply potential VSS is supplied. Specifically, a source electrode of the p-channel transistor 210 is connected to the first node to which the power supply potential VDD is supplied, and a source electrode of the n-channel transistor 211 is connected to the second node to which the power supply potential VSS is supplied. In addition, a drain electrode of the p-channel transistor 210 is connected to a drain electrode of the n-channel transistor 211, and potentials of the two drain electrodes can be regarded as a potential of the output terminal of the first phase-inversion element 201. In addition, potentials of the gate electrode of the p-channel transistor 210 and the gate electrode of the n-channel transistor 211 can be regarded as a potential of the input terminal of the first phase-inversion element 201.

The second phase-inversion element 202 in FIG. 4 has a structure in which a p-channel transistor 212 and an n-channel transistor 213 whose gate electrodes are connected to each other are connected in series between the first node to which the high-level power supply potential VDD is supplied and the second node to which the low-level power supply potential VSS is supplied. Specifically, a source electrode of the p-channel transistor 212 is connected to the first node to which the power supply potential VDD is supplied, and a source electrode of the n-channel transistor 213 is connected to the second node to which the power supply potential VSS is supplied. In addition, a drain electrode of the p-channel transistor 212 is connected to a drain electrode of the n-channel transistor 213, and potentials of the two drain electrodes can be regarded as a potential of the output terminal of the second phase-inversion element 202. In addition, potentials of the gate electrode of the p-channel transistor 212 and the gate electrode of the n-channel transistor 213 can be regarded as a potential of the input terminal of the second phase-inversion element 202.

The third phase-inversion element 207 in FIG. 4 has a structure in which a p-channel transistor 214 and an n-channel transistor 215 whose gate electrodes are connected to each other are connected in series between a third node to which a high-level power supply potential VDD is supplied and a fourth node to which a low-level power supply potential VSS is supplied. Specifically, a source electrode of the p-channel transistor 214 is connected to the third node to which the power supply potential VDD is supplied, and a source electrode of the n-channel transistor 215 is connected to the fourth node to which the power supply potential VSS is supplied. In addition, a drain electrode of the p-channel transistor 214 is connected to a drain electrode of the n-channel transistor 215, and potentials of the two drain electrodes can be regarded as a potential of the output terminal of the third phase-inversion element 207. In addition, potentials of the gate electrode of the p-channel transistor 214 and the gate electrode of the n-channel transistor 215 can be regarded as a potential of the input terminal of the third phase-inversion element 207.

Note that the first node and the third node may be electrically connected to each other as one node. Note also that the second node and the fourth node may be electrically connected to each other as one node.

In FIG. 4, the case where a transistor is used for the switching element 203 is illustrated as an example, and the switching of the transistor is controlled by a signal Sig 1 supplied to a gate electrode thereof. In addition, the case where a transistor is used for the switching element 204 is illustrated as an example, and the switching of the transistor is controlled by a signal Sig 2 supplied to a gate electrode thereof. Further, the case where a transistor is used for the switching element 209 is illustrated as an example, and the switching of the transistor is controlled by a signal Sig 4 supplied to a gate electrode thereof.

Note that in FIG. 4, a structure in which each of the switching element 203, the switching element 204, and the switching element 209 includes only one transistor is illustrated; however, the present invention is not limited to this structure. In one embodiment of the present invention, the switching element 203, the switching element 204, or the switching element 209 may include a plurality of transistors. In the case where a plurality of transistors which serve as a switching element are included in the switching element 203, the switching element 204, or the switching element 209, the plurality of transistors may be connected to each other in parallel, in series, or in combination of parallel connection and series connection.

In FIG. 4, a transistor including an oxide semiconductor in a channel formation region is used for the capacitor switching element 206, and the switching of the transistor is controlled by a signal Sig 3 supplied to a gate electrode thereof. Since the transistor used for the capacitor switching element 206 includes a highly purified oxide semiconductor in a channel formation region, off-state current thereof is extremely low as described above.

Note that in FIG. 4, a structure in which the capacitor switching element 206 includes only one transistor is illustrated; however, the present invention is not limited to this structure. In one embodiment of the present invention, the capacitor switching element 206 may include a plurality of transistors. In the case where a plurality of transistors which serve as a switching element are included in the capacitor switching element 206, the plurality of transistors may be connected to each other in parallel, in series, or in combination of parallel connection and series connection.

In one embodiment of the present invention, at least a transistor used for a switching element in the capacitor switching element 206 may include a highly purified oxide semiconductor in a channel formation region. Accordingly, a transistor used for the first phase-inversion element 201, the second phase-inversion element 202, the third phase-inversion element 207, the switching element 203, the switching element 204, the switching element 208, or the switching element 209 can include a semiconductor other than an oxide semiconductor, such as amorphous silicon, microcrystalline silicon, polycrystalline silicon, single crystal silicon, amorphous germanium, microcrystalline germanium, polycrystalline germanium, or signal crystal germanium. In addition, in the above-described transistor, a thin semiconductor film or a bulk semiconductor substrate may be used. If a p-channel transistor including an oxide semiconductor film can be manufactured, all of the transistors in the memory element can include an oxide semiconductor film as an active layer, so that the process can be simplified.

Next, an example of the operation of the memory element illustrated in FIG. 3 will be described.

First, in writing of data, the switching element 203 is turned on, the switching element 204 is turned off, the switching element 208 is turned off, the switching element 209 is turned off, and the capacitor switching element 206 is turned on. Then, the power supply potential VDD is supplied to the first node and the power supply potential VSS is supplied to the second node, whereby power supply voltage is applied between the first node and the second node. A potential of the signal IN supplied to the memory element 200 is supplied to the input terminal of the first phase-inversion element 201 via the switching element 203, whereby the potential of the output terminal of the first phase-inversion element 201 is a phase-inverted potential of the signal IN. Then, the switching element 204 is turned on and the input terminal of the first phase-inversion element 201 is connected to the output terminal of the second phase-inversion element 202, whereby data is written into the first phase-inversion element 201 and the second phase-inversion element 202.

In writing of the data, via the capacitor switching element 206, electric charge with an amount corresponding to the value of the data of the signal IN is stored in the capacitor 205, whereby the data is also written into the capacitor 205.

Note that in writing of the data, application of power supply voltage between the third node and the fourth node is unnecessary. Therefore, for example, the power supply potential VSS is supplied to each of the third node and the fourth node so that the nodes have equal potentials.

Next, in order to hold the input data in the first phase-inversion element 201 and the second phase-inversion element 202, in the state where the switching element 204 remains in an on state, the switching element 208 remains in an off state, and the switching element 209 remains in an off state, the switching element 203 is turned off and the capacitor switching element 206 is turned off. By turning off the switching element 203, the input data is held in the first phase-inversion element 201 and the second phase-inversion element 202. At this time, the power supply potential VDD is supplied to the first node and the power supply potential VSS is supplied to the second node, whereby the state where the power supply voltage is applied between the first node and the second node is maintained.

In addition, by turning off the capacitor switching element 206, the data written into the capacitor 205 is also held.

The potential of the output terminal of the first phase-inversion element 201 reflects the data held in the first phase-inversion element 201 and the second phase-inversion element 202. Therefore, by reading out the potential by turning on the switching element 208, the data can be read out from the memory element 200.

Note that in order to reduce power consumption in holding the data, in the case where the input data is held only in the capacitor 205, for example, the power supply potential VSS is supplied to each of the first node and the second node so that the nodes have equal potentials, and the application of the power supply voltage between the first node and the second node is stopped. When the application of the power supply voltage between the first node and the second node is stopped, the data held in the first phase-inversion element 201 and the second phase-inversion element 202 is erased, but the data written in the capacitor 205 is continuously held.

In such a manner, in the case where the input data is held in the capacitor 205, the application of the power supply voltage between the first node and the second node is unnecessary; therefore, the off-state current flowing between the first node and the second node via the p-channel transistor 210 and the n-channel transistor 211 which are included in the first phase-inversion element 201, or via the p-channel transistor 212 and the n-channel transistor 213 which are included in the second phase-inversion element 202 can be extremely close to zero. As a result, power consumption due to the off-state current of the memory element in holding the data can be significantly reduced, and the power consumption of the memory device and further the signal processing circuit including the memory device can be suppressed to be low.

In addition, in the case where the input data is held in the capacitor 205, the application of the power supply voltage between the third node and the fourth node is unnecessary. Therefore, the off-state current flowing between the third node and the fourth node via the p-channel transistor 214 and the n-channel transistor 215 which are included in the third phase-inversion element 207 can be extremely close to zero. As a result, power consumption due to the off-state current of the memory element in holding the data can be significantly reduced, and the power consumption of the memory device and further the signal processing circuit including the memory device can be suppressed to be low.

Since the transistor used for the capacitor switching element 206 includes a highly purified oxide semiconductor in a channel formation region, off-state current density can be less than or equal to 100 zA/μm, preferably less than or equal to 10 zA/μm, more preferably less than or equal to 1 zA/μm. Accordingly, the transistor including the highly purified oxide semiconductor film as an active layer has far lower off-state current than a transistor including silicon having crystallinity. As a result, when the capacitor switching element 206 for which the above transistor is used is in an off state, electric charge stored in the capacitor 205 is hardly released; therefore, the data is held.

In the case where the data stored in the capacitor 205 is read out, the power supply potential VDD is supplied to the third node and the power supply potential VSS is supplied to the fourth node, whereby the power supply voltage is applied between the third node and the fourth node. When the power supply voltage is applied between the third node and the fourth node, the output terminal of the third phase-inversion element 207 is supplied with a phase-inverted potential of the potential of the input terminal thereof. Note that the input terminal of the third phase-inversion element 207 is supplied with a potential having a level corresponding to the amount of electric charge stored in the capacitor 205; thus, a potential of the output terminal thereof reflects the data. Thus, by turning on the switching element 209, a signal OUT having a potential that reflects the data can be read out from the memory element 200.

Figure 26:
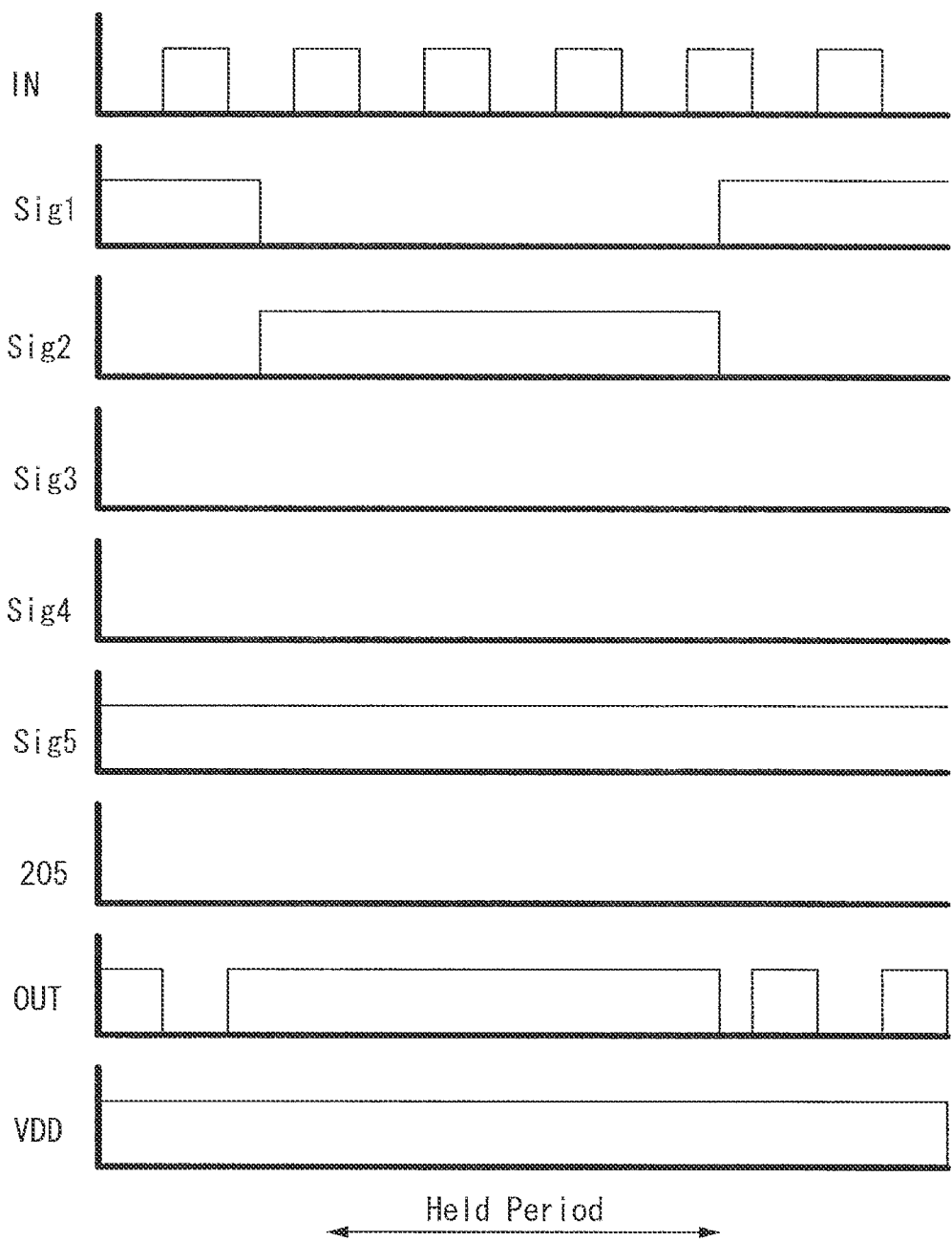
FIG. 26 is a timing chart showing the operation of a memory device.

FIG. 26 is an example of a timing chart in the case where the supply of the power supply potential VDD is not stopped in the circuit of FIG. 4. When the signal Sig 1 is set to a low level and the signal Sig 2 is set to a high level, the signal IN is blocked and a feedback loop is formed, and the state can be held. When the signal Sig 1 is set to a high level again and the signal Sig 2 is a set to a low level, the signal IN is input and output via the first phase-inversion element 201. At this time, the signal Sig 3 and the signal Sig 4 are set to a low level, and a signal Sig 5 is set to a high level.

Figure 27:
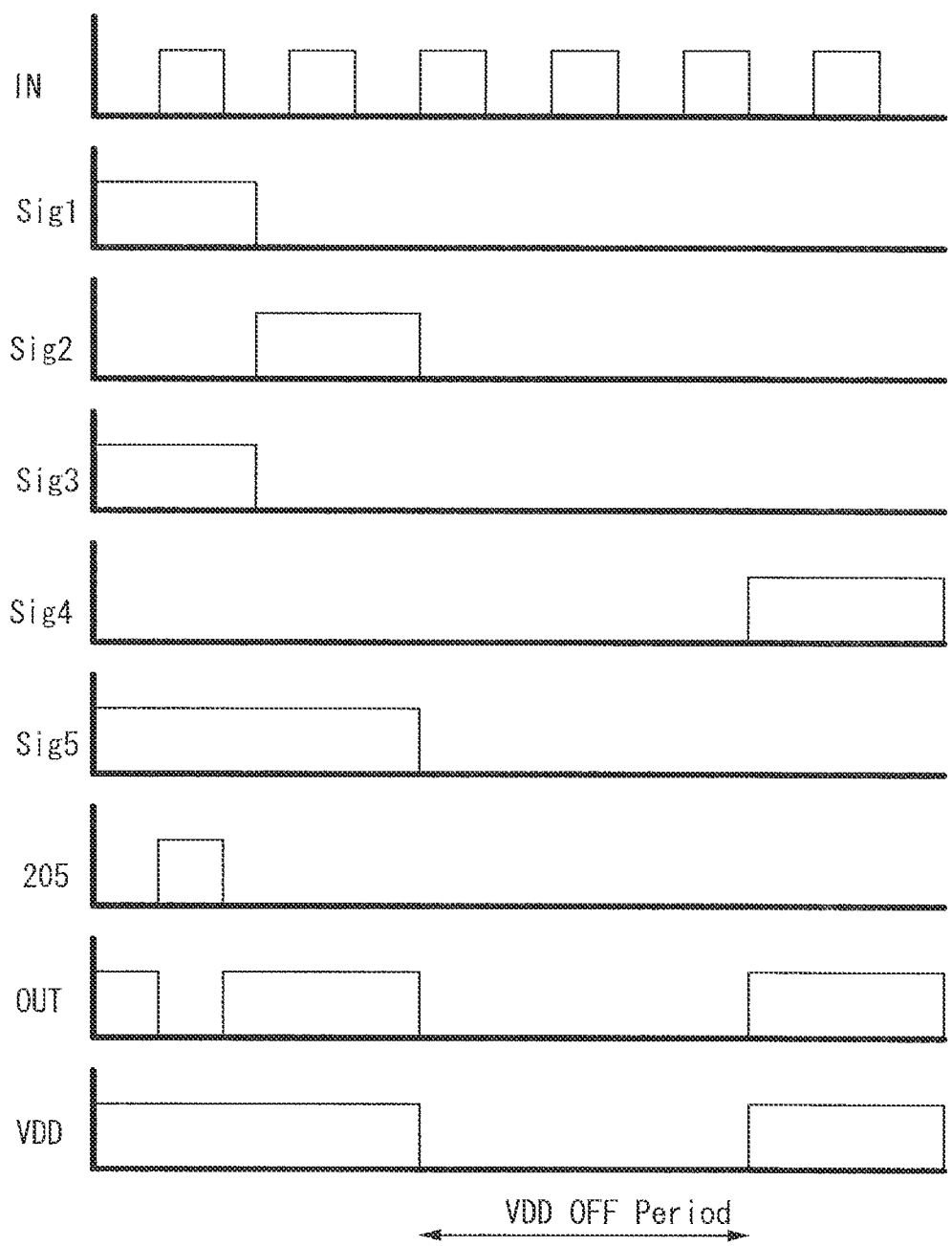
FIG. 27 is a timing chart showing the operation of a memory device.

FIG. 27 is an example of a timing chart in the case where the supply of the power supply potential VDD is stopped in the circuit of FIG. 4. When the signal Sig 1 is set to a low level and the signal Sig 2 is set to a high level, the signal IN is blocked and a feedback loop is formed, and the state can be held. On the other hand, the signal Sig 3 is set to a high level, whereby the capacitor 205 stores the data (in FIG. 27, this state is shown as a low level). Even when the supply of the power supply potential VDD is stopped after that, a potential of the capacitor 205 is held. After that, when the power supply potential VDD is supplied and the signal Sig 5 and the signal Sig 3 are set to a low level and the signal Sig 4 is set to a high level, the potential of the capacitor 205 is output via the third phase-inversion element 207 (in FIG. 27, this state is shown as a high level).

This embodiment can be implemented by being combined as appropriate with any of the above-described embodiments.

Embodiment 3

Figure 5:
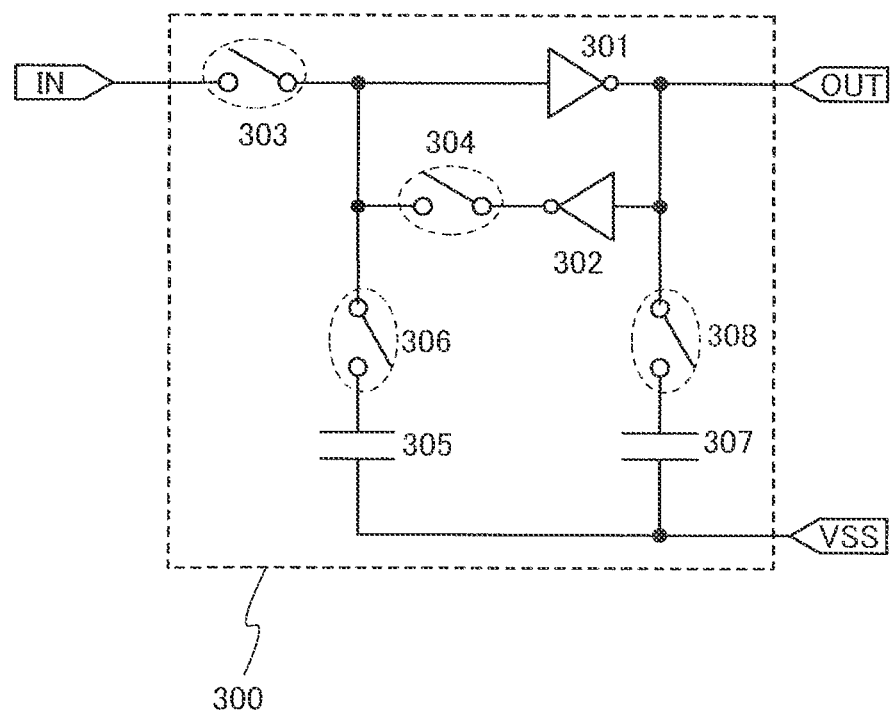
FIG. 5 is a circuit diagram of a memory element.

In this embodiment, another example of a memory element included in a memory device of the present invention will be described. In FIG. 5, a circuit diagram of a memory element of this embodiment is illustrated as an example.

A memory element 300 illustrated in FIG. 5 at least includes a first phase-inversion element 301 and a second phase-inversion element 302 by which the phase of an input signal is inverted and the signal is output, a switching element 303, a switching element 304, a capacitor 305, a capacitor switching element 306, a capacitor 307, and a capacitor switching element 308.

A signal IN including data that is input to the memory element 300 is supplied to an input terminal of the first phase-inversion element 301 via the switching element 303. An output terminal of the first phase-inversion element 301 is connected to an input terminal of the second phase-inversion element 302. An output terminal of the second phase-inversion element 302 is connected to the input terminal of the first phase-inversion element 301 via the switching element 304. A potential of the output terminal of the first phase-inversion element 301 or the input terminal of the second phase-inversion element 302 is output to a memory element or another circuit of a subsequent stage as a signal OUT.

The capacitor 305 is connected to an input terminal of the memory element 300, i.e., a node to which a potential of the signal IN is supplied, via the switching element 303 and the capacitor switching element 306 so that the data of the signal IN that is input to the memory element 300 can be stored as needed. Specifically, the capacitor 305 includes a dielectric between a pair of electrodes. One of the electrodes is connected to the input terminal of the first phase-inversion element 301 via the capacitor switching element 306. The other of the electrodes is connected to a node to which a low-level power supply potential VSS or a fixed potential such as a ground potential is supplied.

In a manner similar to that of the capacitor 305, the capacitor 307 is connected to the input terminal of the memory element 300, i.e., the node to which the potential of the signal IN is supplied, via the switching element 303, the first phase-inversion element 301, and the capacitor switching element 308 so that the data of the signal IN input to the memory element 300 can be stored as needed. Specifically, the capacitor 307 includes a dielectric between a pair of electrodes. One of the electrodes is connected to the output terminal of the first phase-inversion element 301 via the capacitor switching element 308. The other of the electrodes is connected to the node to which the low-level power supply potential VSS or the fixed potential such as a ground potential is supplied.

Note that in FIG. 5, an example in which inverters are used as the first phase-inversion element 301 and the second phase-inversion element 302 is illustrated; however, a clocked inverter can also be used as the first phase-inversion element 301 or the second phase-inversion element 302 besides the inverter.

For each of the capacitor switching element 306 and the capacitor switching element 308, a transistor including a highly purified oxide semiconductor in a channel formation region is used.

Note that the memory element 300 may further include another circuit element such as a diode, a resistor, or an inductor, as needed.

Next, an example of a more specific circuit diagram of the memory element in FIG. 5 is illustrated in FIG. 6. The memory element 300 illustrated in FIG. 6 at least includes the first phase-inversion element 301, the second phase-inversion element 302, the switching element 303, the switching element 304, the capacitor 305, the capacitor switching element 306, the capacitor 307, and the capacitor switching element 308. The connection structure of these circuit elements are the same as that in FIG. 5.

The first phase-inversion element 301 in FIG. 6 has a structure in which a p-channel transistor 309 and an n-channel transistor 310 whose gate electrodes are connected to each other are connected in series between a first node to which a high-level power supply potential VDD is supplied and a second node to which a low-level power supply potential VSS is supplied. Specifically, a source electrode of the p-channel transistor 309 is connected to the first node to which the power supply potential VDD is supplied, and a source electrode of the n-channel transistor 310 is connected to the second node to which the power supply potential VSS is supplied. In addition, a drain electrode of the p-channel transistor 309 is connected to a drain electrode of the n-channel transistor 310, and potentials of the two drain electrodes can be regarded as a potential of the output terminal of the first phase-inversion element 301. In addition, potentials of the gate electrode of the p-channel transistor 309 and the gate electrode of the n-channel transistor 310 can be regarded as a potential of the input terminal of the first phase-inversion element 301.

The second phase-inversion element 302 in FIG. 6 has a structure in which a p-channel transistor 311 and an n-channel transistor 312 whose gate electrodes are connected to each other are connected in series between the first node to which the high-level power supply potential VDD is supplied and the second node to which the low-level power supply potential VSS is supplied. Specifically, a source electrode of the p-channel transistor 311 is connected to the first node to which the power supply potential VDD is supplied, and a source electrode of the n-channel transistor 312 is connected to the second node to which the power supply potential VSS is supplied. In addition, a drain electrode of the p-channel transistor 311 is connected to a drain electrode of the n-channel transistor 312, and potentials of the two drain electrodes can be regarded as a potential of the output terminal of the second phase-inversion element 302. In addition, potentials of the gate electrode of the p-channel transistor 311 and the gate electrode of the n-channel transistor 312 can be regarded as a potential of the input terminal of the second phase-inversion element 302.

In FIG. 6, the case where a transistor is used for the switching element 303 is illustrated as an example, and the switching of the transistor is controlled by a signal Sig 1 supplied to a gate electrode thereof. In addition, the case where a transistor is used for the switching element 304 is illustrated as an example, and the switching of the transistor is controlled by a signal Sig 2 supplied to a gate electrode thereof.

Note that in FIG. 6, a structure in which each of the switching element 303 and the switching element 304 includes only one transistor is illustrated; however, the present invention is not limited to this structure. In one embodiment of the present invention, the switching element 303 or the switching element 304 may include a plurality of transistors. In the case where a plurality of transistors which serve as a switching element are included in the switching element 303 or the switching element 304, the plurality of transistors may be connected to each other in parallel, in series, or in combination of parallel connection and series connection.

In FIG. 6, a transistor including an oxide semiconductor in a channel formation region is used for the capacitor switching element 306, and the switching of the transistor is controlled by a signal Sig 3 supplied to a gate electrode thereof. Since the transistor used for the capacitor switching element 306 includes a highly purified oxide semiconductor in a channel formation region, off-state current thereof is extremely low as described above.

In FIG. 6, a transistor including an oxide semiconductor in a channel formation region is used for the capacitor switching element 308, and the switching of the transistor is controlled by a signal Sig 4 supplied to a gate electrode thereof. Since the transistor used for the capacitor switching element 308 includes a highly purified oxide semiconductor in a channel formation region, off-state current thereof is extremely low as described above.

Note that in FIG. 6, a structure in which the capacitor switching element 306 or the capacitor switching element 308 includes only one transistor is illustrated; however, the present invention is not limited to this structure. In one embodiment of the present invention, the capacitor switching element 306 or the capacitor switching element 308 may include a plurality of transistors. In the case where a plurality of transistors which serve as a switching element are included in the capacitor switching element 306 or the capacitor switching element 308, the plurality of transistors may be connected to each other in parallel, in series, or in combination of parallel connection and series connection.

In one embodiment of the present invention, at least a transistor used for a switching element in the capacitor switching element 306 or the capacitor switching element 308 may include a highly purified oxide semiconductor in a channel formation region. Accordingly, a transistor used for the first phase-inversion element 301, the second phase-inversion element 302, the switching element 303, or the switching element 304 can include a semiconductor other than an oxide semiconductor, such as amorphous silicon, microcrystalline silicon, polycrystalline silicon, single crystal silicon, amorphous germanium, microcrystalline germanium, polycrystalline germanium, or signal crystal germanium. In addition, in the above-described transistor, a thin semiconductor film or a bulk semiconductor substrate may be used. If a p-channel transistor including an oxide semiconductor film can be manufactured, all of the transistors in the memory element can include an oxide semiconductor film as an active layer, so that the process can be simplified.

Next, an example of the operation of the memory element illustrated in FIG. 5 and FIG. 6 will be described.

First, in writing of data, the switching element 303 is turned on, the switching element 304 is turned off, the capacitor switching element 306 is turned off, and the capacitor switching element 308 is turned off. Then, the power supply potential VDD is supplied to the first node and the power supply potential VSS is supplied to the second node, whereby power supply voltage is applied between the first node and the second node. A potential of the signal IN supplied to the memory element 300 is supplied to the input terminal of the first phase-inversion element 301 via the switching element 303, whereby the potential of the output terminal of the first phase-inversion element 301 is a phase-inverted potential of the signal IN. Then, the switching element 304 is turned on and the input terminal of the first phase-inversion element 301 is connected to the output terminal of the second phase-inversion element 302, whereby data is written into the first phase-inversion element 301 and the second phase-inversion element 302.

Next, in order to hold the input data in the first phase-inversion element 301 and the second phase-inversion element 302, in the state where the switching element 304 remains in an on state, the capacitor switching element 306 remains in an off state, and the capacitor switching element 308 remains in an off state, the switching element 303 is turned off. By turning off the switching element 303, the input data is held in the first phase-inversion element 301 and the second phase-inversion element 302. At this time, the power supply potential VDD is supplied to the first node and the power supply potential VSS is supplied to the second node, whereby the state where the power supply voltage is applied between the first node and the second node is maintained.

The potential of the output terminal of the first phase-inversion element 301 reflects the data held in the first phase-inversion element 301 and the second phase-inversion element 302. Therefore, by reading out the potential, the data can be read out from the memory element 300.

Note that in the case where the input data is held in the capacitor 305 and the capacitor 307 in order to reduce power consumption in holding the data, the switching element 303 is turned off, the switching element 304 is turned on, the capacitor switching element 306 is turned on, and the capacitor switching element 308 is turned on. Then, via the capacitor switching element 306, electric charge with an amount corresponding to the value of the data held in the first phase-inversion element 301 and the second phase-inversion element 302 is stored in the capacitor 305, whereby the data is written into the capacitor 305. In addition, via the capacitor switching element 308, electric charge with an amount corresponding to the value of the data held in the first phase-inversion element 301 and the second phase-inversion element 302 is stored in the capacitor 307, whereby the data is written into the capacitor 307. Note that the polarity of a voltage between a pair of electrodes included in the capacitor 305 and the polarity of a voltage between a pair of electrodes included in the capacitor 307 are opposite to each other.

After the data is stored in the capacitor 305, the capacitor switching element 306 is turned off, whereby the data stored in the capacitor 305 is held. In addition, after the data is stored in the capacitor 307, the capacitor switching element 308 is turned off, whereby the data stored in the capacitor 307 is held. After turning off the capacitor switching element 306 and the capacitor switching element 308, for example, the power supply potential VSS is supplied to each of the first node and the second node so that the nodes have equal potentials, and the application of the power supply voltage between the first node and the second node is stopped.

In such a manner, in the case where the input data is held in the capacitor 305 and the capacitor 307, the application of the power supply voltage between the first node and the second node is unnecessary; therefore, the off-state current flowing between the first node and the second node via the p-channel transistor 309 and the n-channel transistor 310 which are included in the first phase-inversion element 301, or via the p-channel transistor 311 and the n-channel transistor 312 which are included in the second phase-inversion element 302 can be extremely close to zero. As a result, power consumption due to the off-state current of the memory element in holding the data can be significantly reduced, and the power consumption of the memory device and further the signal processing circuit including the memory device can be suppressed to be low.

Since the transistor used for each of the capacitor switching element 306 and the capacitor switching element 308 includes a highly purified oxide semiconductor in a channel formation region, off-state current density can be less than or equal to 100 zA/μm, preferably less than or equal to 10 zA/μm, more preferably less than or equal to 1 zA/μm. Accordingly, the transistor including the highly purified oxide semiconductor film as an active layer has far lower off-state current than a transistor including silicon having crystallinity. As a result, when the capacitor switching element 306 for which the above transistor is used is in an off state, electric charge stored in the capacitor 305 is hardly released; therefore, the data is held. In addition, when the capacitor switching element 308 for which the above transistor is used is in an off state, electric charge stored in the capacitor 307 is hardly released; therefore, the data is held.

In the case where the data stored in the capacitor 305 and the capacitor 307 is read out, the power supply potential VDD is supplied to the first node and the power supply potential VSS is supplied to the second node, whereby the power supply voltage is applied between the first node and the second node. In this state, the capacitor switching element 306 is turned on. When the power supply voltage is applied between the first node and the second node, the output terminal of the first phase-inversion element 301 is supplied with a phase-inverted potential of the potential of the input terminal thereof. Note that the input terminal of the first phase-inversion element 301 is supplied with a potential having a level corresponding to the amount of electric charge stored in the capacitor 305; thus, a potential of the output terminal thereof reflects the data. In addition, by turning on the capacitor switching element 308, a potential having a level corresponding to the amount of electric charge stored in the capacitor 307 is supplied to the output terminal of the first phase-inversion element 301. Thus, a signal OUT having a potential that reflects the data can be read out from the memory element 300.

Figure 28:
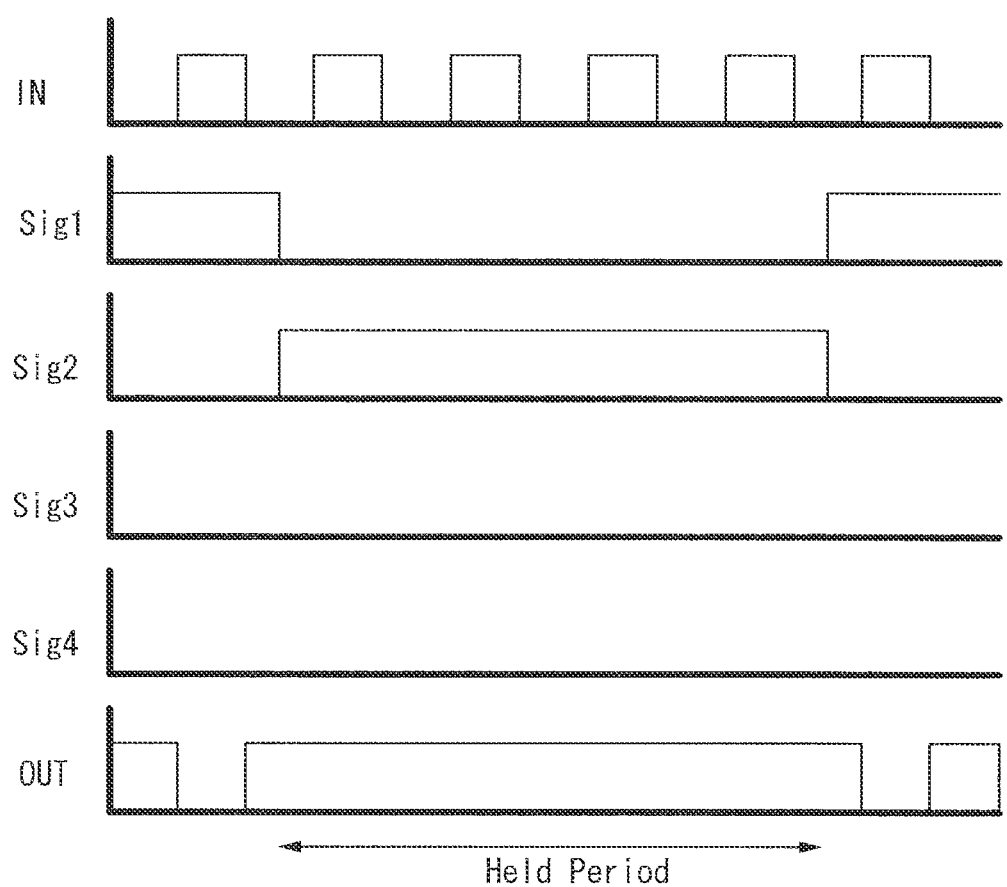
FIG. 28 is a timing chart showing the operation of a memory device.

FIG. 28 is an example of a timing chart in the case where the supply of the power supply potential VDD is not stopped in the circuit of FIG. 6. When the signal Sig 1 is set to a low level and the signal Sig 2 is set to a high level, the signal IN is blocked and a feedback loop is formed, and the state can be held. When the signal Sig 1 is set to a high level again and the signal Sig 2 is a set to a low level, the signal IN is input and output via the first phase-inversion element 301. At this time, the signal Sig 3 and the signal Sig 4 are set to a low level.

Figure 29:
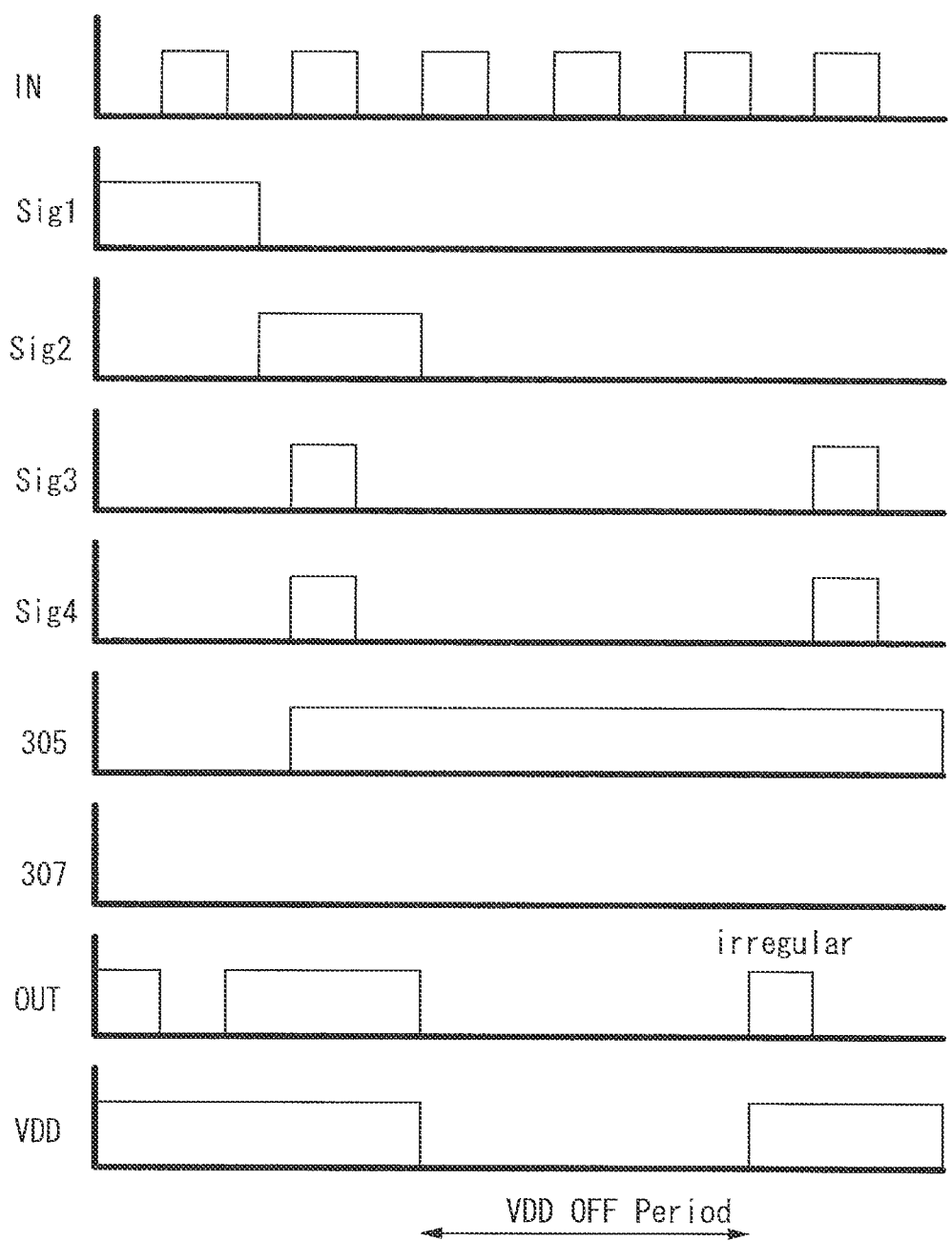
FIG. 29 is a timing chart showing the operation of a memory device.

FIG. 29 is an example of a timing chart in the case where the supply of the power supply potential VDD is stopped in the circuit of FIG. 6. When the signal Sig 1 is set to a low level and the signal Sig 2 is set to a high level, the signal IN is blocked and a feedback loop is formed, and the state can be held. After that, the signal Sig 3 and the signal Sig 4 are set to a high level, whereby the capacitor 305 and the capacitor 307 store the data. Even when the supply of the power supply potential VDD is stopped after that, a potential of the capacitor 305 and a potential of the capacitor 307 are held (in FIG. 29, the capacitor 305 has a high-level potential, and the capacitor 307 has a low-level potential). After that, when the power supply potential VDD is supplied and the signal Sig 3 and the signal Sig 4 are set to a high level again, the potential of the capacitor 305 is output via the first phase-inversion element 301, and the potential of the capacitor 307 is output (in FIG. 29, both the capacitor 305 and the capacitor 307 have a low-level potential).

This embodiment can be implemented by being combined as appropriate with any of the above-described embodiments.

Embodiment 4

A signal processing circuit according to one embodiment of the present invention includes a transistor including silicon and a transistor including an oxide semiconductor. The transistor including silicon can be formed using a silicon wafer, an SOI (silicon on insulator) substrate, a silicon thin film over an insulating surface, or the like.

An SOI substrate can be manufactured using, for example, UNIBOND (registered trademark) typified by Smart Cut (registered trademark), epitaxial layer transfer (ELTRAN) (registered trademark), a dielectric separation method, plasma assisted chemical etching (PACE), separation by implanted oxygen (SIMOX), or the like.

A semiconductor film of silicon formed over a substrate having an insulating surface may be crystallized by a known technique. As a known crystallization method, a laser crystallization method using a laser beam and a crystallization method using a catalytic element are given. Alternatively, a crystallization method using a catalytic element and a laser crystallization method may be combined. In the case of using a substrate having high heat resistance such as quartz, it is possible to combine any of the following crystallization methods: a thermal crystallization method with the use of an electrically heated oven, a lamp anneal crystallization method with the use of infrared light, a crystallization method with the use of a catalytic element, and a high temperature annealing method at about 950° C.

In addition, a semiconductor element manufactured using the above-described method may be transferred to a flexible substrate formed of plastic or the like to form a signal processing circuit. A variety of transfer methods can be used. Examples of the transfer method include a method in which a metal oxide film is provided between the substrate and the semiconductor element, and the metal oxide film is embrittled by crystallization so that the semiconductor element is separated off and transferred; a method in which an amorphous silicon film containing hydrogen is provided between the substrate and the semiconductor element, and the amorphous silicon film is removed by laser beam irradiation or etching so that the semiconductor element is separated off the substrate and transferred; a method in which the substrate, for which the semiconductor element is provided, is removed by mechanical cutting or etching with a solution or a gas so that the semiconductor element is cut off the substrate and transferred; and the like.

In this embodiment, a structure of a signal processing circuit and a method for manufacturing the signal processing circuit will be described by giving an example in which with the use of an SOI substrate, the transistor including silicon is manufactured and then the transistor including an oxide semiconductor is manufactured.

Figure 7A:
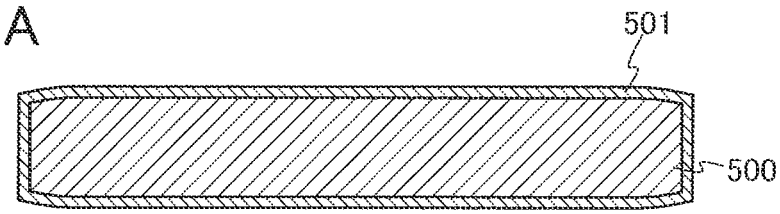
FIGS. 7A to 7E are diagrams illustrating a method for manufacturing a memory device.

First, as illustrated in FIG. 7A, a bond substrate 500 is cleaned, and then, an insulating film 501 is formed over a surface of the bond substrate 500.

As the bond substrate 500, a single crystal semiconductor substrate formed using silicon can be used. Alternatively, the bond substrate 500 may be a semiconductor substrate formed using silicon having crystal lattice distortion, silicon germanium obtained by adding germanium to silicon, or the like.

Note that in a single crystal semiconductor substrate used for the bond substrate 500, the directions of crystal axes are preferably uniform; however, the substrate does not necessarily include perfect crystals in which lattice defects such as point defects, line defects, or plane defects are completely eliminated.

The shape of the bond substrate 500 is not limited to a circle, and the substrate can be processed into a shape other than a circle. The bond substrate 500 may be processed into, for example, a rectangular shape considering that the shape of a base substrate 503 to which the bond substrate 500 is attached later generally has a rectangular shape and that a light exposure region of a light exposure apparatus such as a reduced projection exposure apparatus has a rectangular shape, and the like. The bond substrate 500 can be processed by cutting a circular single crystal semiconductor substrate that is commercially available.

The insulating film 501 may be a single insulating film or a stack of plural insulating films. Considering that a region containing impurities will be removed later, the thickness of the insulating film 501 is preferably greater than or equal to 15 nm and less than or equal to 500 nm.

As a film included in the insulating film 501, an insulating film containing silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film containing a metal oxide such as aluminum oxide, tantalum oxide, or hafnium oxide; an insulating film containing a metal nitride such as aluminum nitride; an insulating film containing a metal oxynitride such as aluminum oxynitride; or an insulating film containing a metal nitride oxide such as aluminum nitride oxide can be used.

In this embodiment, an example in which silicon oxide formed by thermal oxidation of the bond substrate 500 is used as the insulating film 501 is described. Note that in FIG. 7A, the insulating film 501 is formed so as to cover the entire surface of the bond substrate 500; however, the insulating film 501 may be formed on at least one surface of the bond substrate 500.

In this specification, oxynitride refers to a substance which contains more oxygen than nitrogen, and nitride oxide refers to a substance which contains more nitrogen than oxygen.

In the case where the insulating film 501 is formed by thermal oxidation of the surface of the bond substrate 500, dry oxidation in which oxygen containing a small amount of moisture is used, thermal oxidation in which a gas containing halogen such as hydrogen chloride is added to an oxygen atmosphere, or the like can be used as the thermal oxidation. In addition, wet oxidation such as pyrogenic oxidation in which hydrogen is burnt with oxygen to generate water, or water vapor oxidation in which high-purity water is heated to greater than or equal to 100° C. to generate water vapor and oxidation is performed with use of the water vapor may be used for forming the insulating film 501.

In the case where a substrate containing impurities which decrease the reliability of a signal processing circuit, such as an alkali metal or an alkaline earth metal, is used for the base substrate 503, the insulating film 501 preferably includes at least one layer of a barrier film that can prevent the impurities from diffusing into a semiconductor film which is to be formed after separation from the base substrate 503. As the insulating film that can be used as the barrier film, a silicon nitride film, a silicon nitride oxide film, an aluminum nitride film, an aluminum nitride oxide film, or the like can be given. The insulating film that is used as the barrier film is preferably formed to a thickness of 15 nm to 300 nm. In addition, an insulating film which has a lower proportion of nitrogen than the barrier film, such as a silicon oxide film or a silicon oxynitride film may be formed between the barrier film and the bond substrate 500. The insulating film which has a lower proportion of nitrogen may be formed to a thickness of greater than or equal to 5 nm and less than or equal to 200 nm.

In the case of using silicon oxide for the insulating film 501, the insulating film 501 can be formed by a vapor deposition method such as a thermal CVD method, a plasma CVD method, an atmospheric pressure CVD method, or a bias ECRCVD method using a mixed gas of silane and oxygen, a mixed gas of TEOS (tetraethoxysilane) and oxygen, or the like. In this case, a surface of the insulating film 501 may be densified by oxygen plasma treatment. Meanwhile, in the case of using silicon nitride for the insulating film 501, the insulating film 501 can be formed by a vapor deposition method such as a plasma CVD method with the use of a mixed gas of silane and ammonia.

Alternatively, the insulating film 501 may be formed using silicon oxide which is formed by a chemical vapor deposition method with the use of an organosilane gas. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

With the use of an organosilane gas for the source gas, a silicon oxide film with a smooth surface can be formed at a process temperature of less than or equal to 350° C. Alternatively, the insulating film 501 can be formed by a thermal CVD method using a low temperature oxide (LTO) which is formed at a heating temperature of greater than or equal to 200° C. and less than or equal to 500° C. LTO can be formed by using monosilane ($SiH_4$), disilane ($Si_2H_6$), or the like as a silicon source gas and using nitrogen dioxide ($NO_2$) or the like as an oxygen source gas.

For example, in the case of using TEOS and $O_2$ for the source gas to form the silicon oxide film as the insulating film 501, the condition may be set as follows: the flow rate of TEOS is 15 sccm, the flow rate of $O_2$ is 750 sccm, the deposition pressure is 100 Pa, the deposition temperature is 300° C., the RF output is 300 W, and the power source frequency is 13.56 MHz.

Note that an insulating film formed at a relatively low temperature, such as a silicon oxide film formed using organosilane or a silicon nitride oxide film formed at a low temperature, has a number of OH groups on its surface. Hydrogen bonding between the OH group and a water molecule forms a silanol group and bonds the base substrate and the insulating film at a low temperature. A siloxane bond, which is a covalent bond, is formed finally between the base substrate and the insulating film. The insulating film such as the above-described silicon oxide film formed using organosilane or the LTO formed at a relatively low temperature is suitable for bonding at a low temperature, as compared with a thermal oxide film having no OH groups or having very few OH groups which is used in Smart Cut (registered trademark) or the like.

The insulating film 501 is a film for forming a bonding plane which is smooth and hydrophilic over the surface of the bond substrate 500. Therefore, the average surface roughness $R_a$ of the insulating film 501 is preferably less than or equal to 0.7 nm, more preferably less than or equal to 0.4 nm. The thickness of the insulating film 501 may be greater than or equal to 5 nm and less than or equal to 500 nm, preferably greater than or equal to 10 nm and less than or equal to 200 nm.

Figure 7B:
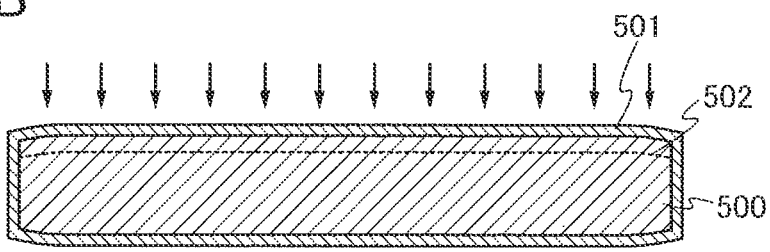

Next, as illustrated in FIG. 7B, the bond substrate 500 is irradiated with an ion beam including ions accelerated by an electric field through the insulating film 501 as indicated by arrows, whereby an embrittlement layer 502 having microvoids is formed in a region at a predetermined depth from the surface of the bond substrate 500. For example, the embrittlement layer means a layer which is locally embrittled by disorder of a crystal structure, and the state of the embrittlement layer depends on a means for forming the embrittlement layer. Note that there may be a case where a region ranging from one surface of the bond substrate to the embrittlement layer is embrittled to some extent; however, the embrittlement layer in this specification refers to a region at which separation is performed later and its vicinity.

The depth at which the embrittlement layer 502 is formed can be adjusted by the acceleration energy of the ion beam and the angle at which the ion beam enters. The embrittlement layer 502 can be formed at the same or substantially the same depth as the average penetration depth of the ions. The thickness of a semiconductor film 504 which will be separated from the bond substrate 500 is determined by the depth at which the ions are implanted. The depth at which the embrittlement layer 502 is formed can be set in the range of, for example, greater than or equal to 50 nm and less than or equal to 500 nm, preferably greater than or equal to 50 nm and less than or equal to 200 nm.

The ions are implanted to the bond substrate 500 desirably by an ion doping method in which mass separation is not performed because the cycle time can be shortened; however, the present invention may employ an ion implantation method in which mass separation is performed.

When hydrogen ($H_2$) is used for a source gas, $H^+$, $H_2^+$, and $H_3^+$ can be produced by exciting a hydrogen gas. Proportions of ion species produced from the source gas can be changed by adjusting a plasma excitation method, the pressure of an atmosphere for generating plasma, the amount of a supplied source gas, or the like. In the case where the ion implantation is performed by an ion doping method, it is preferable that $H_3^+$ be contained at greater than or equal to 50%, more preferably at greater than or equal to 80%, with respect to the total amount of $H^+$, $H_2^+$, and $H_3^+$ in the ion beam. When $H_3^+$ is contained at greater than or equal to 80%, the proportion of $H_2^+$ ions in the ion beam gets lower relatively, which results in smaller variation in the average penetration depth of the hydrogen ions contained in the ion beam. Consequently, the ion implantation efficiency improves and the cycle time can be shortened.

$H_3^+$ has larger mass than $H^+$ and $H_2^+$. Therefore, when the ion beam containing a higher proportion of $H_3^+$ is compared with the ion beam containing a higher proportion of $H^+$ and $H_2^+$, the former can implant hydrogen into a shallower region of the bond substrate 500 than the latter even when the acceleration voltage at the time of doping is the same. Moreover, the former has a steep change in concentration distribution of hydrogen implanted into the bond substrate 500 in a thickness direction; therefore, the thickness of the embrittlement layer 502 itself can be smaller.

In the case of performing ion implantation by an ion doping method with the use of a hydrogen gas, the acceleration voltage is set to greater than or equal to 10 kV and less than or equal to 200 kV and the dose is set to greater than or equal to $1\times10^{16}$ ions/cm$^2$ and less than or equal to $6\times10^{16}$ ions/cm$^2$. Under this condition, the embrittlement layer 502 can be formed in a region at a depth of greater than or equal to 50 nm and less than or equal to 500 nm of the bond substrate 500, although depending on the ion species included in the ion beam and its proportion, and the film thickness of the insulating film 501.

For example, in the case where the bond substrate 500 is a single crystal silicon substrate and the insulating film 501 is formed using a 100-nm-thick thermal oxide film, a semiconductor film with a thickness of approximately 146 nm can be separated from the bond substrate 500 under the condition where the flow rate of 100% hydrogen gas, which is the source gas, is 50 sccm, the beam current density is 5 μA/cm$^2$, the acceleration voltage is 50 kV, and the dose is $2.0\times10^{16}$ atoms/cm$^2$. Note that even when the condition at the time of adding hydrogen to the bond substrate 500 is not changed, by making the thickness of the insulating film 501 larger, the thickness of the semiconductor film can be made smaller.

Helium (He) can alternatively be used as the source gas of the ion beam. Since most of the ion species produced by exciting helium are He$^+$, He$^+$ can be mainly implanted into the bond substrate 500 even by an ion doping method in which mass separation is not performed. Therefore, microvoids can be formed in the embrittlement layer 502 efficiently by an ion doping method. In the case of performing ion implantation by an ion doping method using helium, the acceleration voltage can be greater than or equal to 10 kV and less than or equal to 200 kV, and the dose can be greater than or equal to $1\times10^{16}$ ions/cm$^2$ and less than or equal to $6\times10^{16}$ ions/cm$^2$.

A halogen gas such as a chlorine gas (Cl$_2$ gas) or a fluorine gas (F$_2$ gas) can be used as a source gas.

In the case of performing ion implantation on the bond substrate 500 by an ion doping method, impurities existing in an ion doping apparatus are implanted together with the ions to an object to be processed; therefore, there is a possibility that impurities such as S, Ca, Fe, and Mo exist on and near the surface of the insulating film 501. Therefore, a region on and near the surface of the insulating film 501 where the number of impurities is considered to be the largest may be removed by etching, polishing, or the like. Specifically, a region ranging from the surface of the insulating film 501 to a depth of approximately 10 nm to 100 nm, preferably approximately 30 nm to 70 nm may be removed. As for dry etching, a reactive ion etching (RIE) method, for example, an inductively coupled plasma (ICP) etching method, an electron cyclotron resonance (ECR) etching method, a parallel-plate (capacitively coupled plasma) etching method, a magnetron plasma etching method, a dual-frequency plasma etching method, a helicon wave plasma etching method, or the like may be employed. For example, in the case of removing a region on and near a surface of a silicon nitride oxide film by an ICP etching method, the region can be removed to a depth of about 50 nm from the surface under the condition where the flow rate of $CHF_3$ as an etching gas is 7.5 sccm, the flow rate of He is 100 sccm, the reaction pressure is 5.5 Pa, the temperature of a lower electrode is 70° C., the RF (13.56 MHz) electric power applied to a coil-shaped electrode is 475 W, the electric power applied to the lower electrode (on bias side) is 300 W, and the etching time is about 10 seconds.

Instead of $CHF_3$, which is a fluorine-based gas, a chlorine-based gas such as $Cl_2$, $BCl_3$, $SiCl_4$, or $CCl_4$; another fluorine-based gas such as $CF_4$, $SF_6$, or $NF_3$; or $O_2$ can be used as appropriate for the etching gas. Moreover, an inert gas other than He may be added to the etching gas. For example, one or plural elements selected from Ne, Ar, Kr, and Xe can be used as the inert element which is added to the etching gas. In the case of removing a region on and near a surface of a silicon nitride oxide film by wet etching, an aqueous solution containing ammonium hydrogen fluoride, ammonium fluoride, or the like may be used as an etchant. The polishing can be performed by CMP (chemical mechanical polishing), liquid jet polishing, or the like.

When the region on and near the surface of the insulating film 501 where the contamination is remarkable is removed by etching, polishing, or the like after the formation of the embrittlement layer 502, the amount of impurities which enter the semiconductor film 504 formed over the base substrate 503 can be suppressed. Moreover, in a signal processing circuit which is completed finally, it is possible to prevent the impurities from causing decrease in reliability and decrease in electric characteristics of transistors, such as variation in threshold voltage or increase in leakage current.

In order to remove the impurities, it is possible to perform atomic beam or ion beam irradiation treatment, plasma treatment, or radical treatment. In the case of using an atomic beam or an ion beam, an inert gas neutral atom beam or an inert gas ion beam of argon or the like can be used.

Figure 7C:
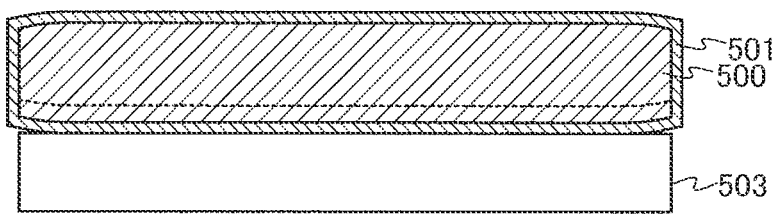

Next, as illustrated in FIG. 7C, the bond substrate 500 and the base substrate 503 are attached to each other so that the insulating film 501 is interposed therebetween.

Note that before the attachment of the base substrate 503 and the bond substrate 500, surfaces for the attachment, i.e., a surface of the insulating film 501 formed over the bond substrate 500 and a surface of the base substrate 503 in this embodiment, are preferably subjected to surface treatment for increasing bonding strength between the insulating film 501 and the base substrate 503.

As examples of the surface treatment, wet treatment, dry treatment, and combination of wet treatment and dry treatment can be given. Different wet treatments or different dry treatments may be combined to be performed. Examples of the wet treatment include ozone treatment using ozone water (ozone water cleaning), ultrasonic cleaning such as megasonic cleaning, two-fluid cleaning (a method in which functional water such as pure water or hydrogenated water and a carrier gas such as nitrogen are sprayed together), cleaning with hydrochloric acid and a hydrogen peroxide solution, and the like. As examples of the dry treatment, inert gas neutral atomic beam treatment, inert gas ion beam treatment, ultraviolet treatment, ozone treatment, plasma treatment, plasma treatment with bias application, radical treatment, and the like can be given. By performing the above-described surface treatment, the hydrophilicity and cleanliness of the surfaces for the attachment can be increased. Thus, the bonding strength can be improved.

For the attachment, the base substrate 503 and the insulating film 501 formed over the bond substrate 500 are disposed in close contact with each other, and then, a pressure of approximately greater than or equal to 1 $N/cm^2$ and less than or equal to 500 $N/cm^2$, preferably greater than or equal to 11 $N/cm^2$ and less than or equal to 20 $N/cm^2$ is applied to part of the base substrate 503 and the bond substrate 500 which are superposed on each other. When the pressure is applied, bonding between the base substrate 503 and the insulating film 501 starts from the portion, which results in bonding of the entire surface where the base substrate 503 and the insulating film 501 are in close contact with each other.

The bonding is performed by Van der Waals force or a hydrogen bond, so that the bonding is firm even at room temperature. Note that since the above-described bonding can be performed at a low temperature, a variety of substrates can be used as the base substrate 503. For example, a variety of glass substrates used in the electronics industry, such as an aluminosilicate glass substrate, a barium borosilicate glass substrate, or an aluminoborosilicate glass substrate, a quartz substrate, a ceramic substrate, a sapphire substrate, or the like can be used as the base substrate 503. Alternatively, as the base substrate 503, a semiconductor substrate formed of silicon, gallium arsenide, indium phosphide, or the like can be used. Further alternatively, the base substrate 503 may be a metal substrate including a stainless steel substrate. Substrates with coefficients of thermal expansion of greater than or equal to $25 \times 10^{-7}$/° C. and less than or equal to $50 \times 10^{-7}$/° C. (preferably, greater than or equal to $30 \times 10^{-7}$/° C. and less than or equal to $40 \times 10^{-7}$/° C.) and strain points of greater than or equal to 580° C. and less than or equal to 680° C. (preferably, greater than or equal to 600° C. and less than or equal to 680° C.) are preferably used as the glass substrate which serves as the base substrate 503. When the glass substrate is an alkali-free glass substrate, impurity contamination of a signal processing circuit can be suppressed.

As the glass substrate, a mother glass substrate developed for production of liquid crystal panels can be used. As such a mother glass substrate, substrates having the following sizes are known: the third generation (550 mm×650 mm), the 3.5-th generation (600 mm×720 mm), the fourth generation (680 mm×880 mm, or 730 mm×920 mm), the fifth generation (1100 mm×1300 mm), the sixth generation (1500 mm×1850 mm), the seventh generation (1870 mm×2200 mm), the eighth generation (2200 mm×2400 mm), and the like. Size increase of an SOI substrate can be realized by using a large mother glass substrate as the base substrate 503. When the SOI substrate can have a larger area, a larger number of chips such as ICs or LSIs can be manufactured from one substrate. Thus, productivity can be dramatically increased.

Although there is no particular limitation on a substrate which can be used as the base substrate 503, it is necessary that the substrate have at least enough heat resistance to heat treatment performed later. For example, a glass substrate manufactured by a fusion method or a float method can be used. Further, when the temperature of heat treatment performed later is high, a substrate having a strain point of greater than or equal to 730° C. is preferably used as the glass substrate. For the glass substrate, a glass material such as aluminosilicate glass, aluminoborosilicate glass, or barium borosilicate glass is used, for example. In general, when the glass substrate contains more barium oxide (BaO) than boron oxide, a more practical heat-resistant glass substrate can be obtained. Therefore, a glass substrate containing BaO and $B_2O_3$ so that the amount of BaO is larger than that of $B_2O_3$ is preferably used. Note that in order to avoid defective bonding that is caused by a shrink, the base substrate 503 may be subjected to heat treatment in advance before the bonding step.

Moreover, an insulating film may be formed in advance over the base substrate 503. The base substrate 503 is not necessarily provided with an insulating film on its surface; however, the formation of the insulating film on the surface of the base substrate 503 can prevent impurities in the base substrate 503, such as an alkali metal or an alkaline earth metal, from entering the bond substrate 500. In the case where the insulating film is formed on the surface of the base substrate 503, the insulating film over the base substrate 503 is bonded to the insulating film 501; therefore, a wider variety of substrates can be used as the base substrate 503. In general, the upper temperature limits of substrates formed of flexible synthetic resins such as plastics tend to be low. However, as long as the substrates can resist process temperatures in manufacturing steps of a semiconductor element performed later, the substrates formed of such resins can be used as the base substrate 503 in the case where the insulating film is formed over the base substrate 503. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like. In the case where the insulating film is formed over the base substrate 503, the attachment of the base substrate 503 and the bond substrate 500 to each other is preferably performed after surface treatment is performed on the surface of this insulating film in a manner similar to that for the insulating film 501.

After the bond substrate 500 is attached to the base substrate 503, heat treatment is preferably performed in order to increase the bonding strength at the bonding interface between the base substrate 503 and the insulating film 501. This treatment is performed at a temperature where a crack is not generated in the embrittlement layer 502 and can be performed at a temperature in the range of greater than or equal to 200° C. and less than or equal to 400° C. By attaching the bond substrate 500 to the base substrate 503 within this temperature range, the bonding strength between the base substrate 503 and the insulating film 501 can be made firm.

When the bonding plane is contaminated by dust or the like at the time of attaching the bond substrate 500 and the base substrate 503 to each other, the contaminated portion is not bonded. In order to avoid the contamination of the bonding plane, the attachment of the bond substrate 500 and the base substrate 503 to each other is preferably performed in an airtight chamber. At the time of attaching the bond substrate 500 and the base substrate 503 to each other, the treatment chamber may have a pressure reduced to approximately $5.0 \times 10^{-3}$ Pa and the atmosphere of the bonding treatment may be cleaned.

Figure 7D:
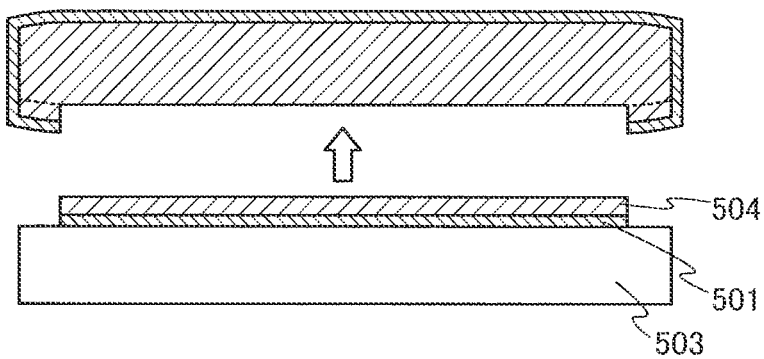

After that, heat treatment is performed, whereby microvoids adjacent to each other in the embrittlement layer 502 are combined, so that the microvoids increase in volume. As a result, as illustrated in FIG. 7D, the semiconductor film 504 which is part of the bond substrate 500 is separated from the bond substrate 500 along the embrittlement layer 502. Since the insulating film 501 and the base substrate 503 are bonded to each other, the semiconductor film 504 which is separated from the bond substrate 500 is fixed to the base substrate 503. The heat treatment for separating the semiconductor film 504 from the bond substrate 500 is preferably performed at a temperature which does not exceed the strain point of the base substrate 503.

For this heat treatment, a rapid thermal annealing (RTA) apparatus, a resistance heating furnace, or a microwave heating apparatus can be used. As the RTA apparatus, a gas rapid thermal annealing (GRTA) apparatus or a lamp rapid thermal annealing (LRTA) apparatus can be used. When a GRTA apparatus is used, a heating temperature can be set to a temperature of greater than or equal to 550° C. and less than or equal to 650° C., and processing time can be set to greater than or equal to 0.5 minutes and less than or equal to 60 minutes. In the case of using a resistance heating apparatus, the heat temperature can be set to greater than or equal to 200° C. and less than or equal to 650° C. and the treatment time can be set to greater than or equal to 2 hours and less than or equal to 4 hours.

The heat treatment may be performed by dielectric heating with a high-frequency wave such as a microwave. The heat treatment by the dielectric heating can be performed by irradiating the bond substrate 500 with high frequency waves generated with a high-frequency generator, which is in the range of 300 MHz to 3 THz. Specifically, for example, irradiation with a microwave with a frequency of 2.45 GHz at 900 W is performed for 14 minutes to combine microvoids adjacent to each other in the embrittlement layer, whereby the bond substrate 500 can be split along the embrittlement layer finally.

A specific treatment method of a heat treatment using a vertical furnace for resistance heating is described. The base substrate 503 to which the bond substrate 500 is attached is disposed on a boat of the vertical furnace and this boat is delivered in a chamber of the vertical furnace. In order to suppress oxidation of the bond substrate 500, the chamber is evacuated first such that a vacuum state is formed. The degree of vacuum is approximately $5 \times 10^{-3}$ Pa. After a vacuum state is obtained, nitrogen is supplied to the chamber so that the chamber has a nitrogen atmosphere under atmospheric pressure. In this period, the heating temperature is increased to 200° C.

After making the chamber have a nitrogen atmosphere that is under atmospheric pressure, heating at 200° C. is performed for 2 hours. Then, the temperature is increased to 400° C. in 1 hour. After the state at a heating temperature of 400° C. becomes stable, the temperature is increased to 600° C. in 1 hour. After the state at a heating temperature of 600° C. becomes stable, heating at 600° C. is performed for 2 hours. Then, the heating temperature is decreased to 400° C. in 1 hour, and after 10 minutes to 30 minutes, the boat is carried out of the chamber. The base substrate 503 to which the bond substrate 500 and the semiconductor film 504 are attached and which is disposed on the boat is cooled in an air atmosphere.

The heat treatment using the above resistance heating furnace is performed by successively performing heat treatment for increasing the bonding strength between the insulating film 501 and the base substrate 503 and heat treatment for separation along the embrittlement layer 502. In the case of performing these two kinds of heat treatment in different apparatuses, for example, heat treatment is performed at 200° C. for 2 hours in a resistance heating furnace and then the base substrate 503 and the bond substrate 500 which are attached to each other are carried out of the furnace. Next, heat treatment is performed by an RTA apparatus at a process temperature of greater than or equal to 600° C. and less than or equal to 700° C. for one minute to several hours, so that the bond substrate 500 is split along the embrittlement layer 502.

Note that in some cases, the periphery of the bond substrate 500 is not bonded to the base substrate 503. This is seemingly because the periphery of the bond substrate 500 is chamfered or has a curvature, so that the base substrate 503 and the insulating film 501 are not in close contact with each other or the embrittlement layer 502 is difficult to split at the periphery of the bond substrate 500. Another reason is that polishing such as CMP performed in manufacturing the bond substrate 500 is insufficient at the periphery of the bond substrate 500, so that a surface thereof is rougher at the periphery than at a center. Still another reason is that, in the case where a carrier or the like damages the periphery of the bond substrate 500 at the time of delivery of the bond substrate 500, the damage makes it difficult to bond the periphery to the base substrate 503. For these reasons, the semiconductor film 504 which is smaller than the bond substrate 500 is attached to the base substrate 503.

Note that the bond substrate 500 may be subjected to hydrogenation treatment before the bond substrate 500 is split. Hydrogenation treatment is performed, for example, at 350° C. for about 2 hours in a hydrogen atmosphere.

When a plurality of bond substrates 500 are attached to the base substrate 503, the plurality of bond substrates 500 may have different crystal plane orientations from each other. The mobility of majority carriers in a semiconductor depends on crystal plane orientation. Therefore, the semiconductor film 504 may be formed by selecting as appropriate the bond substrate 500 which has crystal plane orientation suitable for a semiconductor element to be formed. For example, in the case of forming an n-type semiconductor element by using the semiconductor film 504, the mobility of majority carriers in the semiconductor element can be increased by forming the semiconductor film 504 which has a {100} plane. In contrast, for example, in the case of forming a p-type semiconductor element by using the semiconductor film 504, the mobility of majority carriers in the semiconductor element can be increased by forming the semiconductor film 504 which has a {110} plane. Then, in the case of forming a transistor as a semiconductor element, the bonding direction of the semiconductor film 504 is determined in consideration of a channel direction and crystal plane orientation.

Next, a surface of the semiconductor film 504 may be planarized by polishing. The planarization is not always necessary; however, the planarization makes it possible to improve the characteristics of an interface between semiconductor films 506 and 507 and a gate insulating film which are formed later. Specifically, the polishing may be chemical mechanical polishing (CMP), liquid jet polishing, or the like. The thickness of the semiconductor film 504 is reduced by the above-described planarization. The planarization may be performed on the semiconductor film 504 before being etched; alternatively, the planarization may be performed on the semiconductor films 506 and 507 formed by etching.

Not the polishing but etching may be performed on the surface of the semiconductor film 504 in order to planarize the surface of the semiconductor film 504. The etching may be performed using a dry etching method such as a reactive ion etching (RIE) method; for example, an inductively coupled plasma (ICP) etching method, an electron cyclotron resonance (ECR) etching method, a parallel plate (capacitive coupled type) etching method, a magnetron plasma etching method, a dual-frequency plasma etching method, a helicon wave plasma etching method, or the like may be used.

For example, when an ICP etching method is used, etching may be performed under the following conditions: the flow rate of chlorine, which is an etching gas is 40 sccm to 100 sccm; the electric power applied to a coil-shaped electrode is 100 W to 200 W; the electric power applied to a lower electrode (on the bias side) is 40 W to 100 W; and the reaction pressure is 0.5 Pa to 1.0 Pa. For example, the thickness of the semiconductor film 504 can be reduced to about 50 nm to 60 nm by performing the etching under the condition where the flow rate of chlorine as an etching gas is 100 sccm, the reaction pressure is 1.0 Pa, the temperature of the lower electrode is 70° C., the RF (13.56 MHz) electric power applied to the coil-shaped electrode is 150 W, the electric power applied to the lower electrode (on the bias side) is 40 W, and the etching time is about 25 seconds to 27 seconds. For the etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

By the etching, the thickness of the semiconductor film 504 can be reduced to be optimal for a semiconductor element that is to be formed later and also the surface of the semiconductor film 504 can be planarized.

Note that in the semiconductor film 504 closely in contact with the base substrate 503, crystal defects are formed owing to the formation of the embrittlement layer 502 and the split along the embrittlement layer 502, or planarity of the surface of the semiconductor film 504 is impaired. Thus, in one embodiment of the present invention, in order to reduce crystal defects and improve planarity, the semiconductor film 504 is irradiated with a laser beam after a process of removing an oxide film such as a native oxide film which is formed on the surface of the semiconductor film 504.

In this embodiment of the present invention, the semiconductor film 504 is immersed in DHF having a hydrogen fluoride concentration of 0.5 wt % for 110 seconds, whereby the oxide film is removed.

The laser beam irradiation is preferably performed with such an energy density that the semiconductor film 504 is partly melted. This is because when the semiconductor film 504 is completely melted, disordered nucleation of the semiconductor film 504 in a liquid phase occurs, leading to generation of microcrystals due to recrystallization of the semiconductor film 504 and decrease in crystallinity of the semiconductor film 504. By partly melting the semiconductor film 504, so-called longitudinal growth in which crystal growth proceeds from an unmelted solid portion occurs in the semiconductor film 504. Due to the recrystallization by the longitudinal growth, crystal defects of the semiconductor film 504 are decreased and crystallinity thereof is recovered. The state where the semiconductor film 504 is completely melted indicates the state where the semiconductor film 504 is melted to be in a liquid phase to the interface with the insulating film 501. On the other hand, the state where the semiconductor film 504 is partly melted indicates the state where an upper part thereof is melted and is in a liquid phase and a lower part thereof is in a solid phase.

As this laser beam irradiation, pulsed laser beam irradiation is preferable for partly melting the semiconductor film 504. For example, in the case of a pulsed laser, the repetition rate is less than or equal to 1 MHz and the pulse width is greater than or equal to 10 nanoseconds and less than or equal to 500 nanoseconds. For example, a XeCl excimer laser having a repetition rate of 10 Hz to 300 Hz, a pulse width of 25 nanoseconds, and a wavelength of 308 nm can be used.

As the laser beam, a fundamental wave or a second harmonic of a solid-state laser, which is selectively absorbed by a semiconductor, is preferably used. Specifically, for example, a laser beam having a wavelength in the range of greater than or equal to 250 nm and less than or equal to 700 nm can be used. The energy of the laser beam can be determined in consideration of the wavelength of the laser beam, the skin depth of the laser beam, the thickness of the semiconductor film 504, or the like. For example, in the case where the thickness of the semiconductor film 504 is approximately 120 nm and a pulsed laser that emits a laser beam having a wavelength of 308 nm is used, the energy density of the laser beam may be set to 600 mJ/cm$^2$ to 700 mJ/cm$^2$.

As a pulsed laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser can be used, for example.

Figure 7E:
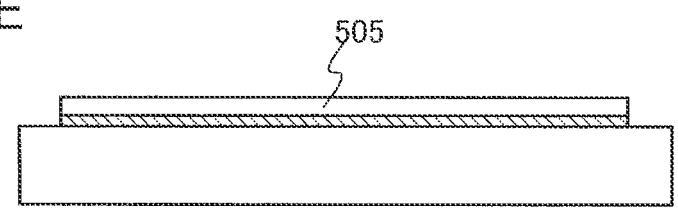

In this embodiment, in the case where the thickness of the semiconductor film 504 is approximately 146 nm, the laser beam irradiation can be performed in the following manner. As a laser emitting a laser beam, a XeCl excimer laser (wavelength: 308 nm, pulse width: 20 nanoseconds, and repetition rate: 30 Hz) is used. The cross section of the laser beam is shaped into a linear form with a size of 0.4 mm×120 mm through an optical system. The semiconductor film 504 is irradiated with the laser beam with a laser scanning speed of 0.5 mm/second. Then, through the laser beam irradiation, a semiconductor film 505 whose crystal defects have been repaired is formed as illustrated in FIG. 7E.

Note that the laser beam irradiation is preferably performed in an inert atmosphere such as a rare gas atmosphere or a nitrogen atmosphere, or a reduced-pressure atmosphere. In the case of the above atmosphere, the laser beam irradiation may be performed in an airtight chamber whose atmosphere is controlled. When the chamber is not used, the laser beam irradiation in an inert atmosphere can be achieved by spraying an inert gas such as a nitrogen gas to the surface to be irradiated with the laser beam. The laser beam irradiation is performed in an inert atmosphere or a reduced-pressure atmosphere instead of an air atmosphere, whereby a native oxide film is further prevented from being formed, cracks or pitch stripes can be prevented from being formed in the semiconductor film 505 which is formed after the laser beam irradiation, planarity of the semiconductor film 505 can be improved, and the applicable energy range for the laser beam can be widened.

The laser beam preferably has its cross section shaped into a linear form with homogenous energy distribution through an optical system. Accordingly, the laser beam irradiation can be performed homogenously at high throughput. With the beam length of the laser beam longer than one side of the base substrate 503, the entire semiconductor film 504 attached to the base substrate 503 can be irradiated with the laser beam by scanning the laser beam once. When the beam length of the laser beam is shorter than one side of the base substrate 503, the beam length may be set so that the entire semiconductor film 504 attached to the base substrate 503 can be irradiated with the laser beam by scanning plural times.

In the case where the surface of the semiconductor film 504 is planarized by dry etching before the laser beam irradiation, damages such as crystal defects might be generated on and near the surface of the semiconductor film 504 owing to the dry etching. However, the aforementioned laser beam irradiation can recover even the damages caused by the dry etching.

Next, after the laser beam irradiation, the surface of the semiconductor film 505 may be etched. When the surface of the semiconductor film 505 is etched after the laser beam irradiation, the surface of the semiconductor film 504 is not necessarily etched before the laser beam irradiation. Moreover, when the surface of the semiconductor film 504 is etched before the laser beam irradiation, the surface of the semiconductor film 505 is not necessarily etched after the laser beam irradiation.

By the etching, the thickness of the semiconductor film 505 can be reduced to be optimal for a semiconductor element that is to be formed later and also the surface of the semiconductor film 505 can be planarized.

After the laser beam irradiation, the semiconductor film 505 is preferably subjected to heat treatment at greater than or equal to 500° C. and less than or equal to 650° C. This heat treatment can eliminate defects of the semiconductor film 505, which have not been repaired by the laser beam irradiation, and can relieve distortion of the semiconductor film 505, which has not been recovered by the laser beam irradiation. For this heat treatment, a rapid thermal annealing (RTA) apparatus, a resistance heating furnace, or a microwave heating apparatus can be used. As the RTA apparatus, a gas rapid thermal annealing (GRTA) apparatus or a lamp rapid thermal annealing (LRTA) apparatus can be used. For example, when a resistance heating furnace is used, heat treatment may be performed at 600° C. for 4 hours.

Figure 8A:
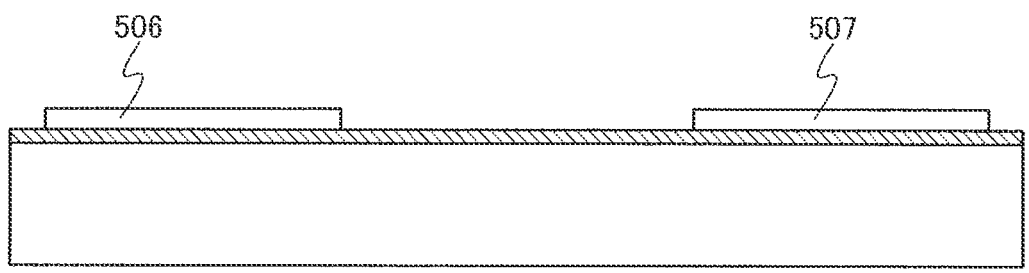
FIGS. 8A to 8D are diagrams illustrating a method for manufacturing a memory device.

Next, as illustrated in FIG. 8A, the semiconductor film 505 is partly etched to form the island-shaped semiconductor films 506 and 507. When the semiconductor films 506 and 507 are further etched, edge portions of the semiconductor films 506 and 507 where the bonding strength is not sufficient can be removed. Although the semiconductor films 506 and 507 are formed by etching the semiconductor film 505 in this embodiment, the number of semiconductor films which are formed is not limited to two.

Note that the surface of the bond substrate 500 from which the semiconductor film 504 is separated is planarized, whereby another semiconductor film 504 can be separated again from the bond substrate 500.

Specifically, the insulating film 501 which remains mainly at the edge portion of the bond substrate 500 is removed by etching or the like. In the case where the insulating film 501 is formed using silicon oxide, silicon oxynitride, or silicon nitride oxide, wet etching using hydrofluoric acid can be employed.

Next, projections formed at the edge portion of the bond substrate 500 owing to the separation of the semiconductor film 504 and the remaining embrittlement layer which contains hydrogen excessively are removed. For the etching of the bond substrate 500, wet etching is preferably used, and a tetramethylammonium hydroxide (abbreviation: TMAH) solution can be used as the etchant.

Then, the surface of the bond substrate 500 is polished. For the polishing, CMP can be used. To smooth the surface of the bond substrate 500, the surface is desirably polished by approximately 1 μm to 10 μm in thickness. After the polishing, RCA cleaning using hydrofluoric acid or the like is performed because abrasive particles and the like are left on the surface of the bond substrate 500.

By reusing the bond substrate 500, the cost of a material of the semiconductor substrate can be reduced.

In order to control threshold voltage, an impurity element imparting p-type conductivity such as boron, aluminum, or gallium or an impurity element imparting n-type conductivity such as phosphorus or arsenic may be added to the semiconductor films 506 and 507. The impurity element for controlling threshold voltage may be added to the semiconductor film before being patterned or on the semiconductor films 506 and 507 formed after the patterning. Alternatively, the impurity for controlling the threshold voltage may be added to the bond substrate. Further alternatively, the impurity element may be added to the bond substrate in order to roughly control the threshold voltage, and the impurity element may be further added to the semiconductor film before being patterned or the semiconductor films 506 and 507 which are formed after the patterning in order to finely control the threshold voltage.

Figure 8B:
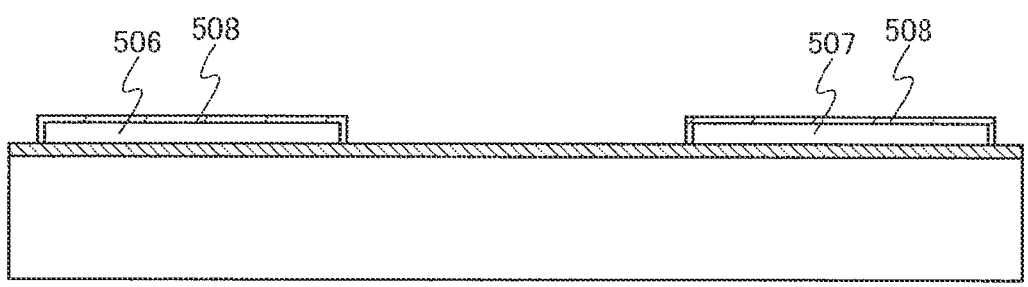

Next, gate insulating films 508 are formed to cover the semiconductor films 506 and 507, as illustrated in FIG. 8B. The gate insulating films 508 can be formed by oxidation or nitridation of surfaces of the semiconductor films 506 and 507 by high-density plasma treatment. The high-density plasma treatment is performed, for example, by using a mixed gas of an inert gas such as He, Ar, Kr, or Xe, and oxygen, nitrogen oxide, ammonia, nitrogen, hydrogen, or the like. In this case, by performing excitation of plasma with introduction of a microwave, plasma with a low electron temperature and high density can be generated. The surfaces of the semiconductor films are oxidized or nitrided by oxygen radicals (which include OH radicals in some cases) or nitrogen radicals (which include NH radicals in some cases) produced by such high-density plasma, whereby an insulating film with a thickness of 1 nm to 20 nm, desirably 5 nm to 10 nm, is formed in contact with the semiconductor films. The insulating film with a thickness of 5 nm to 10 nm is used as the gate insulating films 508. For example, dinitrogen monoxide ($N_2O$) is diluted with Ar by 1 to 3 times (flow rate) and a microwave (2.45 GHz) electric power of 3 kW to 5 kW is applied at a pressure of 10 Pa to 30 Pa to oxidize or nitride the surfaces of the semiconductor films 506 and 507. By this treatment, an insulating film with a thickness of 1 nm to 10 nm (preferably 2 nm to 6 nm) is formed. Further, dinitrogen monoxide ($N_2O$) and silane ($SiH_4$) are introduced and a microwave (2.45 GHz) electric power of 3 kW to 5 kW is applied at a pressure of 10 Pa to 30 Pa to form a silicon oxynitride film by a vapor deposition method, which is to be a gate insulating film. With a combination of a solid-phase reaction and a reaction by a vapor deposition method, the gate insulating film with low interface state density and excellent withstand voltage can be formed.

Since the oxidation or nitridation of the semiconductor films by the high-density plasma treatment proceeds by a solid-phase reaction, the interface state density between the gate insulating film 508 and each of the semiconductor films 506 and 507 can be drastically decreased. Further, since the semiconductor films 506 and 507 are directly oxidized or nitrided by the high-density plasma treatment, variation in thickness of the insulating film to be formed can be suppressed. Moreover, in the case where the semiconductor films have crystallinity, when the surfaces of the semiconductor films are oxidized with solid-phase reaction by the high-density plasma treatment, rapid oxidation only in a crystal grain boundary can be suppressed and the gate insulating film with high uniformity and low interface state density can be formed. A transistor, in which the insulating film formed by the high-density plasma treatment is included in a part of or the entire gate insulating film, can have less variation in characteristics.

Alternatively, the gate insulating films 508 may be formed by thermally oxidizing the semiconductor films 506 and 507. Further alternatively, the gate insulating films 508 may be formed by a plasma CVD method, a sputtering method, or the like as a single layer or a stack of layers using a film containing silicon oxide, silicon nitride oxide, silicon oxynitride, silicon nitride, hafnium oxide, aluminum oxide, or tantalum oxide.

Figure 8C:
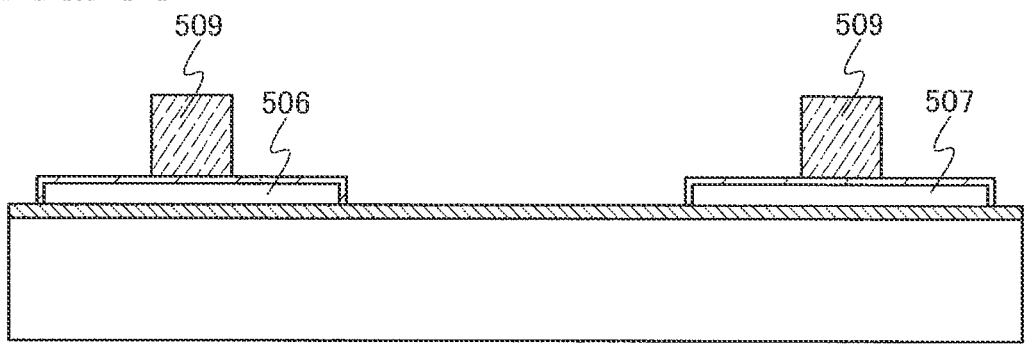

Then, as illustrated in FIG. 8C, after forming a conductive film over the gate insulating films 508, the conductive film is processed (patterned) into a predetermined shape, so that a gate electrode 509 is formed over each of the semiconductor films 506 and 507. A CVD method, a sputtering method, or the like can be used for forming the conductive film. For the conductive film, tantalum (Ta), tungsten (W), titanium (Ti), molybdenum (Mo), aluminum (Al), copper (Cu), chromium (Cr), niobium (Nb), or the like can be used. Moreover, an alloy containing the above-mentioned metal as a main component or a compound containing the above-mentioned metal may be used. Alternatively, the gate electrode 509 may be formed of a semiconductor such as polycrystalline silicon doped with an impurity element such as phosphorus which imparts conductivity to the semiconductor film.

In the case of forming a two-layer conductive film, a first layer can be formed of tantalum nitride or tantalum and a second layer can be formed of tungsten. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two-layer conductive film is formed. Alternatively, as the combination of the two-layer conductive film, silicon doped with an impurity which imparts n-type conductivity and nickel silicide, silicon doped with an impurity which imparts n-type conductivity and tungsten silicide, or the like can be used.

Note that, although the gate electrode 509 is formed of a single-layer conductive film in this embodiment, this embodiment is not limited to this structure. The gate electrode 509 may be formed of a plurality of conductive films which are stacked. In the case of using a three-layer structure in which three or more conductive films are stacked, a stack structure of a molybdenum film, an aluminum film, and a molybdenum film is preferably employed.

Note that the gate electrode 509 may be selectively formed by a droplet discharge method without using a mask.

Note that a droplet discharge method is a method by which a predetermined pattern is formed by discharging or ejecting droplets containing a predetermined composition from fine pores, and an ink jet method or the like is included in its category.

After the conductive film is formed, the gate electrode 509 can be formed by etching into a desired tapered shape by using an ICP (inductively coupled plasma) etching method and appropriately controlling the etching condition (e.g., the amount of electric power applied to a coil-shaped electrode layer, the amount of electric power applied to an electrode layer on the substrate side, or the electrode temperature on the substrate side). In addition, an angle and the like of the tapered shape may be controlled by a shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 8D:
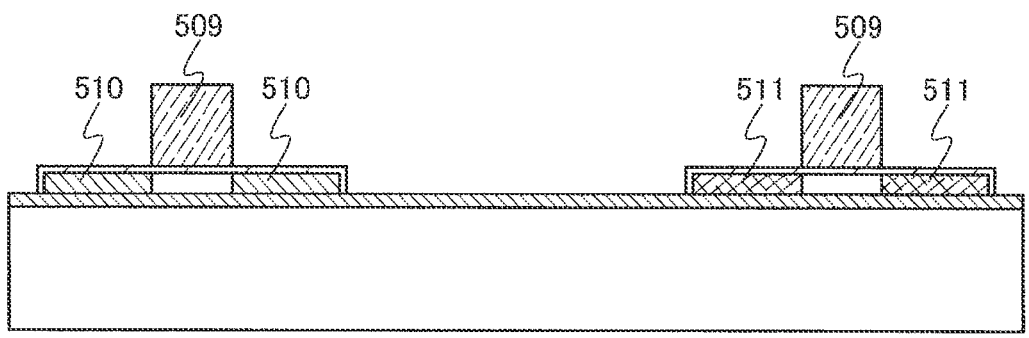

Next, as illustrated in FIG. 8D, impurity elements imparting one conductivity type are added to the semiconductor films 506 and 507 by using the gate electrodes 509 as masks. In this embodiment, an impurity element imparting n-type conductivity (e.g., phosphorus or arsenic) is added to the semiconductor film 506, and an impurity element imparting p-type conductivity (e.g., boron) is added to the semiconductor film 507. Note that when the impurity element imparting p-type conductivity is added to the semiconductor film 507, the semiconductor film 506 to which the impurity element imparting n-type conductivity is to be added is covered with a mask or the like so that the impurity element imparting p-type conductivity is added selectively. On the other hand, when the impurity element imparting n-type conductivity is added to the semiconductor film 506, the semiconductor film 507 to which the impurity element imparting p-type conductivity is to be added is covered with a mask or the like so that the impurity element imparting n-type conductivity is added selectively. Alternatively, after adding an impurity element imparting one of p-type and n-type conductivity to the semiconductor films 506 and 507, an impurity element imparting the other conductivity type may be added to only one of the semiconductor films 506 and 507 selectively at higher concentration than the previously added impurity. By the addition of the impurity elements, impurity regions 510 are formed in the semiconductor film 506, and impurity regions 511 are formed in the semiconductor film 507.

Figure 9A:
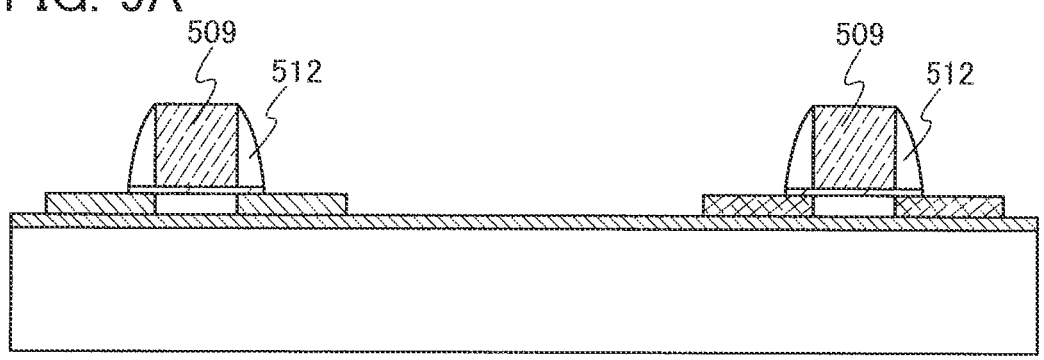
FIGS. 9A and 9B are diagrams illustrating a method for manufacturing a memory device.

Next, as illustrated in FIG. 9A, sidewalls 512 are formed on side surfaces of the gate electrodes 509. For example, the sidewalls 512 can be formed in such a manner that an insulating film is newly formed so as to cover the gate insulating films 508 and the gate electrodes 509, and the insulating film is partly etched by anisotropic etching in which etching is performed mainly in a perpendicular direction. By the anisotropic etching, the newly formed insulating film is partly etched to form the sidewalls 512 on the side surfaces of the gate electrodes 509. Note that the gate insulating films 508 may be partly etched by the anisotropic etching. The insulating film for forming the sidewalls 512 may be a single layer or a stack of layers using one or more of a silicon film, a silicon oxide film, a silicon oxynitride film, a silicon nitride oxide film, and a film containing an organic material such as an organic resin formed by an LPCVD method, a plasma CVD method, a sputtering method, or the like. In this embodiment, a 100-nm-thick silicon oxide film is formed by a plasma CVD method. As the etching gas, a mixed gas of $CHF_3$ and helium can be used. Note that the process for forming the sidewalls 512 is not limited to this process.

Figure 9B:
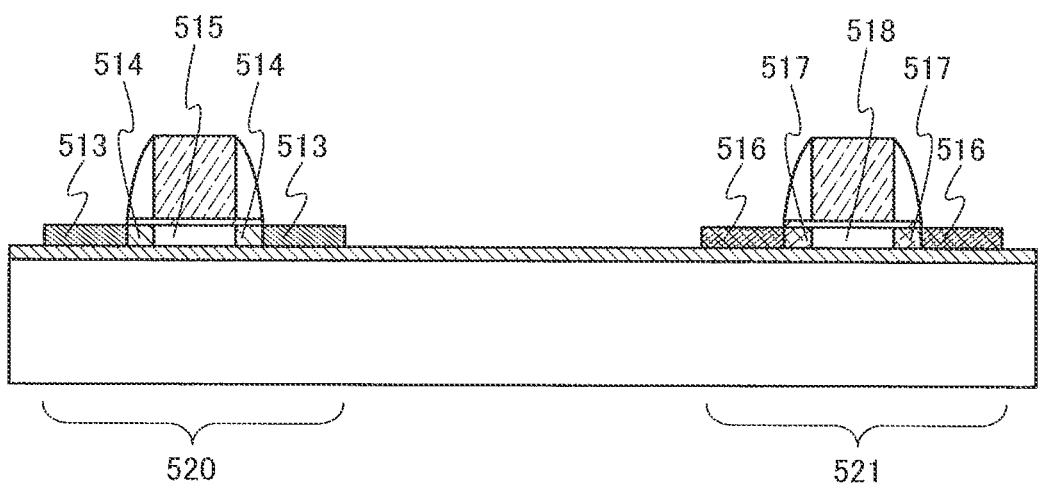

Next, as illustrated in FIG. 9B, impurity elements imparting one conductivity type are added to the semiconductor films 506 and 507 with the gate electrodes 509 and the sidewalls 512 used as masks. Note that the impurity elements imparting the same conductivity type as the impurity elements which have been added in the previous step are added to the semiconductor films 506 and 507 at a higher concentration than in the previous step. Note that when the impurity element imparting p-type conductivity is added to the semiconductor film 507, the semiconductor film 506 to which the impurity element imparting n-type conductivity is to be added is covered with a mask or the like so that the impurity element imparting p-type conductivity is added selectively. On the other hand, when the impurity element imparting n-type conductivity is added to the semiconductor film 506, the semiconductor film 507 to which the impurity element imparting p-type conductivity is to be added is covered with a mask or the like so that the impurity element imparting n-type conductivity is added selectively.

By the above-described addition of the impurity elements, a pair of high-concentration impurity regions 513, a pair of low-concentration impurity regions 514, and a channel formation region 515 are formed in the semiconductor film 506. Moreover, by the addition of the impurity elements, a pair of high-concentration impurity regions 516, a pair of low-concentration impurity regions 517, and a channel formation region 518 are formed in the semiconductor film 507. The high-concentration impurity regions 513 and 516 serve as a source region or a drain region, and the low-concentration impurity regions 514 and 517 serve as LDD (lightly doped drain) regions. Note that the LDD regions are not necessarily provided, and only impurity regions that serve as source and drain regions may be formed. Alternatively, the LDD region may be formed on either the source region side or the drain region side.

Note that in the case of a transistor including silicon, a source region and a drain region respectively serve as a source electrode and a drain electrode.

Note that the sidewalls 512 formed over the semiconductor film 507 and the sidewalls 512 formed over the semiconductor film 506 may be formed to have the same width or different widths in the carrier flow direction. It is preferable that the width of each sidewall 512 over the semiconductor film 507 which constitutes a part of a p-channel transistor be larger than the width of each sidewall 512 over the semiconductor film 506 which constitutes a part of an n-channel transistor. This is because boron which is added for forming a source region and a drain region in the p-channel transistor is easily diffused and a short channel effect is easily induced. When the width of each sidewall 512 in the p-channel transistor is made larger than that of each sidewall 512 in the n-channel transistor, boron can be added to the source region and the drain region at high concentration, and thus the resistance of the source region and the drain region can be reduced.

Next, in order to further reduce the resistance of the source region and the drain region, silicide is formed in the semiconductor films 506 and 507, so that silicide layers may be formed. The silicide is formed in such a manner that a metal is brought into contact with the semiconductor films, and silicon in the semiconductor films is made to react with the metal by heat treatment, a GRTA method, an LRTA method, or the like. The silicide layer may be formed of cobalt silicide or nickel silicide. In the case where the semiconductor films 506 and 507 are thin, silicide reaction may proceed to bottoms of the semiconductor films 506 and 507 in this region. As a metal material used for the formation of the silicide, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Alternatively, the silicide may be formed by laser irradiation or light irradiation using a lamp or the like.

Through the above-described series of steps, an n-channel transistor 520 and a p-channel transistor 521 are formed.

After the step illustrated in FIG. 9B is completed, a transistor including an oxide semiconductor is manufactured over the n-channel transistor 520 and the p-channel transistor 521.

First, as illustrated in FIG. 10A, an insulating film 530 is formed to cover the re-channel transistor 520 and the p-channel transistor 521. By providing the insulating film 530, oxidation of surfaces of the gate electrodes 509 can be prevented when heat treatment is performed. Specifically, it is preferable to use silicon nitride, silicon nitride oxide, silicon oxynitride, aluminum nitride, aluminum oxide, silicon oxide, or the like for the insulating film 530. In this embodiment, a silicon oxynitride film having a thickness of approximately 50 nm is used as the insulating film 530.

Next, as illustrated in FIG. 10A, an insulating film 531 and an insulating film 532 are formed over the insulating film 530 to cover the n-channel transistor 520 and the p-channel transistor 521. The insulating films 531 and 532 are formed using materials which can withstand a temperature of heat treatment in a later manufacturing step. Specifically, an inorganic insulating film of silicon oxide, silicon nitride, silicon nitride oxide, silicon oxynitride, aluminum nitride, aluminum nitride oxide, or the like can be used for the insulating films 531 and 532.

Note that the insulating films 531 and 532 are stacked over the insulating film 530 in this embodiment; however, the insulating film formed over the insulating film 530 may be an insulating film of a single layer or an insulating layer in which three or more layers are stacked.

A surface of the insulating film 532 may be planarized by CMP or the like.

Next, as illustrated in FIG. 10B, a gate electrode 601 and an electrode 602 are formed over the insulating film 532.

The gate electrode 601 and the electrode 602 can be formed with a single layer or a stacked layer using a conductive film of a metal material such as molybdenum, titanium, chromium, tantalum, tungsten, neodymium, or scandium, or an alloy material which contains any of these metal materials as a main component, or a nitride of any of these metals. Note that aluminum or copper can also be used as such metal materials if aluminum or copper can withstand a temperature of heat treatment performed in a later step. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, as a two-layer structure of the gate electrode 601 and the electrode 602, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the gate electrode 601 and the electrode 602, the following structure is preferable: a stacked structure including an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, a light-transmitting oxide conductive film of indium oxide, indium tin oxide, an indium oxide-zinc oxide alloy, zinc oxide, zinc aluminum oxide, zinc aluminum oxynitride, zinc gallium oxide, or the like may be used as the gate electrode 601 and the electrode 602.

The thicknesses of the gate electrode 601 and the electrode 602 are 10 nm to 400 nm, preferably 100 nm to 200 nm. In this embodiment, a conductive film for the gate electrode is formed to a thickness of 150 nm by a sputtering method using a tungsten target, and then the conductive film is processed (patterned) into a desired shape by etching; thus, the gate electrode 601 and the electrode 602 are formed. Note that end portions of the formed gate electrode are preferably tapered, in which case coverage with a gate insulating film stacked thereover is improved. Note that a resist mask may be formed by an inkjet method. Formation of the resist mask by an inkjet method needs no photomask; thus, manufacturing cost can be reduced.

Next, as illustrated in FIG. 10C, a gate insulating film 603 is formed over the gate electrode 601 and the electrode 602. The gate insulating film 603 can be formed to have a single-layer or stacked-layer structure using one or more of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film by a plasma CVD method, a sputtering method, or the like. It is preferable that the gate insulating film 603 contain impurities such as moisture or hydrogen as little as possible. In the case of forming a silicon oxide film by a sputtering method, a silicon target or a quartz target is used as a target, and oxygen or a mixed gas of oxygen and argon is used as a sputtering gas.

An oxide semiconductor that is made to be i-type or substantially i-type (an oxide semiconductor that is highly purified) by removal of impurities is extremely sensitive to an interface state and an interface electric charge; thus, characteristics of an interface between the highly-purified oxide semiconductor and the gate insulating film 603 are important. Therefore, the gate insulating film (GI) that is in contact with the highly-purified oxide semiconductor needs to have higher quality.

For example, high-density plasma CVD using microwaves (a frequency of 2.45 GHz) is preferable because a dense high-quality insulating film having high withstand voltage can be formed. When the highly purified oxide semiconductor and the high-quality gate insulating film are in close contact with each other, the interface state can be reduced and interface characteristics can be improved.

Needless to say, a different deposition method such as a sputtering method or a plasma CVD method can be used as long as a high-quality insulating film can be formed as the gate insulating film. Alternatively, an insulating film whose film quality as a gate insulating film and interface characteristics with the oxide semiconductor are improved by heat treatment performed after formation may be used. In any case, any insulating film can be used as long as film quality as a gate insulating film is high, interface state density between the gate insulating film and an oxide semiconductor is decreased, and a favorable interface can be formed.

The gate insulating film 603 may have a structure in which an insulating film formed using a material having a high barrier property and an insulating film having a lower proportion of nitrogen such as a silicon oxide film or a silicon oxynitride film are stacked. In that case, the insulating film such as a silicon oxide film or a silicon oxynitride film is formed between the insulating film having a high barrier property and the oxide semiconductor film. As the insulating film having a high barrier property, a silicon nitride film, a silicon nitride oxide film, an aluminum nitride film, an aluminum nitride oxide film, or the like can be given, for example. The insulating film having a high barrier property is used, so that impurities in an atmosphere, such as moisture or hydrogen, or impurities in the substrate, such as an alkali metal or a heavy metal, can be prevented from entering the oxide semiconductor film, the gate insulating film 603, or the interface between the oxide semiconductor film and another insulating film and the vicinity thereof. In addition, the insulating film having a lower proportion of nitrogen such as a silicon oxide film or a silicon oxynitride film is formed so as to be in contact with the oxide semiconductor film, so that the insulating film having a high barrier property can be prevented from being in direct contact with the oxide semiconductor film.

For example, a stacked-layer film with a thickness of 100 nm may be formed as the gate insulating film 603 as follows: a silicon nitride film ($SiN_y$ ($y>0$)) with a thickness of greater than or equal to 50 nm and less than or equal to 200 nm is formed by a sputtering method as a first gate insulating film, and a silicon oxide film ($SiO_x$ ($x>0$)) with a thickness of greater than or equal to 5 nm and less than or equal to 300 nm is stacked over the first gate insulating film as a second gate insulating film. The thickness of the gate insulating film 603 may be set as appropriate depending on the desired characteristics of the transistor. The thickness may be approximately 350 nm to 400 nm.

In this embodiment, the gate insulating film 603 is formed to have a structure in which a 100-nm-thick silicon oxide film formed by a sputtering method is stacked over a 50-nm-thick silicon nitride film formed by a sputtering method.

Note that in order that hydrogen, hydroxyl group, and moisture are contained as little as possible in the gate insulating film 603, it is preferable that the base substrate 503 over which the gate electrode 601 and the electrode 602 are formed be preheated in a preheating chamber of a sputtering apparatus, so that impurities such as moisture or hydrogen adsorbed to the base substrate 503 are eliminated and removed, as pretreatment before film formation. The temperature for the preheating is greater than or equal to 100° C. and less than or equal to 400° C., preferably greater than or equal to 150° C. and less than or equal to 300° C. As an evacuation unit provided in the preheating chamber, a cryopump is preferable. Note that this preheating treatment can be omitted.

Next, over the gate insulating film 603, an oxide semiconductor film having a thickness of greater than or equal to 2 nm and less than or equal to 200 nm, preferably greater than or equal to 3 nm and less than or equal to 50 nm, more preferably greater than or equal to 3 nm and less than or equal to 20 nm is formed. The oxide semiconductor film is formed by a sputtering method using an oxide semiconductor as a target. Moreover, the oxide semiconductor film can be formed by a sputtering method under a rare gas (for example, argon) atmosphere, an oxygen atmosphere, or a mixed atmosphere containing a rare gas (for example, argon) and oxygen.

Note that before the oxide semiconductor film is formed by a sputtering method, dust attached to a surface of the gate insulating film 603 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

The above oxide semiconductor can be used for the oxide semiconductor film.

In this embodiment, as the oxide semiconductor film, an In—Ga—Zn—O-based non-single-crystal film with a thickness of 30 nm, which is obtained by a sputtering method using a metal oxide target containing indium (In), gallium (Ga), and zinc (Zn), is used. As the target, for example, a metal oxide target having a composition ratio of metals, In:Ga:Zn=1:1:0.5, In:Ga:Zn=1:1:1, or In:Ga:Zn=1:1:2 can be used. The target may contain $SiO_2$ at greater than or equal to 2 wt % and less than or equal to 10 wt %. The filling rate of the metal oxide target containing In, Ga, and Zn is greater than or equal to 90% and less than or equal to 100%, preferably greater than or equal to 95% and less than or equal to 99.9%. With use of a metal oxide target with high filling rate, the deposited oxide semiconductor film has high density.

In this embodiment, the oxide semiconductor film is formed over the base substrate 503 as follows: the substrate is held in a treatment chamber with a pressure reduced, moisture remaining in the treatment chamber is removed, a sputtering gas from which hydrogen and moisture are removed is introduced, and the above-described target is used. At that time, the substrate may be heated at greater than or equal to 100° C. and less than or equal to 600° C., preferably greater than or equal to 200° C. and less than or equal to 400° C. By forming the oxide semiconductor film in a state where the substrate is heated, the concentration of impurities contained in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom such as water ($H_2O$) (more preferably, also a compound containing a carbon atom), and the like are removed, whereby the impurity concentration in the oxide semiconductor film formed in the treatment chamber can be reduced.

As one example of the deposition condition, the distance between the substrate and the target is 100 mm, the pressure is 0.6 Pa, electric power of the direct-current (DC) power source is 0.5 kW, and the atmosphere is an oxygen atmosphere (the proportion of the oxygen flow rate is 100%). Note that a pulsed direct-current (DC) power source is preferable because dust called particles generated in film formation can be reduced and the film thickness can be uniform.

Note that in order that hydrogen, hydroxyl group, and moisture are contained as little as possible in the oxide semiconductor film, it is preferable that the base substrate 503 over which layers up to and including the gate insulating film 603 are formed be preheated in a preheating chamber of the sputtering apparatus, so that impurities such as hydrogen or moisture adsorbed to the base substrate 503 are eliminated and removed, as pretreatment before film formation. The temperature for the preheating is greater than or equal to 100° C. and less than or equal to 400° C., preferably greater than or equal to 150° C. and less than or equal to 300° C. As an evacuation unit provided in the preheating chamber, a cryopump is preferable. Note that this preheating treatment can be omitted. Further, this preheating may be similarly performed on the base substrate 503 over which layers up to and including a source electrode 607, a drain electrode 608, and wirings 609 to 611 are formed, before the formation of an insulating film 612.

Next, as illustrated in FIG. 10C, the oxide semiconductor film is processed (patterned) into a desired shape by etching or the like, whereby an island-shaped oxide semiconductor film 605 is formed over the gate insulating film 603 such that the island-shaped oxide semiconductor film 605 overlaps with the gate electrode 601.

A resist mask for forming the island-shaped oxide semiconductor film 605 may be formed by an inkjet method. Formation of the resist mask by an inkjet method needs no photomask; thus, manufacturing cost can be reduced.

Note that the etching for forming the island-shaped oxide semiconductor film 605 may be dry etching, wet etching, or both dry etching and wet etching. As the etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As a dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like can be used. Alternatively, ITO-07N (produced by KANTO CHEMICAL CO., INC.) may be used. The etchant after the wet etching is removed together with the material etched off by cleaning. The waste liquid including the etchant and the material etched off may be purified and the material may be reused. When a material such as indium contained in the oxide semiconductor film is collected from the waste liquid after the etching and reused, the resources can be efficiently used and the cost can be reduced.

Note that it is preferable that reverse sputtering be performed before the formation of a conductive film in a subsequent step so that a resist residue or the like attached to surfaces of the island-shaped oxide semiconductor film 605 and the gate insulating film 603 is removed.

Next, the island-shaped oxide semiconductor film 605 is subjected to heat treatment under a reduced-pressure atmosphere, an inert gas atmosphere such as a nitrogen atmosphere or a rare gas atmosphere, an oxygen atmosphere, or an ultra dry air atmosphere (in air whose moisture content is less than or equal to 20 ppm (−55° C. by conversion into a dew point), preferably less than or equal to 1 ppm, more preferably less than or equal to 10 ppb, in the case where measurement is performed using a dew-point meter of a cavity ring-down laser spectroscopy (CRDS) system). By performing the heat treatment on the island-shaped oxide semiconductor film 605, moisture or hydrogen in the island-shaped oxide semiconductor film 605 can be eliminated. Specifically, the heat treatment may be performed at greater than or equal to 300° C. and less than or equal to 850° C. (or a temperature of less than or equal to the strain point of a glass substrate), preferably greater than or equal to 550° C. and less than or equal to 750° C. For example, heat treatment may be performed at 600° C. for greater than or equal to 3 minutes and less than or equal to 6 minutes. With an RTA method for the heat treatment, dehydration or dehydrogenation can be performed in a short time; therefore, treatment can be performed even at a temperature higher than the strain point of a glass substrate. Alternatively, the heat treatment may be performed in the state where the substrate temperature is 450° C. for approximately 1 hour.

In this embodiment, the island-shaped oxide semiconductor film 605 is subjected to the heat treatment in a nitrogen atmosphere with the use of an electric furnace which is one example of a heat treatment apparatus.

Note that a heat treatment apparatus is not limited to an electric furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the heat treatment, GRTA in which the substrate is moved into an inert gas heated at a high temperature of 650° C. to 700° C., heated for several minutes, and moved out of the inert gas heated to the high temperature may be performed. With GRTA, high-temperature heat treatment for a short period of time can be achieved.

Note that in the heat treatment, it is preferable that moisture, hydrogen, or the like be not contained in nitrogen or a rare gas such as helium, neon, or argon. It is preferable that the purity of nitrogen or the rare gas such as helium, neon, or argon which is introduced into a heat treatment apparatus be set to greater than or equal to 6N (99.9999%), preferably greater than or equal to 7N (99.99999%) (that is, the impurity concentration is less than or equal to 1 ppm, preferably less than or equal to 0.1 ppm).

When impurities such as moisture or hydrogen are added to the oxide semiconductor, in a gate bias-temperature stress test (BT test, the test condition is, for example, at 85° C. with $2\times10^6$ V/cm for 12 hours), a bond between the impurities and a main component of the oxide semiconductor is broken by a high electrical field (B: bias) and high temperature (T: temperature), and a dangling bond generated causes a shift of the threshold voltage (Vth). However, in the above-described manner, by improving the interface characteristics between the gate insulating film and the oxide semiconductor film and removing impurities, particularly hydrogen, moisture, or the like, in the oxide semiconductor film as much as possible, a transistor which is stable even to the BT test can be obtained.

Through the above-described steps, the concentration of hydrogen in the island-shaped oxide semiconductor film 605 can be reduced and the island-shaped oxide semiconductor film 605 can be highly purified. Thus, the oxide semiconductor film can be stabilized. In addition, heat treatment at a temperature of less than or equal to the glass transition temperature makes it possible to form an oxide semiconductor film with a wide band gap in which carrier density is extremely low. Therefore, a transistor can be manufactured using a large-sized substrate, so that mass productivity can be increased. In addition, by using the oxide semiconductor film in which the hydrogen concentration is reduced and purity is improved, it is possible to manufacture a transistor with high withstand voltage, a reduced short-channel effect, and a high on-off ratio. The above heat treatment can be performed at any time as long as it is performed after the oxide semiconductor film is formed.

Note that in the case where the oxide semiconductor film is heated, although depending on a material of the oxide semiconductor film or heating conditions, plate-shaped crystals are formed at the surface of the oxide semiconductor film in some cases. The plate-shaped crystals preferably form a single crystal body in which crystals are c-axis-oriented in a direction generally perpendicular to the surface of the oxide semiconductor film. Even when the plate-shaped crystals do not form a single crystal body, the plate-shaped crystals preferably form a polycrystal body in which each crystal is c-axis-oriented in a direction generally perpendicular to the surface of the oxide semiconductor film. In the above-described polycrystal body, in addition to the c-axis orientation, the crystals preferably have identical a-b planes, a-axes, or b-axes. Note that in the case where a surface of a base of the oxide semiconductor film is uneven, the plate-shaped crystals form a polycrystal body. Therefore, it is preferable that the surface of the base be as planar as possible.

Next, the insulating film 530, the insulating film 531, the insulating film 532, and the gate insulating film 603 are partly etched, so that contact holes reaching the high-concentration impurity regions 513 included in the n-channel transistor 520, contact holes reaching the high-concentration impurity regions 516 included in the p-channel transistor 521, and a contact hole reaching the electrode 602 are formed. Then, a conductive film used for the source electrode or the drain electrode (including a wiring formed in the same layer as the source electrode or the drain electrode) is formed over the island-shaped oxide semiconductor film 605 by a sputtering method or a vacuum evaporation method, and then the conductive film is patterned by etching or the like, whereby as illustrated in FIG. 11A, the source electrode 607 and the drain electrode 608 over the island-shaped oxide semiconductor film 605, a wiring 609 in contact with the electrode 602 and the high-concentration impurity region 513, a wiring 610 in contact with the high-concentration impurity region 516, and a wiring 611 in contact with the high-concentration impurity region 513 and the high-concentration impurity region 516 are formed.

As a material of the conductive film to be the source electrode and the drain electrode (including the wiring formed in the same layer as the source electrode and the drain electrode), there are an element selected from Al, Cr, Cu, Ta, Ti, Mo, and W; an alloy containing any of the above elements as a component; an alloy film containing a combination of any of these elements; and the like. Alternatively, a structure may be employed in which a film of a refractory metal such as Cr, Ta, Ti, Mo, or W is stacked over either the lower side or the upper side of a metal film of Al, Cu, or the like. Still alternatively, when an Al material to which an element which prevents generation of hillocks or whisker in an Al film, such as Si, Ti, Ta, W, Mo, Cr, Nd, Sc, or Y is added is used, heat resistance can be increased.

Further, the conductive film may have a single-layer structure or a stack structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given.

Alternatively, the conductive film to be the source electrode and the drain electrode (including the wiring formed in the same layer as the source electrode and the drain electrode) may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

In the case where heat treatment is performed after formation of the conductive film, the conductive film preferably has heat resistance enough to withstand the heat treatment.

Note that materials and etching conditions are adjusted as appropriate so that the island-shaped oxide semiconductor film 605 is not removed in etching of the conductive film as much as possible. Depending on the etching conditions, an exposed portion of the island-shaped oxide semiconductor film 605 is partly etched, so that a groove (a recessed portion) is formed in some cases.

In this embodiment, since a titanium film is used as the conductive film, wet etching can be selectively performed on the conductive film with the use of an ammonia peroxide solution (hydrogen peroxide solution at 31 wt %: ammonia water at 28 wt %: water=5:2:2), in which case part of the island-shaped oxide semiconductor film 605 is also etched in some cases. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask through which light is transmitted so as to have multi-level intensity. A resist mask formed with the use of a multi-tone mask has a plurality of thicknesses and can be further changed in shape by etching; therefore, the resist mask can be used in a plurality of etching steps for processing into different patterns. Therefore, a resist mask corresponding to at least two or more kinds of different patterns can be formed by one multi-tone mask. Thus, the number of light-exposure masks can be reduced and the number of corresponding photolithography steps can be also reduced, whereby simplification of a process can be realized.

Next, plasma treatment is performed using a gas such as $N_2O$, $N_2$, or Ar. By the plasma treatment, water or the like adsorbed to the exposed surface of the oxide semiconductor film is removed. Plasma treatment may be performed using a mixed gas of oxygen and argon.

After the plasma treatment, as illustrated in FIG. 11B, the insulating film 612 is formed so as to cover the source electrode 607, the drain electrode 608, the wirings 609 to 611, and the island-shaped oxide semiconductor film 605. The insulating film 612 preferably contains impurities such as moisture or hydrogen as little as possible, and the insulating film 612 may be formed using a single-layer insulating film or a plurality of insulating films stacked. When hydrogen is contained in the insulating film 612, entry of the hydrogen to the oxide semiconductor film, or extraction of oxygen in the oxide semiconductor film by hydrogen may occur, thereby causing a backchannel portion of the oxide semiconductor film to have lower resistance (to be n-type), so that a parasitic channel may be formed. Therefore, it is important that the insulating film 612 be formed by a film formation method in which hydrogen is not used, so that the insulating film 612 is formed so as to contain as little hydrogen as possible. A material having a high barrier property is preferably used for the insulating film 612. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having a lower proportion of nitrogen such as a silicon oxide film or a silicon oxynitride film is formed on the side closer to the island-shaped oxide semiconductor film 605 than the insulating film having a high barrier property. Then, the insulating film having a high barrier property is formed so as to overlap with the source electrode 607, the drain electrode 608, and the island-shaped oxide semiconductor film 605 with the insulating film having a lower proportion of nitrogen between the insulating film having a high barrier property and the source electrode 607, the drain electrode 608, and the island-shaped oxide semiconductor film 605. When the insulating film having a high barrier property is used, impurities such as moisture or hydrogen can be prevented from entering the island-shaped oxide semiconductor film 605, the gate insulating film 603, or the interface between the island-shaped oxide semiconductor film 605 and another insulating film and the vicinity thereof. In addition, the insulating film having a lower proportion of nitrogen such as a silicon oxide film or a silicon oxynitride film is formed so as to be in contact with the island-shaped oxide semiconductor film 605, so that the insulating film formed using a material having a high barrier property can be prevented from being in direct contact with the island-shaped oxide semiconductor film 605.

In this embodiment, the insulating film 612 having a structure in which a silicon nitride film having a thickness of 100 nm formed by a sputtering method is stacked over a silicon oxide film having a thickness of 200 nm formed by a sputtering method is formed. The substrate temperature in film formation may be greater than or equal to room temperature and less than or equal to 300° C., and is 100° C. in this embodiment.

Note that after the insulating film 612 is formed, heat treatment may be performed. The heat treatment is preferably performed in a reduced pressure atmosphere, an inert gas atmosphere such as a nitrogen atmosphere or a rare gas atmosphere, an oxygen gas atmosphere, or an ultra dry air atmosphere (in air in which moisture amount is less than or equal to 20 ppm (−55° C. by conversion into a dew point), preferably less than or equal to 1 ppm, more preferably less than or equal to 10 ppb, in the case where measurement is performed using a dew-point meter of a cavity ring-down laser spectroscopy (CRDS) system) at greater than or equal to 200° C. and less than or equal to 400° C., for example, grater than or equal to 250° C. and less than or equal to 350° C. In this embodiment, for example, heat treatment for 1 hour at 250° C. in a nitrogen atmosphere is performed. In addition, RTA treatment for a short time at a high temperature may be performed before the formation of the source electrode 607, the drain electrode 608, and the wirings 609 to 611 in a manner similar to the heat treatment performed on the oxide semiconductor film. Even when oxygen deficiency is generated in the island-shaped oxide semiconductor film 605 owing to the pervious heat treatment on the oxide semiconductor film, by performing heat treatment after the insulating film 612 containing oxygen is formed in contact with the exposed region of the island-shaped oxide semiconductor film 605 provided between the source electrode 607 and the drain electrode 608, oxygen is supplied to the island-shaped oxide semiconductor film 605. By supplying oxygen to the region of the island-shaped oxide semiconductor film 605 in contact with the insulating film 612, oxygen deficiency that serves as a donor is reduced and the stoichiometric composition ratio can be satisfied. As a result, the island-shaped oxide semiconductor film 605 can be made to be an i-type oxide semiconductor film or a substantially i-type oxide semiconductor film. Accordingly, electric characteristics of the transistor can be improved and variation in the electric characteristics thereof can be reduced. The timing of this heat treatment is not particularly limited as long as it is after the formation of the insulating film 612, and this heat treatment can be performed without increasing the number of manufacturing steps by doubling as another step such as heat treatment for formation of a resin film or heat treatment for reduction of the resistance of a transparent conductive film, and the island-shaped oxide semiconductor film 605 can be made to be an i-type oxide semiconductor film or a substantially i-type oxide semiconductor film.

Next, after a conductive film is formed over the insulating film 612, a back gate electrode may be formed so as to overlap with the island-shaped oxide semiconductor film 605 by patterning the conductive film. When the back gate electrode is formed, an insulating film is formed so as to cover the back gate electrode. The back gate electrode can be formed using a material and a structure similar to those of the gate electrode 601, the electrode 602, the source electrode 607, the drain electrode 608, the wiring 609, the wiring 610, or the wiring 611.

The thickness of the back gate electrode is set to be 10 nm to 400 nm, preferably 100 nm to 200 nm. In this embodiment, the back gate electrode may be formed in such a manner that a conductive film in which a titanium film, an aluminum film, and a titanium film are stacked is formed, a resist mask is formed by a photolithography method or the like, and unnecessary portions are removed by etching so that the conductive film is processed (patterned) into a desired shape.

The insulating film is preferably formed using a material having a high barrier property which can prevent moisture, hydrogen, and the like in an atmosphere from influencing characteristics of the transistor. For example, the insulating film having a high barrier property can be formed to have a single-layer structure or a stack structure using one or more of a silicon nitride film, a silicon nitride oxide film, an aluminum nitride film, an aluminum nitride oxide film, and the like by a plasma CVD method, a sputtering method, or the like. In order to obtain an effect of a barrier property, the insulating film is preferably formed to a thickness of 15 nm to 400 nm, for example.

In this embodiment, an insulating film is formed to a thickness of 300 nm by a plasma CVD method. The insulating film is formed under the following conditions: the flow rate of a silane gas is 4 sccm, the flow rate of dinitrogen monoxide ($N_2O$) is 800 sccm, and the substrate temperature is 400° C.

Through the above-described steps, a transistor 620 that functions as a switching element, the n-channel transistor 520 and the p-channel transistor 521 that form a phase-inversion element, and a capacitor 623 are formed. Note that the capacitor 623 is formed in a region where the electrode 602 and the source electrode 607 overlap with each other with the gate insulating film 603 interposed therebetween. Note also that the capacitor 623 is not necessarily formed over the same layer as the transistor 620; for example, the capacitor 623 may be formed over the same layer as the n-channel transistor 520 and the p-channel transistor 521.

The transistor 620 includes the gate electrode 601, the gate insulating film 603 over the gate electrode 601, the island-shaped oxide semiconductor film 605 which is over the gate insulating film 603 and overlaps with the gate electrode 601, and a pair of the source electrode 607 and the drain electrode 608 formed over the island-shaped oxide semiconductor film 605. The transistor 620 may further include the insulating film 612 provided over the island-shaped oxide semiconductor film 605 as its component. Note that the transistor 620 illustrated in FIG. 11B has a channel-etched structure in which part of the island-shaped oxide semiconductor film 605 is exposed between the source electrode 607 and the drain electrode 608.

Although description is given using a single-gate transistor as the transistor 620, a multi-gate transistor including a plurality of channel formation regions by including a plurality of the gate electrodes 601 that are electrically connected to each other may be formed as needed.

Note that the band gap of the oxide semiconductor is 3.0 eV to 3.5 eV. Meanwhile, the band gap of silicon carbide and the band gap of gallium nitride are 3.26 eV and 3.39 eV, respectively, which are about three times as large as that of silicon. Therefore, these compound semiconductors such as silicon carbide and gallium nitride are similar to the oxide semiconductor in that they are both wide band gap semiconductors. The characteristics of the wide band gap are advantageous for improving the withstand voltage of a signal processing circuit, reducing loss of electric power, and the like.

However, compound semiconductors such as silicon carbide and gallium nitride are required to be single crystal, and it is difficult to meet the manufacturing condition to obtain a single crystal material; for example, crystal growth at a temperature extremely higher than a process temperature of the oxide semiconductor is needed or epitaxial growth over a special substrate is needed. Such a condition does not allow film formation of any of these compound semiconductors over a silicon wafer that can be obtained easily or a glass substrate whose allowable temperature limit is low. Therefore, an inexpensive substrate cannot be used, and further, the substrate cannot be increased in size, so that the productivity of signal processing circuits using the compound semiconductor such as silicon carbide or gallium nitride is low. In contrast, the oxide semiconductor can be deposited in heat treatment at 300° C. to 850° C., that is, can be deposited over a glass substrate. In addition, as described in this embodiment, it is possible to form a semiconductor element using an oxide semiconductor over an integrated circuit using a normal semiconductor material.

Next, it will be described below how characteristics of the transistor are influenced by high purification of the oxide semiconductor film by removal of impurities such as moisture or hydrogen contained in the oxide semiconductor film as much as possible as in this embodiment.

Figure 19:
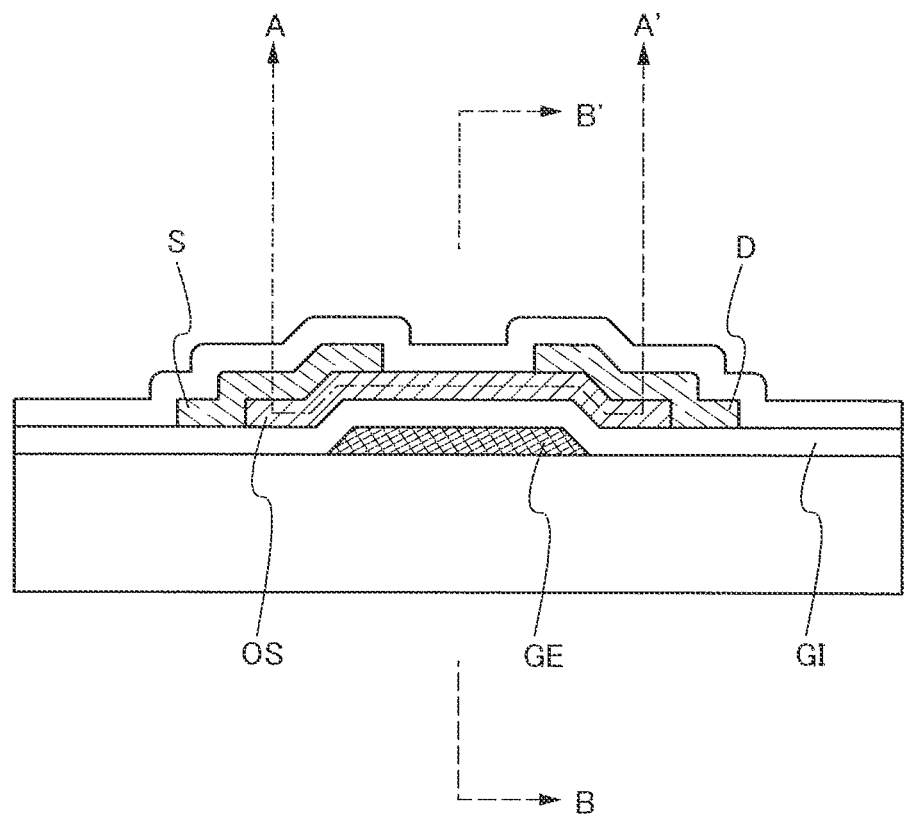
FIG. 19 is a cross-sectional view of a transistor in which an oxide semiconductor is used.

FIG. 19 is a cross-sectional view of a transistor including an oxide semiconductor. An oxide semiconductor film (OS) is provided over a gate electrode (GE) with a gate insulating film (GI) therebetween, and a source electrode (S) and a drain electrode (D) are provided thereover. An insulating film is formed over the source electrode (S) and the drain electrode (D).

Figure 20:
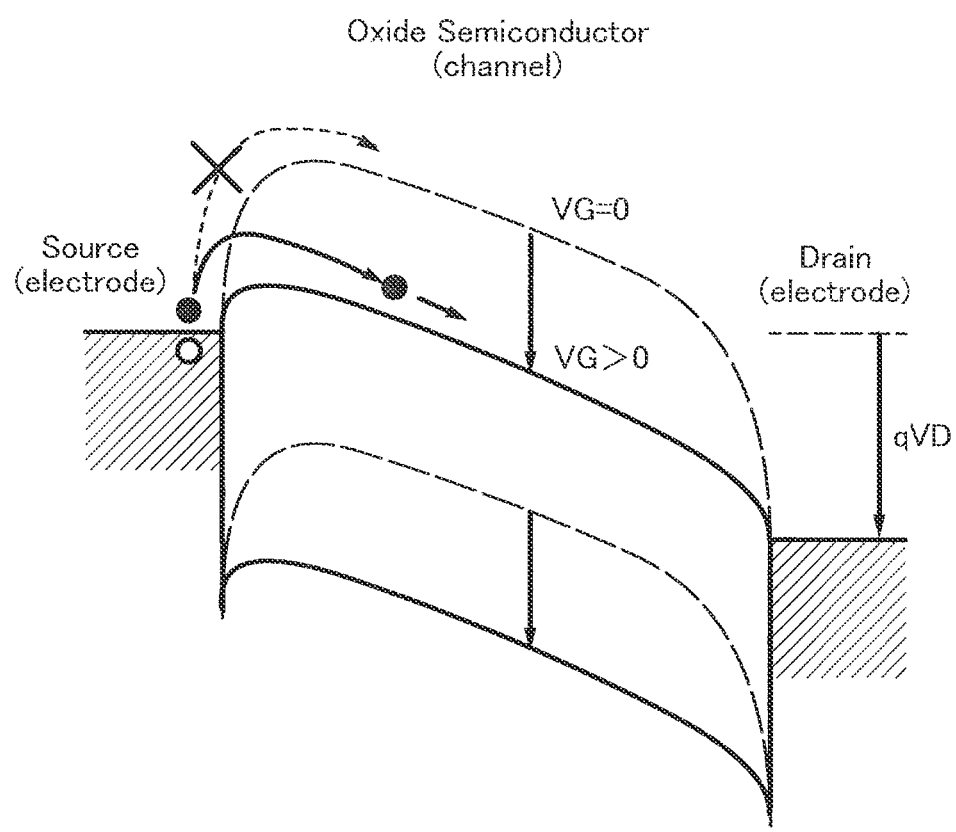
FIG. 20 is an energy band diagram (schematic diagram) along A-A' section illustrated in FIG. 19.

FIG. 20 is an energy band diagram (a schematic diagram) along A-A' section illustrated in FIG. 19. In FIG. 20, a black circle (●) and a white circle (○) represent an electron and a hole and have electric charges (−q, +q), respectively. The case where a positive voltage ($V_D$>0) is applied to the drain electrode (D) and no voltage ($V_G$=0) is applied to the gate electrode (GE) is shown by dashed lines, and the case where a positive voltage ($V_D$>0) is applied to the drain electrode (D) and a positive voltage ($V_G$>0) is applied to the gate electrode (GE) is shown by solid lines. In the case where voltage is not applied to the gate electrode (GE), a carrier (an electron) is not injected to the oxide semiconductor film (OS) side from the source electrode (S) owing to the high potential barrier, so that current does not flow, which means an off state. In contrast, when a positive voltage is applied to the gate electrode (GE), the potential barrier is decreased, so that current flows in the oxide semiconductor film (OS), which means an on state.

Figure 21A:
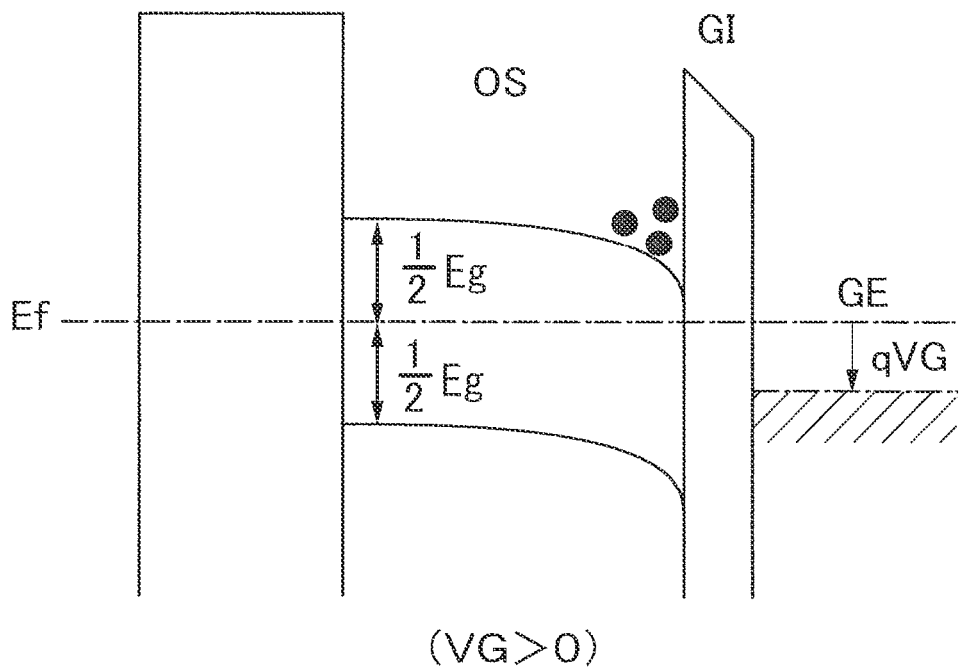
FIG. 21A is a diagram illustrating a state where a positive voltage ($V_G$>0) is applied to a gate electrode (GE) and FIG. 21B is a diagram illustrating a state where a negative voltage ($V_G$<0) is applied to the gate electrode (GE).
Figure 21B:
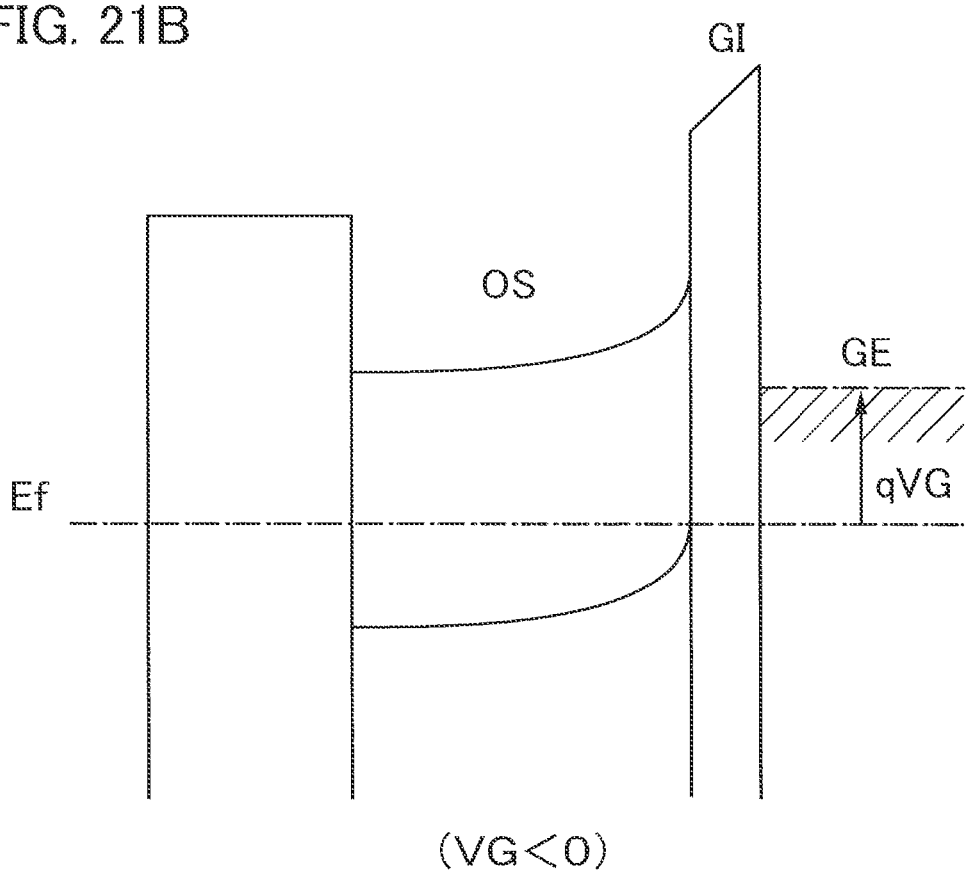

FIGS. 21A and 21B are energy band diagrams (schematic diagrams) along B-B' section in FIG. 19. FIG. 21A illustrates an on state where a positive voltage (VG>0) is applied to the gate electrode (GE) and carriers (electrons) flow between the source electrode and the drain electrode. FIG. 21B illustrates an off state where a negative voltage (VG<0) is applied to the gate electrode (GE).

Figure 22:
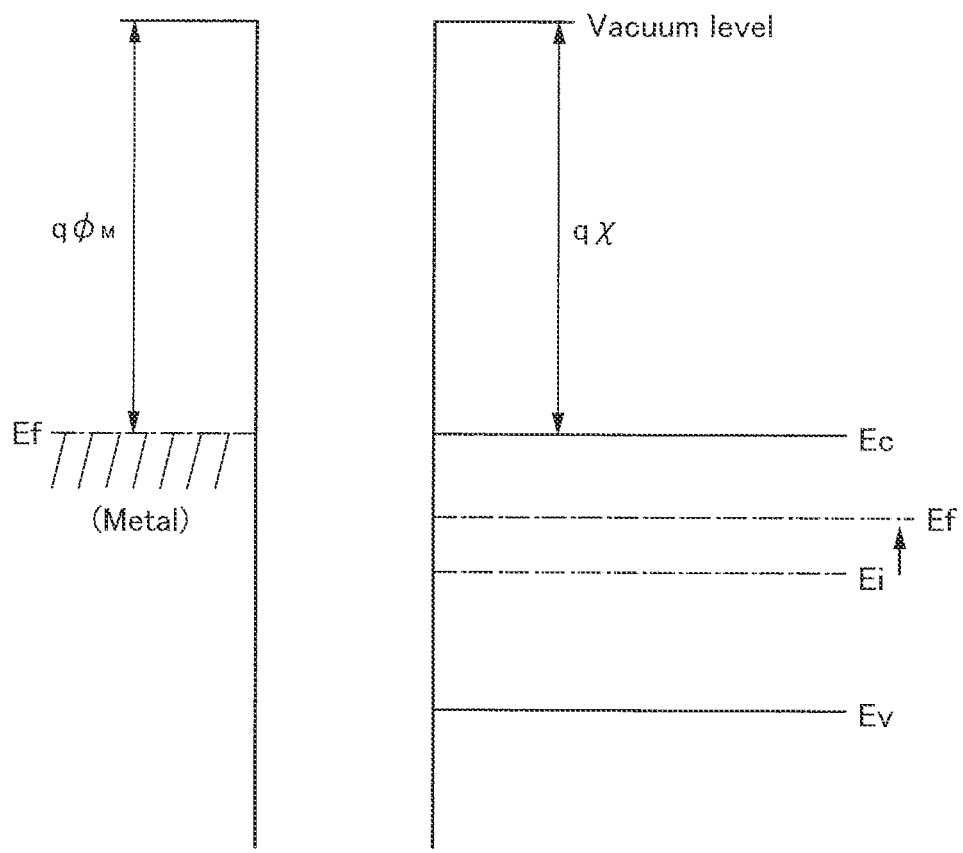
FIG. 22 is a diagram showing a relation between the vacuum level and the work function of a metal ($\phi M$), and between the vacuum level and the electron affinity of an oxide semiconductor ($\chi$).

FIG. 22 illustrates the relationships between the vacuum level and the work function of a metal ($\phi_M$) and between the vacuum level and the electron affinity ($\chi$) of an oxide semiconductor.

At normal temperature, electrons in the metal degenerate and the Fermi level is located in the conduction band. On the other hand, in general, a conventional oxide semiconductor is an n-type semiconductor, and the Fermi level (Ef) thereof is located near the conduction band (Ec) away from an intrinsic Fermi level (Ei) which is located in the center of the band gap. Note that it is known that part of hydrogen in the oxide semiconductor serves as a donor and one of factors that make the oxide semiconductor an n-type semiconductor. Further, oxygen deficiency is also known as one of the factors that make the oxide semiconductor an n-type semiconductor.

In contrast, in one embodiment of the present invention, an oxide semiconductor is made to be an intrinsic (i-type) semiconductor or extremely close to an intrinsic semiconductor by removing hydrogen that is an impurity imparting a conductivity type from an oxide semiconductor, highly purifying the oxide semiconductor such that an impurity other than a main component of the oxide semiconductor is prevented from being contained therein as much as possible, and removing oxygen deficiency. That is, the oxide semiconductor becomes an i-type semiconductor not by addition of impurities but by removal of impurities such as moisture or hydrogen and oxygen deficiency as much as possible to have high purity, so that an oxide semiconductor which is an intrinsic (i-type) semiconductor or is extremely close to an intrinsic (i-type) semiconductor is obtained. With the above structure, the Fermi level (Ef) can be substantially the same level as the intrinsic Fermi level (Ei), as indicated by an arrow.

It is said that the band gap (Eg) of an oxide semiconductor is 3.15 eV and that the electron affinity ($\chi$) thereof is 4.3 eV. In the case where titanium (Ti) is used as a material for forming the source electrode and the drain electrode, the work function of titanium (Ti) is substantially equal to the electron affinity ($\chi$) of the oxide semiconductor. In that case, a Schottky barrier for electrons is not formed at an interface between the metal and the oxide semiconductor. There are other materials that satisfy this condition besides titanium.

As illustrated in FIG. 21A, the electron moves along the lowest part of the oxide semiconductor, which is energetically stable, at an interface between the gate insulating film and the highly-purified oxide semiconductor.

In FIG. 21B, when a negative voltage is applied to the gate electrode (GE), the number of holes which are minority carriers are substantially zero; therefore, the value of current is extremely close to zero.

For example, even when an element has a channel width (W) of $1\times10^6$ μm and a channel length (L) of 10 μm, off-state current can be less than or equal to the measurement limit of a semiconductor parameter analyzer, i.e., less than or equal to $1\times10^{-13}$ A, at a voltage (drain voltage) between the source electrode and the drain electrode of from 1 V to 10V. According to measurement, a transistor can have a much lower off-state current density, which is from 10 zA/μm to 100 zA/μm, at a voltage between a source electrode and a drain electrode of 3 V. In the measurement, a transistor including a highly-purified oxide semiconductor film and a 100-nm-thick gate insulating film was used for a switching element for holding electric charge of a storage capacitor, and the off-state current of the transistor was measured by a change in the amount of electric charge in the storage capacitor per unit hour. That is, the off-state current density of the transistor in which the highly-purified oxide semiconductor film is used as an active layer can be less than or equal to 100 zA/μm, preferably less than or equal to 10 zA/μm, more preferably less than or equal to 1 zA/μm.

In this manner, the oxide semiconductor film is highly purified so that impurities such as moisture or hydrogen that are not a main component of the oxide semiconductor are contained as little as possible, whereby the operation of the transistor can be favorable.

This embodiment can be implemented in combination with any of the above embodiments as appropriate.

Embodiment 5

In this embodiment, a structure of a transistor including an oxide semiconductor film which is different from that of the transistor in Embodiment 4 is described.

Figure 12A:
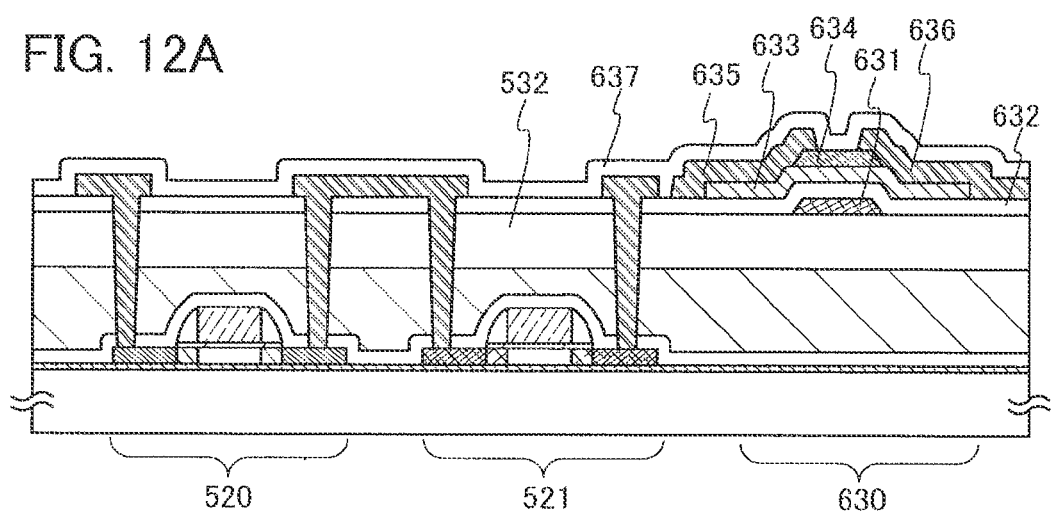
FIGS. 12A to 12C are cross-sectional views of memory devices.

In a manner similar to that in Embodiment 4, a memory device illustrated in FIG. 12A includes an n-channel transistor 520 and a p-channel transistor 521 each of which includes crystalline silicon. In addition, a bottom-gate transistor 630 which has a channel-protective structure and includes an oxide semiconductor film is formed over the n-channel transistor 520 and the p-channel transistor 521 in FIG. 12A.

The transistor 630 includes a gate electrode 631 provided over an insulating film 532, a gate insulating film 632 provided over the gate electrode 631, an oxide semiconductor film 633 over the gate insulating film 632, which overlaps with the gate electrode 631, a channel protective film 634 which is provided over the island-shaped oxide semiconductor film 633 to overlap with the gate electrode 631, and a source electrode 635 and a drain electrode 636 which are provided over the oxide semiconductor film 633. The transistor 630 may further include an insulating film 637 provided over the oxide semiconductor film 633 as its component.

The channel protective film 634 can prevent a portion of the oxide semiconductor film 633, which serves as a channel formation region, from being damaged in a later step (for example, reduction in thickness due to plasma or an etchant in etching). Therefore, reliability of the transistor can be improved.

An inorganic material containing oxygen (silicon oxide, silicon nitride oxide, silicon oxynitride, aluminum oxide, aluminum oxynitride, or the like) can be used for the channel protective film 634. The channel protective film 634 can be formed by a vapor deposition method such as a plasma CVD method or a thermal CVD method, or a sputtering method. After being deposited, the shape of the channel protective film 634 is processed by etching. Here, the channel protective film 634 is formed in such a manner that a silicon oxide film is formed by a sputtering method and processed by etching using a mask formed by photolithography.

By using an inorganic material containing oxygen for the channel protective film 634, even when oxygen deficiency is generated in the oxide semiconductor film 633 owing to heat treatment for reducing moisture or hydrogen, a region of the oxide semiconductor film 633 which is in contact with at least the channel protective film 634 can be supplied with oxygen and oxygen deficiency which serves as a donor can be reduced, so that a structure which satisfies the stoichiometric composition ratio can be obtained. Therefore, the channel formation region can be made to be an i-type semiconductor or a substantially i-type semiconductor, variation in electric characteristics of the transistor due to oxygen deficiency can be reduced, and the electric characteristics can be improved.

Note that the transistor 630 may further include a back gate electrode over the insulating film 637. The back gate electrode is formed so as to overlap with the channel formation region in the oxide semiconductor film 633. Further, the back gate electrode may be electrically insulated and in a floating state, or may be in a state where the back gate electrode is supplied with a potential. In the latter case, the back gate electrode may be supplied with a potential having the same level as the gate electrode 631, or may be supplied with a fixed potential such as a ground potential. The level of the potential supplied to the back gate electrode is controlled, whereby the threshold voltage of the transistor 630 can be controlled.

Figure 12B:
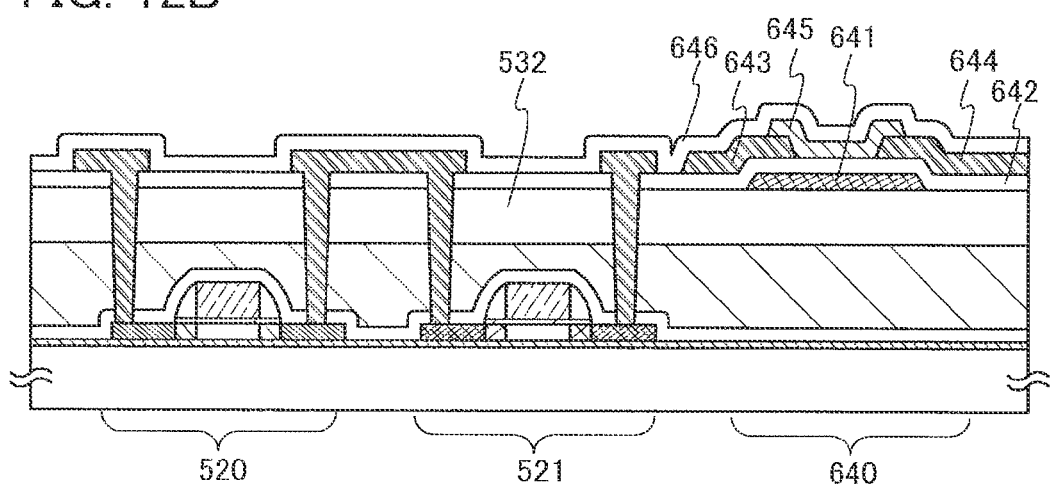

In a manner similar to that in Embodiment 4, a memory device illustrated in FIG. 12B includes an n-channel transistor 520 and a p-channel transistor 521 each of which includes crystalline silicon. In addition, a bottom-contact transistor 640 including an oxide semiconductor film is formed over the n-channel transistor 520 and the p-channel transistor 521 in FIG. 12B.

The transistor 640 includes a gate electrode 641 provided over an insulating film 532, a gate insulating film 642 provided over the gate electrode 641, a source electrode 643 and a drain electrode 644 which are provided over the gate insulating film 642, and an oxide semiconductor film 645 which overlaps with the gate electrode 641. The transistor 640 may further include an insulating film 646 provided over the oxide semiconductor film 645 as its component.

In the case of the bottom-contact transistor 640 as illustrated in FIG. 12B, the thickness of each of the source electrode 643 and the drain electrode 644 is preferably smaller than that of the bottom-gate transistor described in Embodiment 4 in order to prevent disconnection of the oxide semiconductor film 645 formed later. Specifically, the thicknesses of the source electrode 643 and the drain electrode 644 are 10 nm to 200 nm, preferably 50 nm to 75 nm.

Note that the transistor 640 may further include a back gate electrode over the insulating film 646. The back gate electrode is formed so as to overlap with a channel formation region in the oxide semiconductor film 645. Further, the back gate electrode may be electrically insulated and in a floating state, or may be in a state where the back gate electrode is supplied with a potential. In the latter case, the back gate electrode may be supplied with a potential having the same level as the gate electrode 641, or may be supplied with a fixed potential such as a ground potential. The level of the potential supplied to the back gate electrode is controlled, whereby the threshold voltage of the transistor 640 can be controlled.

Figure 12C:
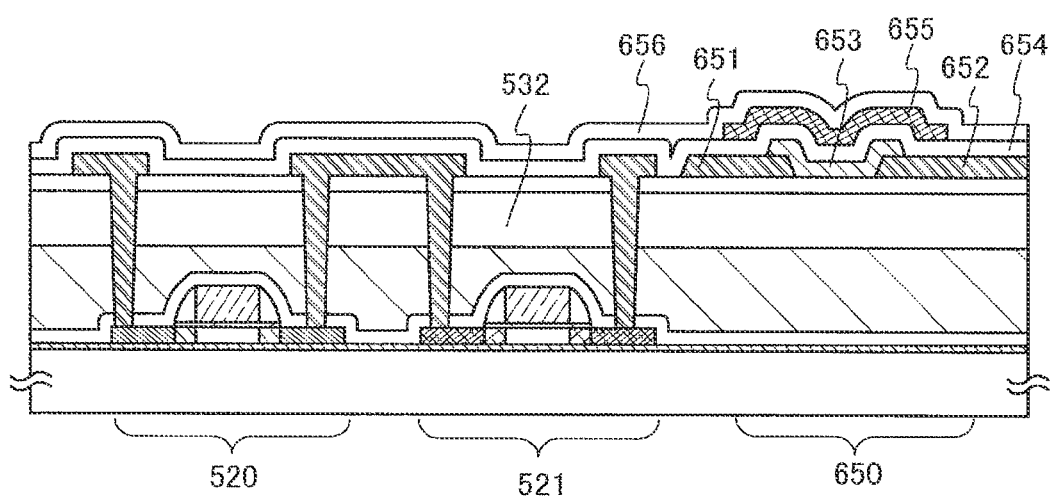

In a manner similar to that in Embodiment 4, a memory device illustrated in FIG. 12C includes an n-channel transistor 520 and a p-channel transistor 521 each of which includes crystalline silicon. In addition, a top-gate transistor 650 including an oxide semiconductor film is provided over the n-channel transistor 520 and the p-channel transistor 521 in FIG. 12C.

The transistor 650 includes a source electrode 651 and a drain electrode 652 which are provided over an insulating film 532, an oxide semiconductor film 653 which is provided over the source electrode 651 and the drain electrode 652, a gate insulating film 654 provided over the oxide semiconductor film 653, and a gate electrode 655 over the gate insulating film 654, which overlaps with the oxide semiconductor film 653. In addition, the transistor 650 may further include an insulating film 656 provided over the gate electrode 655 as its component.

In the case of the top-gate transistor 650 as illustrated in FIG. 12C, the thickness of each of the source electrode 651 and the drain electrode 652 is preferably smaller than that of the bottom-gate transistor described in Embodiment 4 in order to prevent disconnection of the oxide semiconductor film 653 formed later. Specifically, the thicknesses of the source electrode 651 and the drain electrode 652 are 10 nm to 200 nm, preferably 50 nm to 75 nm.

Figure 23:
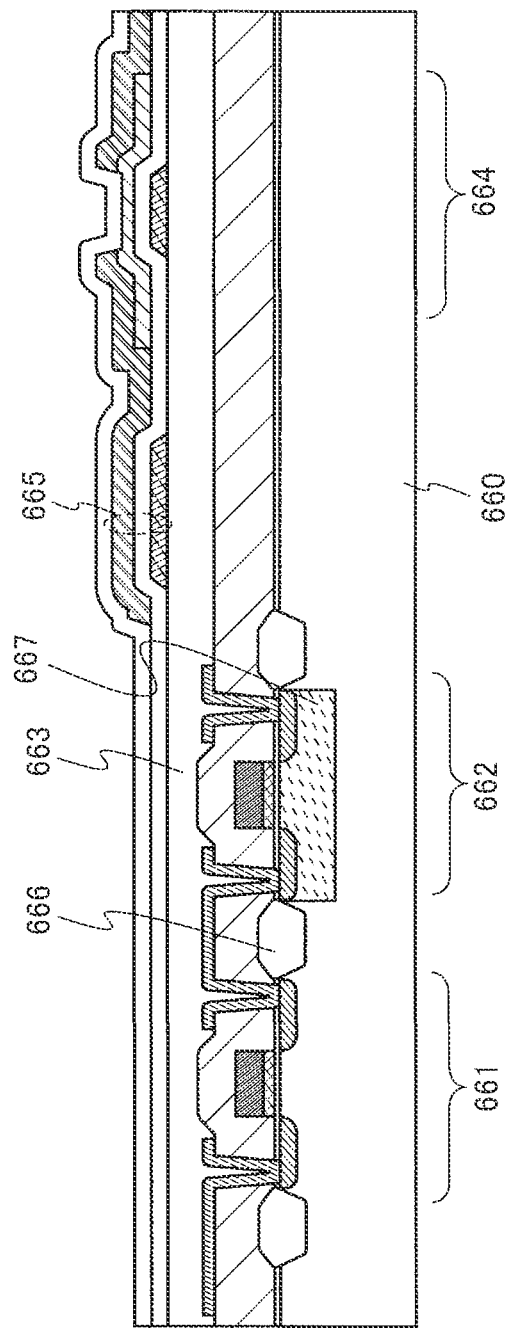
FIG. 23 is a cross-sectional view of a memory device.

In the memory device which is one embodiment of the present invention, a phase-inversion element, a switching element, and the like may include a transistor which is manufactured using a bulk single crystal semiconductor substrate. In FIG. 23, a cross-sectional view of a memory device in which a transistor including an oxide semiconductor is formed over a transistor which is formed using the bulk single crystal semiconductor substrate is illustrated as an example.

The memory device illustrated in FIG. 23 includes an n-channel transistor 661 and a p-channel transistor 662 which are provided on a semiconductor substrate 660, a transistor 664 which is provided over an insulating film 663 covering the n-channel transistor 661 and the p-channel transistor 662 and which is used as a capacitor switching element, and a capacitor 665.

Although the case where the transistor 664 includes an oxide semiconductor in a channel formation region and has a structure described in Embodiment 4 is described as an example, the structure may be that illustrated in FIGS. 12A to 12C.

The semiconductor substrate 660 can be, for example, a single crystal silicon substrate having n-type or p-type conductivity, a compound semiconductor substrate (e.g., a GaAs substrate, an InP substrate, a GaN substrate, a SiC substrate, a sapphire substrate, or a ZnSe substrate), or the like. In FIG. 23, the case where a single crystal silicon substrate having n-type conductivity is used is illustrated as an example.

In addition, the n-channel transistor 661 and the p-channel transistor 662 are electrically isolated from each other by an element isolation insulating film 666. For formation of the element isolation insulating film 666, a selective oxidation method (local oxidation of silicon (LOCOS) method), a trench isolation method, or the like can be used.

In a region where the p-channel transistor 662 is formed, a region called a p-well 667 is formed by selectively introducing an impurity element imparting p-type conductivity. In the case where a semiconductor substrate having p-type conductivity is used, an impurity element imparting n-type conductivity may be selectively introduced to a region where the n-channel transistor 661 is formed, so that an n-well may be formed.

This embodiment can be implemented in combination with any of the above embodiments as appropriate.

Embodiment 6

In this embodiment, a structure of a memory device which is one embodiment of the present invention will be described. In the memory device, a transistor including a highly purified oxide semiconductor in a channel formation region is used for a switching element which controls the supply of power supply potential to a memory element.

Figure 13A:
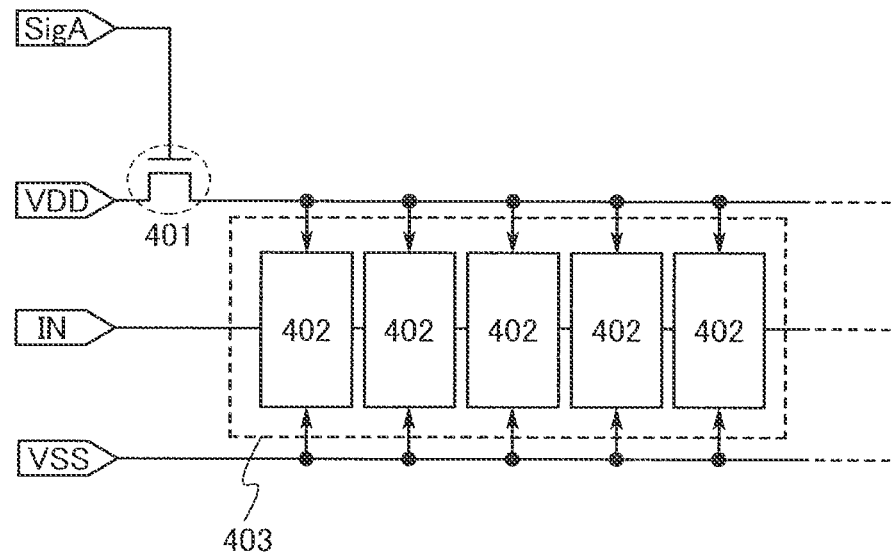
FIGS. 13A and 13B are diagrams illustrating configurations of memory devices.

In FIG. 13A, the structure of a memory device of this embodiment is illustrated as an example. The memory device illustrated in FIG. 13A includes a switching element 401 and a memory element group 403 including a plurality of memory elements 402. Specifically, as each of the memory elements 402, a memory element having any of the structures described in Embodiments 1 to 5 can be used. Each of the memory elements 402 included in the memory element group 403 is supplied with a high-level power supply potential VDD via the switching element 401. Further, each of the memory elements 402 included in the memory element group 403 is supplied with a potential of a signal IN and a low-level power supply potential VSS.

In FIG. 13A, a transistor including an oxide semiconductor in a channel formation region is used for the switching element 401, and the switching of the transistor is controlled by a signal Sig A supplied to a gate electrode thereof. Since the transistor used for the switching element 401 includes a highly purified oxide semiconductor in a channel formation region, off-state current thereof is extremely low as described above.

Note that in FIG. 13A, a structure in which the switching element 401 includes only one transistor is illustrated; however, the present invention is not limited to this structure. In one embodiment of the present invention, the switching element 401 may include a plurality of transistors. In the case where a plurality of transistors which serve as a switching element are included in the switching element 401, the plurality of transistors may be connected to each other in parallel, in series, or in combination of parallel connection and series connection.

Figure 13B:
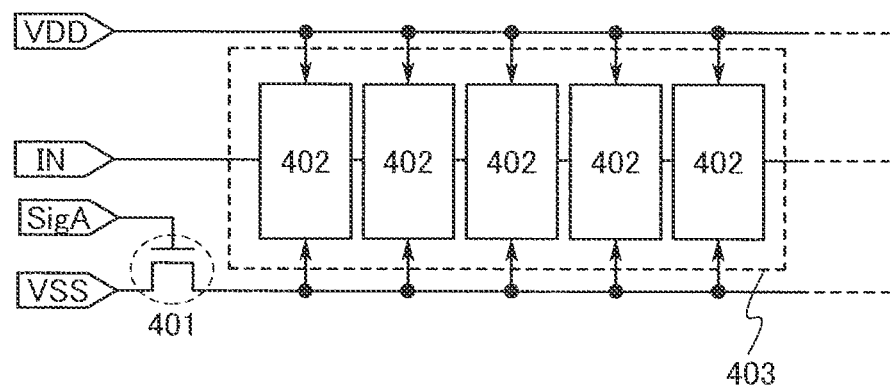

Although the switching element 401 controls the supply of the high-level power supply potential VDD to each of the memory elements 402 included in the memory element group 403 in FIG. 13A, the switching element 401 may control the supply of the low-level power supply potential VSS. In FIG. 13B, an example of a memory device in which each of the memory elements 402 included in the memory element group 403 is supplied with the low-level power supply potential VSS via the switching element 401 is illustrated. The supply of the low-level power supply potential VSS to each of the memory elements 402 included in the memory element group 403 can be controlled by the switching element 401.

Next, a structure of a transistor for a power device capable of controlling higher voltage or larger current than the transistor including an oxide semiconductor in a channel formation region described in Embodiment 4 or Embodiment 5 will be described. By using a transistor having such a structure for the switching element 401, the reliability of the memory device can be further increased. Note that the same portions as Embodiment 4 or 5 or portions having functions similar to those of Embodiment 4 or 5 can be formed as in Embodiment 4 or 5, and also the same steps as Embodiment 4 or 5 or the steps similar to those of Embodiment 4 or 5 can be performed as in Embodiment 4 or 5; therefore, repetitive description thereof is omitted.

Figure 14A:
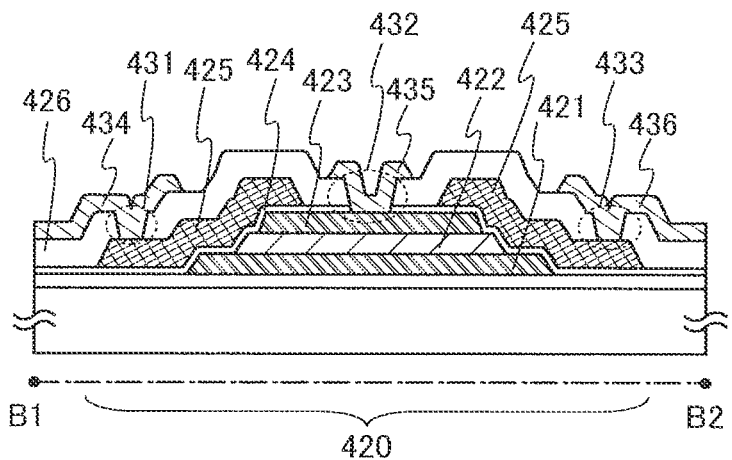
FIGS. 14A and 14B are a cross-sectional view and a top view of a transistor.
Figure 14B:
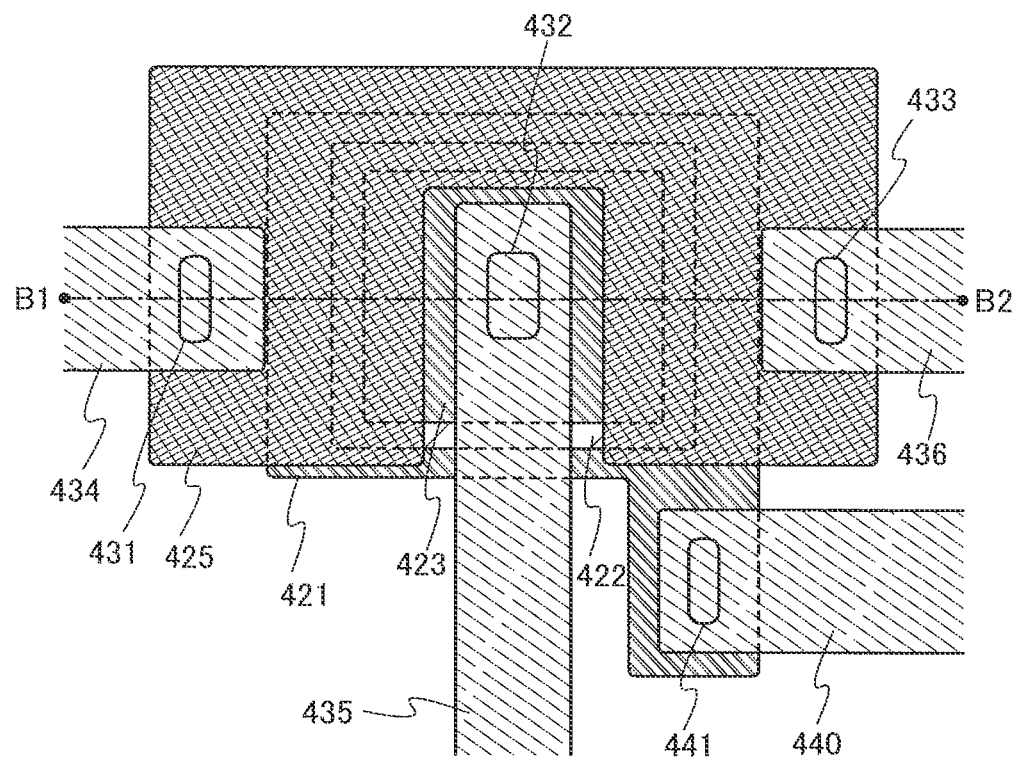

In FIG. 14A, a cross-sectional view of a transistor 420 described in this embodiment is illustrated. FIG. 14B is a top view of the transistor 420. A cross-sectional view along dashed line B1-B2 in FIG. 14B corresponds to FIG. 14A.

The transistor 420 includes a first electrode 421 over an insulating surface.

The first electrode 421 is formed using a metal element selected from aluminum, chromium, copper, tantalum, titanium, molybdenum, tungsten, and yttrium; an alloy containing any of these metal elements as a component; an alloy containing any of these metal elements in combination; or the like. Alternatively, one or more metal elements selected from manganese, magnesium, zirconium, and beryllium can be used. In addition, the first electrode 421 can have a single-layer structure or a stacked structure having two or more layers. For example, a single-layer structure of an aluminum film containing silicon, a two-layer structure of an aluminum film and a titanium film stacked thereover, a two-layer structure of a tungsten film and a titanium film stacked thereover, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

The first electrode 421 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The first electrode 421 can be formed in such a manner that a conductive film is formed over the insulating surface by a sputtering method, a CVD method, or a vacuum evaporation method, a resist mask is formed over the conductive film in a photolithography step, and the conductive film is etched using the resist mask. Alternatively, the first electrode 421 is formed by a printing method or an inkjet method without a photolithography step, so that the number of steps can be reduced. Note that end portions of the first electrode 421 preferably have a tapered shape, so that the coverage with a gate insulating film formed later is improved. When the angle between the end portion of the first electrode 421 and the insulating surface over which the first electrode 421 is formed is greater than or equal to 30° and less than or equal to 60°, preferably greater than or equal to 40° and less than or equal to 50°, the coverage with the gate insulating film formed later can be improved.

In this embodiment, as the conductive film for forming the first electrode 421, by a sputtering method, a 50-nm-thick titanium film is formed, a 100-nm-thick aluminum film is formed, and a 50-nm-thick titanium film is formed. Next, etching is performed using a resist mask formed in a photolithography step, whereby the first electrode 421 is formed. Instead of the resist mask formed in the photolithography step, a resist mask can be formed using an inkjet method, so that the number of steps can be reduced.

The transistor 420 includes an island-shaped oxide semiconductor film 422 over the first electrode 421. The oxide semiconductor film 422 can be formed by a sputtering method, a coating method, a printing method, or the like. In this embodiment, after an oxide semiconductor film is formed by a sputtering method over the first electrode 421, the oxide semiconductor film is processed into a desired shape by etching or the like, so that the island-shaped oxide semiconductor film 422 is formed. Moreover, the oxide semiconductor film can be formed by a sputtering method in a rare gas (for example, argon) atmosphere, an oxygen atmosphere, or an atmosphere containing a rare gas (for example, argon) and oxygen.

Note that the etching for forming the island-shaped oxide semiconductor film 422 may be performed in accordance with description of the etching of the oxide semiconductor film in Embodiment 4. Note that the angle between the end portion of the island-shaped oxide semiconductor film 422 which is formed by etching and the first electrode 421 is greater than or equal to 30° and less than or equal to 60°, preferably greater than or equal to 40° and less than or equal to 50°, whereby the coverage with the gate insulating film that is formed later can be improved.

Note that before the oxide semiconductor film is formed by a sputtering method, dust attached on a surface of the first electrode 421 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to generate plasma around the substrate and modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

For the oxide semiconductor film 422, the above-described oxide semiconductor can be used.

In this embodiment, an In—Ga—Zn—O-based non-single-crystal film with a thickness of 30 nm, which is obtained by a sputtering method using an oxide semiconductor target containing indium (In), gallium (Ga), and zinc (Zn), is used as the oxide semiconductor film 422. As the target, a metal oxide target containing metal atoms at a composition ratio of In:Ga:Zn=1:1:0.5, In:Ga:Zn=1:1:1, or In:Ga:Zn=1:1:2 can be used, for example. The oxide semiconductor film can be formed by a sputtering method in a rare gas (typically, argon) atmosphere, an oxygen atmosphere, or an atmosphere containing a rare gas (typically, argon) and oxygen. In the case of performing a sputtering method, a target containing $SiO_2$ at greater than or equal to 2 wt % and less than or equal to 10 wt % may be used. The filling rate of the metal oxide target containing In, Ga, and Zn is greater than or equal to 90% and less than or equal to 100%, preferably greater than or equal to 95% and less than or equal to 99.9%. With the use of a metal oxide target with a high filling rate, the deposited oxide semiconductor film is dense.

The substrate is held in a treatment chamber kept under reduced pressure, a sputtering gas from which hydrogen and moisture are removed is introduced into the treatment chamber from which remaining moisture is being removed, and the oxide semiconductor film 422 is formed over a substrate with the use of a metal oxide as a target. At the film formation, the substrate temperature may be greater than or equal to 100° C. and less than or equal to 600° C., preferably greater than or equal to 200° C. and less than or equal to 400° C. By forming the oxide semiconductor film while the substrate is heated, the concentration of impurities contained in the formed oxide semiconductor film can be reduced. In addition, damage by sputtering can be reduced. In order to remove remaining moisture from the treatment chamber, an entrapment vacuum pump is preferably used. For example, a cryopump, an ion pump, or a titanium sublimation pump is preferably used. The evacuation unit may be a turbo pump provided with a cold trap. When the treatment chamber is evacuated with the cryopump, for example, a hydrogen atom, a compound containing a hydrogen atom such as water ($H_2O$) (preferably, also a compound containing a carbon atom), and the like are removed, whereby the impurity concentration in the oxide semiconductor film formed in the treatment chamber can be reduced.

In this embodiment, as an example of a film formation condition of the oxide semiconductor film, the following conditions are applied: the substrate temperature is room temperature, the distance between the substrate and the target is 110 mm, the pressure is 0.4 Pa, the electric power of the direct current (DC) power source is 0.5 kW, and the atmosphere contains oxygen and argon (the oxygen flow rate is 15 sccm, and the argon flow rate is 30 sccm). Note that a pulsed direct-current (DC) power source is preferable because dust called particles generated in film deposition can be reduced and the film thickness can be uniform. The oxide semiconductor film has a thickness of greater than or equal to 1 μm, preferably greater than or equal to 3 μm, more preferably greater than or equal to 10 μm. Note that the appropriate thickness of the oxide semiconductor film differs depending on the material to be used; therefore, the thickness may be determined as appropriate in accordance with the material.

Note that in order that hydrogen, hydroxyl group, and moisture are contained as little as possible in the oxide semiconductor film 422, it is preferable that the substrate over which layers up to and including the first electrode 421 are formed be preheated in a preheating chamber of a sputtering apparatus as pretreatment before film formation, so that impurities such as hydrogen or moisture absorbed onto the substrate are eliminated and removed. The temperature for the preheating is greater than or equal to 100° C. and less than or equal to 400° C., preferably greater than or equal to 150° C. and less than or equal to 300° C. As an evacuation unit provided in the preheating chamber, a cryopump is preferable. Note that this preheating treatment can be omitted. Note also that this preheating may be similarly performed on the substrate over which layers up to and including a gate electrode are formed before the formation of an insulating film.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside a chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

Note that heat treatment is performed on the oxide semiconductor film 422 in a reduced-pressure atmosphere, an atmosphere of an inert gas such as nitrogen or a rare gas, an oxygen atmosphere, or an ultra dry air atmosphere (the moisture amount is less than or equal to 20 ppm (−55° C. by conversion into a dew point), preferably less than or equal to 1 ppm, more preferably less than or equal to 10 ppb, in the case where measurement is performed with the use of a dew point meter of a cavity ring down laser spectroscopy (CRDS) system). When the heat treatment is performed on the oxide semiconductor film 422, the oxide semiconductor film 422 from which moisture or hydrogen is removed is formed. Specifically, heat treatment may be performed at greater than or equal to 300° C. and less than or equal to 850° C. (or a temperature of less than or equal to the strain point of a glass substrate). With an RTA method, dehydration or dehydrogenation can be performed in a short time, and thus, the heat treatment can be performed even at a temperature over the strain point of a glass substrate. In this embodiment, heat treatment is performed on the oxide semiconductor film 422 at a substrate temperature of 450° C. for 1 hour in a nitrogen atmosphere with the use of an electrical furnace that is one of heat treatment apparatuses. After that, the oxide semiconductor film is not exposed to the air, and entry of water and hydrogen is prevented. Impurities such as moisture or hydrogen are removed, so that the oxide semiconductor film 422 becomes an i-type (intrinsic) semiconductor or a semiconductor that is extremely close to an i-type semiconductor; therefore, deterioration of transistor characteristics due to the impurities, such as a shift in threshold voltage, can be prevented from being promoted and off-state current can be reduced.

Detailed description of the heat treatment apparatus used for the heat treatment is already made in Embodiment 4 and therefore omitted here.

It is preferable that in the heat treatment, moisture, hydrogen, or the like be not contained in nitrogen or a rare gas such as helium, neon, or argon. It is preferable that the purity of nitrogen or a rare gas such as helium, neon, or argon which is introduced into the heat treatment apparatus be set to greater than or equal to 6N (99.9999%), preferably greater than or equal to 7N (99.99999%) (that is, the impurity concentration is less than or equal to 1 ppm, preferably less than or equal to 0.1 ppm).

When impurities are added to the oxide semiconductor, in a gate bias-temperature stress test (BT test, the test condition is for example at 85° C. with $2 \times 10^6$ V/cm for 12 hours), a bond between the impurities and a main component of the oxide semiconductor is broken by a high electrical field (B: bias) and high temperature (T: temperature), and a dangling bond generated causes a shift in threshold voltage (Vth). However, by improving the interface characteristics between the gate insulating film and the oxide semiconductor film and removing impurities, particularly hydrogen, water, and the like, from the oxide semiconductor film as much as possible, a transistor which is also stable to the BT test can be obtained.

Through the above process, the concentration of hydrogen in the oxide semiconductor film can be reduced and the oxide semiconductor film can be highly purified. Thus, the oxide semiconductor film can be stabilized. In addition, heat treatment at a temperature of less than or equal to the glass transition temperature makes it possible to form an oxide semiconductor film with a wide band gap in which carrier density is extremely low. Therefore, a transistor can be manufactured using a large-sized substrate, so that productivity can be increased. In addition, by using the oxide semiconductor film in which the hydrogen concentration is reduced and purity is improved, it is possible to manufacture a transistor with high withstand voltage, a low short-channel effect, and a high on-off ratio.

The transistor 420 also includes a second electrode 423 over the oxide semiconductor film 422. The material and structure of a conductive film for forming the second electrode 423 can be similar to those for the first electrode 421. In addition, a method for forming the second electrode 423 can be similar to that for the first electrode 421.

In this embodiment, a resist mask is formed over the conductive film for forming the second electrode 423 in a photolithography step, and the conductive film is etched using the resist mask, so that the second electrode 423 is formed. Here, as the conductive film for forming the second electrode 423, a 50-nm-thick titanium film, a 100-nm-thick aluminum film, and a 50-nm-thick titanium film are stacked in that order. When the angle between the end portion of the second electrode 423 and the oxide semiconductor film 422 is greater than or equal to 30° and less than or equal to 60°, preferably greater than or equal to 40° and less than or equal to 50°, the coverage with the gate insulating film formed later can be improved. In addition, the second electrode 423 is formed away from the first electrode 421 so as not to be in contact with the first electrode 421.

One of the first electrode 421 and the second electrode 423 functions as a source electrode of a transistor, and the other thereof functions as a drain electrode.

Heat treatment may be performed after the formation of the second electrode 423. The temperature of the heat treatment is greater than or equal to 400° C. and less than or equal to 850° C., preferably greater than or equal to 400° C. and less than the strain point of the substrate. In this embodiment, the substrate is introduced into an electric furnace which is one of heat treatment apparatuses, and heat treatment is performed on the oxide semiconductor film 422 in an inert gas atmosphere, such as a nitrogen atmosphere or a rare gas atmosphere, at 450° C. for one hour. After that, the substrate is not exposed to the air. Accordingly, hydrogen, water, hydroxyl group, hydride, or the like can be prevented from entering the oxide semiconductor film, whereby the hydrogen concentration is further reduced, and the oxide semiconductor film can be highly purified so as to be an i-type oxide semiconductor film or a substantially i-type oxide semiconductor film.

It is preferable that in the heat treatment, hydrogen, water, hydroxyl group, hydride, or the like be not contained in nitrogen or a rare gas such as helium, neon, or argon. Alternatively, the purity of nitrogen or a rare gas such as helium, neon, or argon introduced into the heat treatment apparatus is greater than or equal to 6N (99.9999%), preferably greater than or equal to 7N (99.99999%) (that is, the impurity concentration is less than or equal to 1 ppm, preferably less than or equal to 0.1 ppm).

The transistor 420 also includes a gate insulating film 424 which is formed so as to cover the first electrode 421, the oxide semiconductor film 422, and the second electrode 423, and a gate electrode 425 which is formed over the gate insulating film 424. The gate insulating film 424 is formed using a single layer or a stacked layer which includes one or more of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film by a plasma CVD method, a sputtering method, or the like.

When the gate insulating film 424 is formed using a high-k material such as hafnium silicate (HfSiOx), HfSixOy to which nitrogen is added, hafnium aluminate (HfAlOx) to which nitrogen is added, hafnium oxide, or yttrium oxide, gate leakage current can be reduced. Further, a stacked structure can be used in which a high-k material and one or more of a silicon oxide film, a silicon nitride film, a silicon oxynitride film, a silicon nitride oxide film, and an aluminum oxide film are stacked. The thickness of the gate insulating film 424 is preferably greater than or equal to 50 nm and less than or equal to 500 nm. When the thickness of the gate insulating film 424 is large, the gate leakage current can be reduced.

It is preferable that the gate insulating film 424 contain impurities such as moisture or hydrogen as little as possible. In the case where a silicon oxide film is formed by a sputtering method, a silicon target or a quartz target is used as a target and oxygen or a mixed gas of oxygen and argon is used as a sputtering gas.

The oxide semiconductor that is made to be an i-type semiconductor or a substantially i-type semiconductor (the highly purified oxide semiconductor) by removal of impurities is extremely sensitive to an interface state and an interface electric charge; thus, characteristics of the interface between the oxide semiconductor and the gate insulating film are important. Therefore, the gate insulating film (GI) that is in contact with the highly purified oxide semiconductor needs to have higher quality.

For example, high-density plasma CVD using microwaves (e.g., a frequency of 2.45 GHz) is preferable because a dense high-quality insulating film having high withstand voltage can be formed. When the highly purified oxide semiconductor and the high-quality gate insulating film are in close contact with each other, the interface state density can be reduced and favorable interface characteristics can be obtained.

Needless to say, another method such as a sputtering method or a plasma CVD method can be employed as long as the method enables formation of a good-quality insulating film as the gate insulating film 424. In addition, it is possible to use, as the gate insulating film 424, an insulating film whose quality and characteristics of an interface with the oxide semiconductor are improved by heat treatment performed after the formation of the insulating film. In any case, any insulating film can be used as long as film quality as a gate insulating film is high, interface state density with the oxide semiconductor is decreased, and a favorable interface can be formed.

The gate insulating film 424 may have a structure in which an insulating film formed using a material having a high barrier property and an insulating film having a lower proportion of nitrogen such as a silicon oxide film or a silicon oxynitride film are stacked. In this case, the insulating film such as a silicon oxide film or a silicon oxynitride film is formed between the insulating film having a barrier property and the oxide semiconductor film. As the insulating film having a high barrier property, a silicon nitride film, a silicon nitride oxide film, an aluminum nitride film, an aluminum nitride oxide film, or the like can be given, for example. By using the insulating film having a barrier property, impurities in the atmosphere, such as moisture or hydrogen, or impurities contained in the substrate, such as an alkali metal or a heavy metal, can be prevented from entering the oxide semiconductor film, the gate insulating film 424, or the interface between the oxide semiconductor film and another insulating film and the vicinity thereof. In addition, when the insulating film having a lower proportion of nitrogen such as a silicon oxide film or a silicon oxynitride film is formed so as to be in contact with the oxide semiconductor film, the insulating film formed using a material having a high barrier property can be prevented from being in contact with the oxide semiconductor film directly.

For example, a gate insulating film having a total thickness of 100 nm may be formed in such a manner that a silicon oxide film ($SiO_x$ ($x>0$)) with a thickness of greater than or equal to 5 nm and less than or equal to 300 nm is formed as a first gate insulating film and a silicon nitride film ($SiN_y$ ($y>0$)) with a thickness of greater than or equal to 50 nm and less than or equal to 200 nm is stacked over the first gate insulating film as a second gate insulating film by a sputtering method. In this embodiment, a 100-nm-thick silicon oxide film is formed by an RF sputtering method under a condition that the pressure is 0.4 Pa, the electric power of the high-frequency power source is 1.5 kW, and the atmosphere contains oxygen and argon (the flow ratio of oxygen to argon is 1:1 (each flow rate is 25 sccm)).

Note that in order that hydrogen, hydroxyl group, and moisture are contained as little as possible in the gate insulating film 424, it is preferable that as pretreatment before film formation, the substrate over which the first electrode 421, the oxide semiconductor film 422, and the second electrode 423 are formed be preheated in a preheating chamber of the sputtering apparatus, so that impurities such as hydrogen or moisture absorbed onto the substrate are eliminated and removed. The temperature for the preheating is greater than or equal to 100° C. and less than or equal to 400° C., preferably greater than or equal to 150° C. and less than or equal to 300° C. As an evacuation unit provided in the preheating chamber, a cryopump is preferable. Note that this preheating treatment can be omitted.

Note that after the gate insulating film 424 is formed, heat treatment may be performed. The heat treatment is performed in an air atmosphere or an inert gas atmosphere (nitrogen, helium, neon, argon, or the like). The heat treatment is preferably performed at a temperature of greater than or equal to 200° C. and less than or equal to 400° C., for example, greater than or equal to 250° C. and less than or equal to 350° C. In this embodiment, for example, heat treatment at 250° C. for one hour in a nitrogen atmosphere is performed. By the heat treatment, heating is performed in the state where silicon oxide contained in the gate insulating film 424 is in contact with the oxide semiconductor film 422, so that oxygen is supplied from the silicon oxide even when oxygen deficiency is generated in the above-described heat treatment for eliminating moisture or hydrogen. Thus, the oxygen deficiency which forms donors can be reduced, a structure which satisfies the stoichiometric composition ratio can be obtained, and the oxide semiconductor film 422 can be an i-type oxide semiconductor film or a substantially i-type oxide semiconductor film. There is no particular limitation on the timing of this heat treatment as long as it is after the formation of the gate insulating film 424. The heat treatment may be performed after another step, for example, after any one of the gate electrode 425, an insulating film 426, and wirings 434, 435, and 436 is formed. This heat treatment can be performed without increasing the number of manufacturing steps by doubling as another step such as heat treatment for reduction of the resistance of a transparent conductive film.

The gate electrode 425 can be formed using a single layer or a stacked layer with the use of a conductive film including a metal material such as molybdenum, titanium, chromium, tantalum, tungsten, neodymium, or scandium, or an alloy material which contains any of these metal materials as a main component, or a nitride of any of these metals. Note that aluminum or copper can be used as the above metal material if aluminum or copper can withstand a temperature of heat treatment which is performed in a later process. Aluminum or copper is preferably combined with a refractory metal material so as to prevent a heat resistance problem and a corrosion problem. As the refractory metal material, molybdenum, titanium, chromium, tantalum, tungsten, neodymium, scandium, or the like can be used.

For example, as a two-layer structure of the gate electrode 425, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the gate electrode 425, the following structure is preferable: a stacked structure including an aluminum film, a film of an alloy of aluminum and silicon, a film of an alloy of aluminum and titanium, or a film of an alloy of aluminum and neodymium as a middle layer and any of a tungsten film, a tungsten nitride film, a titanium nitride film, and a titanium film in a top layer and a bottom layer.

Further, by using a light-transmitting oxide conductive film of indium oxide, indium tin oxide, an indium oxide-zinc oxide alloy, zinc oxide, zinc aluminum oxide, zinc aluminum oxynitride, zinc gallium oxide, or the like for the gate electrode 425, the aperture ratio of a pixel portion can be increased.

The gate electrode 425 is formed to a thickness of 10 nm to 400 nm, preferably 100 nm to 200 nm. In this embodiment, after a conductive film with a thickness of 150 nm for the gate electrode is formed by a sputtering method using a tungsten target, the conductive film is processed (patterned) by etching to have a desired shape, so that the gate electrode 425 is formed. The gate electrode 425 is formed so as to at least overlap with the end portion of the oxide semiconductor film 422 with the gate insulating film 424 provided therebetween. In the end portion of the oxide semiconductor film 422, a channel formation region is formed so as to overlap with the gate electrode 425 with the gate insulating film 424 provided therebetween. Note that the end portion of the gate electrode 425 preferably has a tapered shape because coverage with the insulating film 426 stacked thereover can be improved. Note that a resist mask may be formed by an inkjet method. Formation of the resist mask by an inkjet method needs no photomask; thus, manufacturing cost can be reduced.

The transistor 420 also includes the insulating film 426 covering the first electrode 421, the oxide semiconductor film 422, the second electrode 423, the gate insulating film 424, and the gate electrode 425. The insulating film 426 preferably contains impurities such as moisture or hydrogen as little as possible, and may be formed using a single-layer insulating film or a plurality of insulating films stacked. The insulating film 426 is formed using, for example, an oxide insulating film such as a silicon oxide film, a silicon oxynitride film, an aluminum oxide film, or an aluminum oxynitride film; or a nitride insulating film such as a silicon nitride film, a silicon nitride oxide film, an aluminum nitride film, or an aluminum nitride oxide film. Alternatively, the oxide insulating film and the nitride insulating film can be stacked. When an insulating film having a high barrier property, for example, a silicon nitride film, a silicon nitride oxide film, an aluminum nitride film, or an aluminum nitride oxide film is used for the insulating film 426, impurities such as moisture or hydrogen can be prevented from entering the oxide semiconductor film 422, the gate insulating film 424, or the interface between the oxide semiconductor film 422 and another insulating film and the vicinity thereof.

In this embodiment, the insulating film 426 is formed to have a structure in which a 100-nm-thick silicon nitride film formed by a sputtering method is stacked over a 200-nm-thick silicon oxide film formed by a sputtering method. Note that when the insulating film 426 is formed by a sputtering method, the substrate may be heated to a temperature of 100° C. to 400° C., a sputtering gas from which hydrogen, water, hydroxyl group, hydride, or the like is removed and which contains high-purity nitrogen may be introduced, and the insulating film 426 may be formed using a silicon semiconductor target. Also in this case, the insulating film is preferably formed while hydrogen, water, hydroxyl group, hydride, or the like remaining in the treatment chamber is removed.

Note that after the insulating film 426 is formed, heat treatment may be performed. The heat treatment is performed in an inert gas atmosphere (nitrogen, helium, neon, argon, or the like) at a temperature of preferably greater than or equal to 200° C. and less than or equal to 400° C., for example, greater than or equal to 250° C. and less than or equal to 350° C.

Contact holes 431, 432, and 433 are formed as follows: a resist mask is formed by a photolithography step and parts of the gate insulating film 424 and the insulating film 426 are selectively removed by etching. A part of the gate electrode 425 is exposed in the contact hole 431; a part of the second electrode 423 is exposed in the contact hole 432; and a part of the gate electrode 425 is exposed in the contact hole 433. At the time of the formation of these contact holes, a contact hole which exposes the first electrode 421 may be formed in a region of the first electrode 421, which is not covered with the gate electrode 425.

A wiring 434, a wiring 435, and a wiring 436 are connected to the gate electrode 425, the second electrode 423, and the gate electrode 425 through the contact hole 431, the contact hole 432, and the contact hole 433 which are formed in the insulating film 426, respectively. Note that in formation of these wirings, a wiring connected to the first electrode 421 through the contact hole may be formed.

The wirings 434, 435, and 436 can be formed using a conductive film having a structure and a material which are similar to those for the first electrode 421 by a manufacturing method similar to that for the first electrode 421.

In FIG. 14B, a wiring 440 is a wiring formed at the same time as the wirings 434, 435, and 436 and is connected to the first electrode 421 through a contact hole 441.

As described above, the concentration of hydrogen in the oxide semiconductor film can be reduced and the oxide semiconductor film can be highly purified. Thus, the oxide semiconductor film can be stabilized. In addition, heat treatment at a temperature of less than or equal to the glass transition temperature makes it possible to form an oxide semiconductor film with a wide band gap in which carrier density is extremely low. Therefore, a transistor can be manufactured using a large-sized substrate, so that productivity can be increased. In addition, by using the oxide semiconductor film in which the hydrogen concentration is reduced and purity is improved, it is possible to manufacture a transistor with high withstand voltage, a low short-channel effect, and a high on-off ratio.

Although all the part of the oxide semiconductor film 422, which is formed in a region that is different from a region where the second electrode 423 is formed is covered with the gate electrode 425 in this embodiment, the present invention is not limited to this structure, and at least a part of the oxide semiconductor film 422, which is formed in the region that is different from the region where the second electrode 423 is formed, may be covered with the gate electrode 425.

Now, a drain withstand voltage of the transistor described in this embodiment is described.

When the electric field in the semiconductor reaches a certain threshold value, impact ionization occurs, and carriers accelerated by the high electric field impact crystal lattices in a depletion layer, thereby generating pairs of electrons and holes. When the electric field becomes even higher, the pairs of electrons and holes generated by the impact ionization are further accelerated by the electric field, and the impact ionization is repeated, resulting in an avalanche breakdown in which current is increased exponentially. The impact ionization occurs because carriers (electrons and holes) have a kinetic energy that is greater than or equal to the band gap of the semiconductor. Therefore, as the band gap is larger, the electric field needed to cause the impact ionization is high.

Since the band gap of the oxide semiconductor is 3.15 eV, which is larger than the band gap of amorphous silicon, i.e., 1.74 eV, the avalanche breakdown is unlikely to occur. Therefore, a transistor including the oxide semiconductor has a high drain withstand voltage, and an exponential sudden increase of on-state current is unlikely to occur when a high electric field is applied.

Next, hot-carrier degradation of a transistor including the oxide semiconductor is described.

The hot-carrier degradation means deterioration of transistor characteristics, e.g., shift in the threshold voltage or leakage current, which is caused as follows: electrons that are accelerated to be rapid are injected in the vicinity of a drain in a channel into a gate insulating film and become fixed electric charge or form trap levels at the interface between the gate insulating film and the oxide semiconductor. The factors of the hot-carrier degradation are, for example, channel-hot-electron injection (CHE injection) and drain-avalanche-hot-carrier injection (DAHC injection).

Since the band gap of silicon is narrow, electrons are likely to be generated like an avalanche owing to an avalanche breakdown, and the number of electrons that are accelerated to be so rapid as to go over a barrier to the gate insulating film is increased. However, the oxide semiconductor described in this embodiment has a wide band gap; therefore, the avalanche breakdown is unlikely to occur and resistance to the hot-carrier degradation is higher than that of silicon.

Although the band gap of silicon carbide which is one of materials having high withstand voltage and that of the oxide semiconductor are substantially equal to each other, in the oxide semiconductor, electrons are less likely to be accelerated because the mobility of the oxide semiconductor is two orders of magnitude lower than that of silicon carbide, and hot-carrier degradation is less likely to be caused and drain withstand voltage is high as compared with silicon carbide.

From the above, the transistor including the oxide semiconductor has high drain withstand voltage; specifically, such a transistor can have a drain withstand voltage of greater than or equal to 100 V, preferably greater than or equal to 500 V, more preferably greater than or equal to 1 kV.

Comparison between a transistor including silicon carbide, which is a typical example of a transistor, and a transistor including an oxide semiconductor will be described below. Here, 4H—SiC is used as the silicon carbide.

An oxide semiconductor and 4H—SiC have some points in common. One example is intrinsic carrier density. According to the Fermi-Dirac distribution, the intrinsic carrier density of the oxide semiconductor is estimated to about $10^{-7}$ cm$^{-3}$, which is extremely low like the carrier density of 4H—SiC, i.e., $6.7 \times 10^{-11}$ cm$^{-3}$.

In addition, the energy band gap of the oxide semiconductor is 3.0 eV to 3.5 eV and that of 4H—SiC is 3.26 eV, which means that the oxide semiconductor and the silicon carbide are both wide-gap semiconductors.

However, the process temperature of a transistor including an oxide semiconductor and the process temperature of a transistor including silicon carbide are greatly different from each other. Heat treatment at 1500° C. to 2000° C. is generally needed in the case of using silicon carbide. In contrast, in the case of an oxide semiconductor, manufacturing can be performed with heat treatment at 300° C. to 850° C., which allows a transistor to be manufactured over a large-sized substrate. In addition, the throughput can be improved.

Further, a manufacturing process of the transistor including silicon carbide, which uses a PN junction, involves a step of doping with an impurity that can be a donor or an acceptor (e.g., phosphorus or boron); therefore, the number of manufacturing steps is increased. On the other hand, the transistor including an oxide semiconductor is not needed to be provided with a PN junction; therefore, the number of manufacturing steps can be decreased and the throughput can be improved, and further, a large-sized substrate can be used.

Note that considerable research has been done on properties of oxide semiconductors such as density of states (DOS) in the band gap; however, the research does not include the idea of sufficiently reducing the DOS itself. In this embodiment, a highly purified oxide semiconductor is formed by removing water or hydrogen which might induce the DOS from the oxide semiconductor. This is based on the idea of sufficiently reducing the DOS itself. Such a highly purified oxide semiconductor enables fabrication of very excellent industrial products.

Further, it is also possible to form a more highly purified (i-type) oxide semiconductor by supplying oxygen to a dangling bond of metal which is generated by oxygen deficiency and reducing the DOS due to the oxygen deficiency. For example, an oxide film containing an excessive amount of oxygen is formed in close contact with a channel formation region and oxygen is supplied from the oxide film, whereby the DOS due to oxygen deficiency can be reduced.

A defect of an oxide semiconductor is said to be attributed to a shallow level of 0.1 eV to 0.2 eV under the conduction band due to excessive hydrogen, a deep level due to shortage of oxygen, or the like. Thorough removal of hydrogen and sufficient supply of oxygen for elimination of such defects would be right as a technical idea.

An oxide semiconductor is generally considered as an n-type semiconductor; however, in this embodiment, an i-type oxide semiconductor is realized by removing an impurity, particularly water or hydrogen. In this point, the technical idea of the present invention is novel as compared with a conventional technical idea in which an i-type semiconductor is formed by adding an impurity to a semiconductor such as silicon.

By making the oxide semiconductor be an i-type semiconductor, favorable temperature characteristics of the transistor can be obtained; specifically, in terms of the current vs. voltage characteristics of the transistor, on-state current, off-state current, field-effect mobility, an S value, and a threshold voltage are hardly fluctuated in the temperature range of from −25° C. to 150° C., and the current vs. voltage characteristics are hardly degraded by the temperature.

The transistor including an oxide semiconductor described in this embodiment has a mobility that is about two orders of magnitude lower than that of a transistor including silicon carbide. However, the current value of the transistor including an oxide semiconductor can be increased by increasing the drain voltage or the channel width (W); thus, device characteristics can be improved.

The technical idea of this embodiment is that a substance is not added to an oxide semiconductor and on the contrary the oxide semiconductor itself is highly purified by intentionally removing impurities such as water or hydrogen which undesirably exist therein, in other words, the oxide semiconductor is highly purified by removing water or hydrogen which forms a donor level, reducing oxygen deficiency, and sufficiently supplying oxygen that is a component of the oxide semiconductor.

Immediately after being deposited, the oxide semiconductor film contains hydrogen at approximately $10^{20}$ cm$^{-3}$, which is measured by SIMS. The oxide semiconductor is highly purified and made to be an electrically i-type (intrinsic) semiconductor by intentionally removing water or hydrogen which forms a donor level and further by adding oxygen (one of components of the oxide semiconductor), which is reduced at the same time as removal of water or hydrogen, to the oxide semiconductor.

In this embodiment, the amount of water or hydrogen in the oxide semiconductor is preferably as small as possible, and the number of carriers in the oxide semiconductor is preferably as small as possible. Specifically, a carrier density of less than $1\times10^{14}$ cm$^{-3}$, preferably less than $1\times10^{12}$ cm$^{-3}$, more preferably less than $1\times10^{11}$ cm$^{-3}$ which is lower than or equal to the measurement limit is desirable. The carriers in the oxide semiconductor are reduced or preferably eliminated, in other words, the oxide semiconductor is made to be an i-type (intrinsic) semiconductor, so that the oxide semiconductor functions as a path in a transistor through which carriers travel. As a result, off-state current can be extremely small when the transistor is off. The above is the technical idea of this embodiment.

In addition, since the oxide semiconductor functions as a path of carriers, and the oxide semiconductor is an i-type (intrinsic) semiconductor which is highly purified so as to include no carriers or extremely few carriers, carriers are supplied by a source electrode and a drain electrode.

Note that the transistor having the structure described in this embodiment can less occupy a substrate surface than a horizontal transistor in which a channel is formed substantially in parallel with a substrate as described in Embodiment 4. As a result, it is possible to miniaturize the transistor.

As described above, the oxide semiconductor film is highly purified so that impurities other than a main component of the oxide semiconductor film, typically, hydrogen, water, hydroxyl group, or hydride, may be contained as little as possible, whereby good operation of the transistor can be obtained. In particular, withstand voltage can be higher, a short channel effect can be reduced, and a high on-off ratio can be realized.

This embodiment can be implemented by being combined as appropriate with any of the above-described embodiments.

Embodiment 7

In this embodiment, a method for forming an oxide semiconductor film, which is different from that in Embodiment 4, will be described with reference to FIGS. 15A to 15E.

Figure 15A:
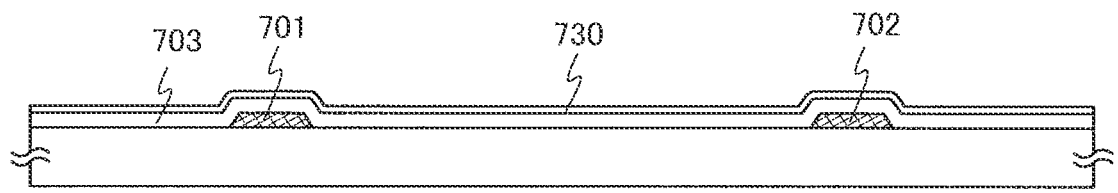
FIGS. 15A to 15E are diagrams illustrating a method for manufacturing a memory device.

First, a gate electrode 701 and a gate electrode 702 are formed over an insulating surface, and then a gate insulating film 703 is formed over the gate electrode 701 and the gate electrode 702 (see FIG. 15A). Since materials, structures, and thicknesses of the gate electrode 701, the gate electrode 702, and the gate insulating film 703 are already described in Embodiment 4, the detailed description thereof is omitted in this embodiment.

Next, as illustrated in FIG. 15A, a first oxide semiconductor film 730 with a thickness of greater than or equal to 2 nm and less than or equal to 15 nm is formed over the gate insulating film 703. The first oxide semiconductor film 730 can be formed by a sputtering method in a rare gas (typically, argon) atmosphere, an oxygen atmosphere, or a mixed atmosphere containing a rare gas (for example, argon) and oxygen.

Note that before the first oxide semiconductor film 730 is formed by a sputtering method, dust attached to a surface of the gate insulating film 703 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate and modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

For the first oxide semiconductor film 730, the above-described oxide semiconductor can be used.

In this embodiment, as the first oxide semiconductor film 730, an In—Ga—Zn—O-based non-single-crystal film with a thickness of 5 nm, which is obtained by a sputtering method using a metal oxide target containing indium (In), gallium (Ga), and zinc (Zn), is used. As the target, a metal oxide target containing metal atoms at a composition ratio of In:Ga:Zn=1: 1:0.5, In:Ga:Zn=1:1:1, or In:Ga:Zn=1:1:2 can be used, for example. In this embodiment, a metal oxide target with which crystallization is likely to be caused is preferably used in order to intentionally perform crystallization by heat treatment performed later. The filling rate of the metal oxide target containing In, Ga, and Zn is greater than or equal to 90% and less than or equal to 100%, preferably greater than or equal to 95% and less than or equal to 99.9%. When a metal oxide target having a high filling rate is used, the impurity concentration of the oxide semiconductor film to be formed can be reduced, so that a transistor with excellent electric characteristics or high reliability can be obtained.

A substrate is held in a treatment chamber kept under reduced pressure, a sputtering gas from which hydrogen and moisture are removed is introduced into the treatment chamber from which remaining moisture is being removed, and the first oxide semiconductor film 730 is formed over the insulating surface with the use of a metal oxide as a target. In the deposition, the substrate may be heated to greater than or equal to 100° C. and less than or equal to 600° C., preferably greater than or equal to 200° C. and less than or equal to 400° C. By forming the oxide semiconductor film in a state where the substrate is heated, the concentration of impurities contained in the formed oxide semiconductor film can be reduced. In addition, damage by sputtering can be reduced. In order to remove remaining moisture from the treatment chamber, an entrapment vacuum pump is preferably used. For example, a cryopump, an ion pump, or a titanium sublimation pump is preferably used. The evacuation unit may be a turbo pump provided with a cold trap. When the treatment chamber is evacuated with the cryopump, for example, a hydrogen atom, a compound containing a hydrogen atom such as water ($H_2O$) (more preferably, also a compound containing a carbon atom), and the like are removed, whereby the impurity concentration of the oxide semiconductor film formed in the treatment chamber can be reduced.

An example of the deposition condition is as follows: the distance between the substrate and the target is 170 mm, the pressure is 0.4 Pa, the electric power of the direct current (DC) power source is 0.5 kW, and the atmosphere is an oxygen atmosphere (the proportion of the oxygen flow rate is 100%). Note that a pulse direct current (DC) power source is preferable because dust called particles generated in film formation can be reduced and the film thickness can be uniform. The oxide semiconductor film preferably has a thickness of greater than or equal to 5 nm and less than or equal to 30 nm. Note that the appropriate thickness of the oxide semiconductor film varies depending on the oxide semiconductor material, and the thickness may be determined as appropriate depending on the material.

Note that in order that hydrogen, hydroxyl group, and moisture are contained as little as possible in the first oxide semiconductor film 730, it is preferable that as pretreatment before the film formation, the substrate over which layers up to and including the gate insulating film 703 are formed be preheated in a preheating chamber of the sputtering apparatus, so that impurities such as hydrogen or moisture absorbed onto the substrate are eliminated and removed. The temperature for the preheating is greater than or equal to 100° C. and less than or equal to 600° C., preferably greater than or equal to 150° C. and less than or equal to 300° C. As an evacuation unit provided in the preheating chamber, a cryopump is preferable. Note that this preheating treatment can be omitted.

Figure 15B:
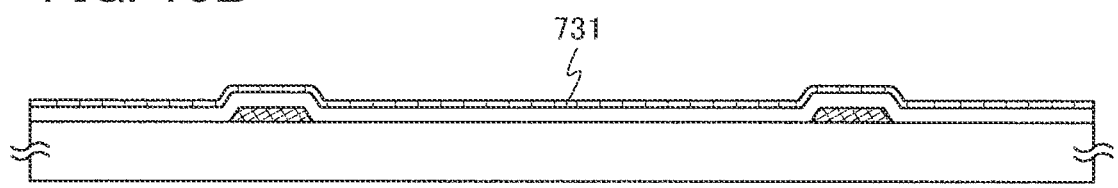

Next, first heat treatment is performed and crystals are grown from a surface of the first oxide semiconductor film 730, so that a first oxide semiconductor film 731 in which at least a part thereof is crystallized or becomes single crystals is obtained, as illustrated in FIG. 15B. The first heat treatment is performed at a temperature of greater than or equal to 450° C. and less than or equal to 850° C., preferably greater than or equal to 600° C. and less than or equal to 700° C. In addition, heating time is greater than or equal to 1 minute and less than or equal to 24 hours. A single crystal layer includes a plate-shaped crystal obtained by crystal growth from the surface to the inside and has an average thickness of greater than or equal to 2 nm and less than or equal to 10 nm. The crystal layer formed at the surface has the a-b plane at the surface and is c-axis oriented perpendicularly to the surface. In this embodiment, an example in which the entire first oxide semiconductor film 731 is crystallized (crystals are also referred to as co-growing (CG) crystals) by the first heat treatment is described.

Note that in the first heat treatment, it is preferable that water, hydrogen, and the like be not contained in nitrogen, oxygen, or a rare gas such as helium, neon, or argon. In addition, it is preferable that the purity of nitrogen, oxygen, or a rare gas such as helium, neon, or argon which is introduced to the heat treatment apparatus be greater than or equal to 6N (99.9999%), preferably greater than or equal to 7N (99.99999%) (that is, the impurity concentration is less than or equal to 1 ppm, preferably less than or equal to 0.1 ppm). Further, the first heat treatment may be performed in a dry air atmosphere with an $H_2O$ concentration of less than or equal to 20 ppm.

In this embodiment, heat treatment in a dry air atmosphere at 700° C. for one hour is performed as the first heat treatment.

Note that a heat treatment apparatus is not limited to an electrical furnace, and may include a device for heating an object to be processed by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, the heat treatment can employ GRTA in which the substrate is transferred into an inert gas heated at a high temperature of 650° C. to 700° C., and heated for several minutes there, and then the substrate is transferred and taken out of the high-temperature inert gas. With GRTA, high-temperature heat treatment for a short period of time can be achieved.

Figure 15C:
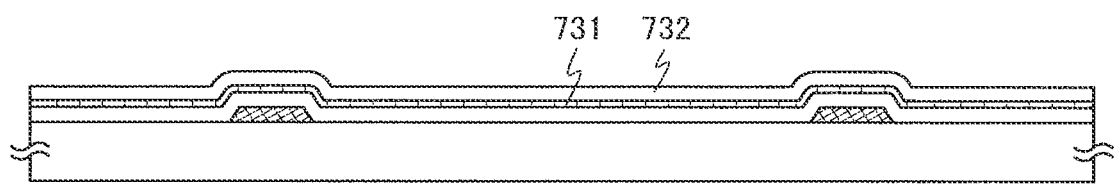

Next, as illustrated in FIG. 15C, a second oxide semiconductor film 732 is formed over the first oxide semiconductor film 731, which includes plate-shaped single crystals. The thickness of the second oxide semiconductor film 732 is at least larger than that of the first oxide semiconductor film 731 and less than or equal to 10 μm. Note that an appropriate thickness of the second oxide semiconductor film 732 may be determined by a practitioner depending on a device to be manufactured. For example, in the case where a bottom-gate transistor is manufactured, the total thickness of the first oxide semiconductor film 731 and the second oxide semiconductor film 732 is greater than or equal to 10 nm and less than or equal to 200 nm. In addition, for example, in the case where a top-gate transistor is manufactured, the total thickness of the first oxide semiconductor film 731 and the second oxide semiconductor film 732 is greater than or equal to 10 nm and less than or equal to 50 nm. The second oxide semiconductor film 732 can be formed by a sputtering method in a rare gas (typically, argon) atmosphere, an oxygen atmosphere, or an atmosphere containing a rare gas (typically, argon) and oxygen.

The above oxide semiconductor can be used for the second oxide semiconductor film 732.

It is preferable that the first oxide semiconductor film 731 and the second oxide semiconductor film 732 be formed using materials containing the same components, or have the same crystal structure and close lattice constants (lattice mismatch is less than or equal to 1%). In the case where the materials containing the same components are used, crystal growth is further promoted from the single crystal layer of the first oxide semiconductor film 731 in crystallization performed later. In addition, in the case where the materials containing the same components are used, an interface property such as adhesion or electric characteristics are good. Note that the second oxide semiconductor film 732 is preferably formed using a material whose electric characteristics (e.g., mobility, threshold voltage, or band gap) are more favorable than those of the first oxide semiconductor film 731 when the degree of crystallinity is increased.

Figure 15D:
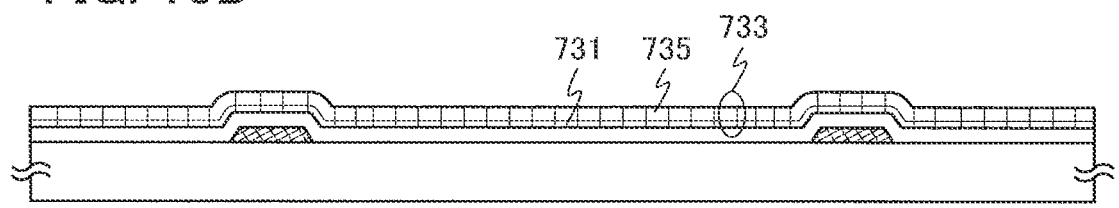
Figure 15E:
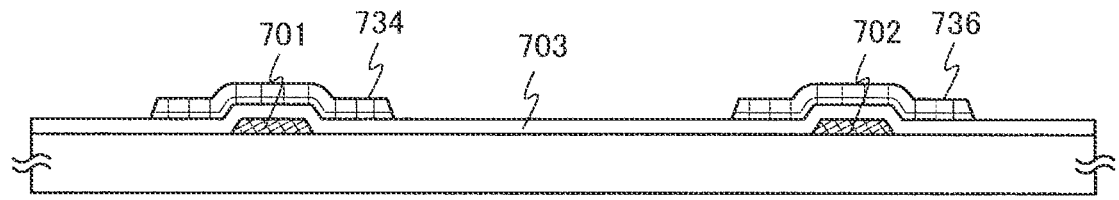
Figure 16A:
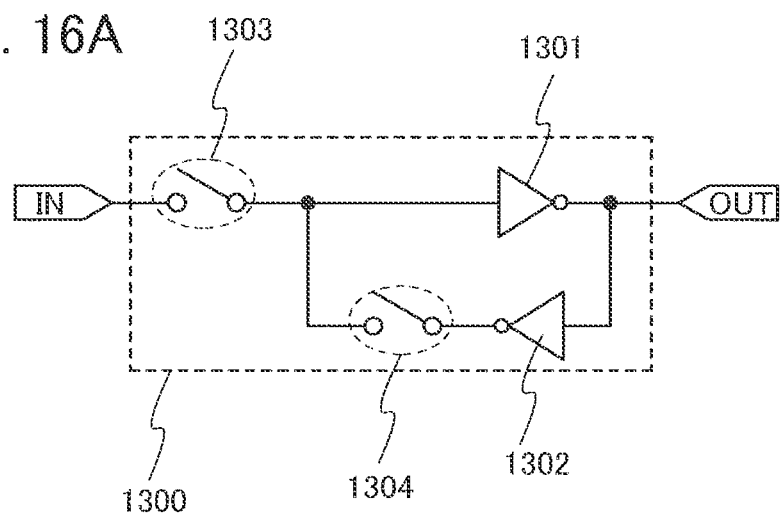
FIGS. 16A and 16B are circuit diagrams of a conventional memory element.
Figure 16B:
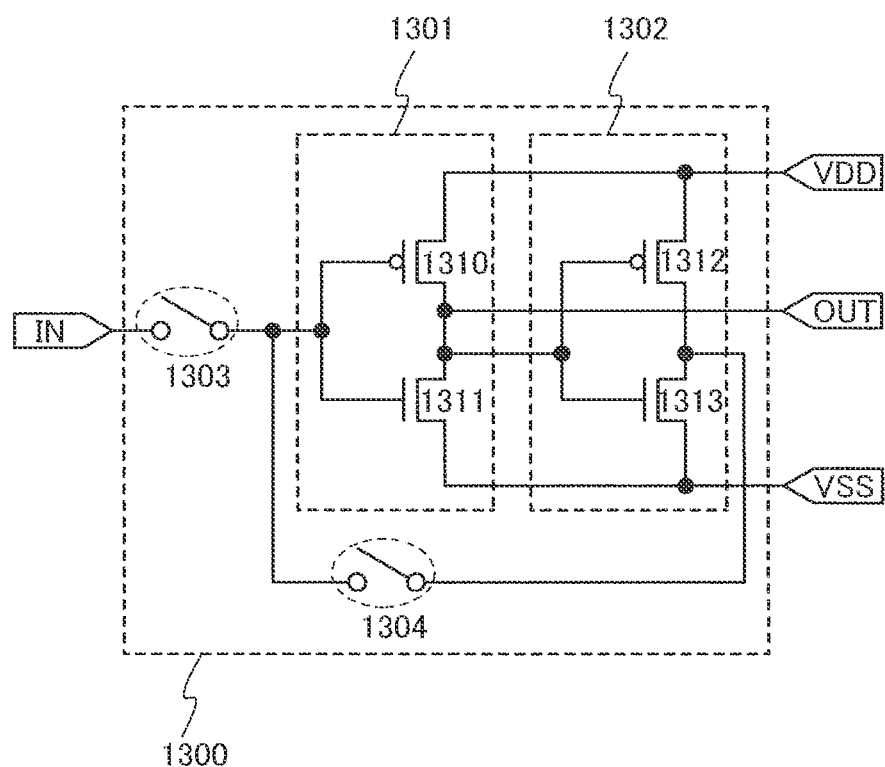

Next, second heat treatment is performed, so that crystals are grown from the first oxide semiconductor film 731 toward the second oxide semiconductor film 732. The second heat treatment is performed at a temperature of greater than or equal to 450° C. and less than or equal to 850° C., preferably greater than or equal to 550° C. and less than or equal to 650° C. In addition, heating time is greater than or equal to 1 minute and less than or equal to 24 hours. By the second heat treatment, as illustrated in FIG. 15D, an oxide semiconductor film 733 which includes the crystallized first oxide semiconductor film 731 and a crystallized second oxide semiconductor film 735 can be obtained.

In the case where oxide semiconductor materials used for the first oxide semiconductor film 731 and the second oxide semiconductor film 735 contain the same components, the first oxide semiconductor film 731 and the second oxide semiconductor film 735 have the same crystal structure. The second oxide semiconductor film 735 is formed through axial growth or epitaxial growth from the first oxide semiconductor film 731, and thus, the c-axes of the second oxide semiconductor film 735 and the first oxide semiconductor film 731 are identical with each other. As a result, in the oxide semiconductor film 733, actually, the boundary between the first oxide semiconductor film 731 and the second oxide semiconductor film 735 is unclear.

In some cases, the oxide semiconductor film 733 includes polycrystals in a region overlapping with an uneven part of the gate insulating film and thus includes a crystal grain boundary. In addition, a region of the oxide semiconductor film 733 which serves as a channel formation region overlaps with at least a flat part of the gate insulating film, and therefore there is also a case where the first oxide semiconductor film 731 and the second oxide semiconductor film 735 include c-axis-oriented single crystals. In the case where the first oxide semiconductor film 731 and the second oxide semiconductor film 735 are c-axis-oriented, the first oxide semiconductor film 731 and the second oxide semiconductor film 735 desirably have identical a-b planes, a-axes, or b-axes; however, the direction of the a-axes or b-axes may be different in some cases.

Note that also in the second heat treatment, it is preferable that water, hydrogen, and the like be not contained in nitrogen, oxygen, or a rare gas such as helium, neon, or argon. Alternatively, the purity of nitrogen, oxygen, or a rare gas such as helium, neon, or argon which is introduced into the heat treatment apparatus is greater than or equal to 6N, preferably greater than or equal to 7N (i.e., the impurity concentration is less than or equal to 1 ppm, preferably less than or equal to 0.1 ppm). Alternatively, the second heat treatment may be performed in ultra dry air with an $H_2O$ concentration of less than or equal to 20 ppm. When the temperature is increased in the second heat treatment, the inside of a furnace may be set to a nitrogen atmosphere, and when cooling is performed, the atmosphere of the inside of the furnace may be switched to an oxygen atmosphere.

Note that the heat treatment apparatus for the second heat treatment is not limited to a particular apparatus and the apparatus may be provided with a device for heating an object to be processed by heat radiation or heat conduction from a heating element such as a resistance heating element. For example, an electric furnace, or an RTA apparatus such as a GRTA apparatus or an LRTA apparatus can be used.

Next, the shape of the oxide semiconductor film 733 is processed by a photolithography method, so that an island-shaped oxide semiconductor film 734 and an island-shaped oxide semiconductor film 736 are formed to overlap with the gate electrode 701 and the gate electrode 702, respectively. Note that a resist mask for forming the island-shaped oxide semiconductor films may be formed by an inkjet method. Formation of the resist mask by an inkjet method needs no photomask; thus, manufacturing cost can be reduced.

In accordance with the step for forming the source electrode and the drain electrode illustrated in FIG. 11A and the steps following the step in Embodiment 4, a transistor which serves as a switching element in a memory element can be manufactured.

This embodiment can be implemented by being combined as appropriate with any of the above-described embodiments.

Embodiment 8

In this embodiment, a configuration of a CPU, which is one of signal processing circuits according to one embodiment of the present invention, will be described.

Figure 17:
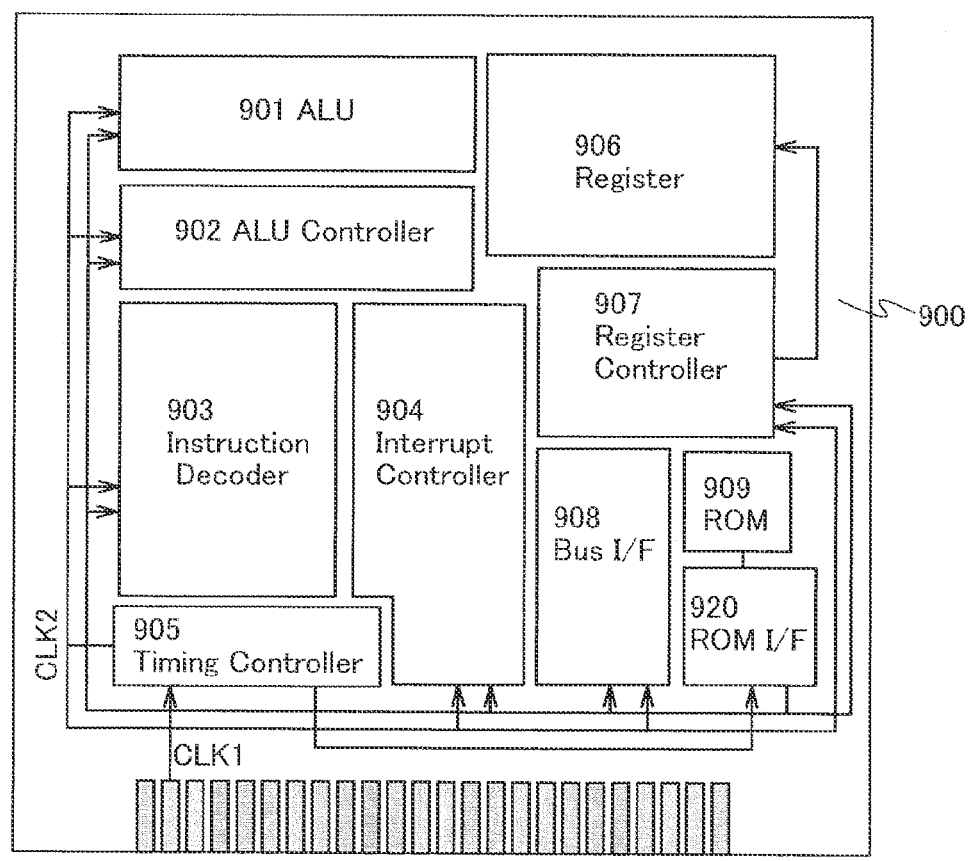
FIG. 17 is a block diagram of a CPU in which a memory device is used.

In FIG. 17, the configuration of the CPU of this embodiment is illustrated. The CPU illustrated in FIG. 17 mainly includes an arithmetic logic unit (ALU) 901, an ALU controller 902, an instruction decoder 903, an interrupt controller 904, a timing controller 905, a register 906, a register controller 907, a bus interface (Bus I/F) 908, a rewritable ROM 909, and a ROM interface (ROM I/F) 920, over a substrate 900. Further, the ROM 909 and the ROM I/F 920 may be provided over different chips. Needless to say, the CPU illustrated in FIG. 17 is only an example in which the configuration is simplified, and an actual CPU may have various configurations depending on the applications.

An instruction which is input to the CPU through the Bus I/F 908 is input to the instruction decoder 903 and decoded therein, and then, input to the ALU controller 902, the interrupt controller 904, the register controller 907, and the timing controller 905.

The ALU controller 902, the interrupt controller 904, the register controller 907, and the timing controller 905 perform various controls based on the decoded instruction. Specifically, the ALU controller 902 generates signals for controlling the operation of the ALU 901. While the CPU is executing a program, the interrupt controller 904 judges an interrupt request from an external input/output device or a peripheral circuit based on its priority or a mask state, and processes the request. The register controller 907 generates an address of the register 906, and reads/writes data from/to the register 906 in accordance with the state of the CPU.

The timing controller 905 generates signals for controlling operation timings of the ALU 901, the ALU controller 902, the instruction decoder 903, the interrupt controller 904, and the register controller 907. For example, the timing controller 905 is provided with an internal clock generator for generating an internal clock signal CLK2 based on a reference clock signal CLK1, and supplies the clock signal CLK2 to the above circuits.

In the CPU of this embodiment, a memory element having the structure described in any of the above embodiments is provided in the register 906. The register controller 907 selects the holding operation in the register 906 in accordance with an instruction from the ALU 901. That is, in the memory element included in the register 906, whether data is held in a phase-inversion element or in a capacitor is selected. In the case where selection is made so that data is held in the phase-inversion element, power supply voltage is supplied to the memory element in the register 906. In the case where selection is made so that data is held in the capacitor, the data is written into the capacitor, and the supply of the power supply voltage to the memory element in the register 906 can be stopped. The power supply can be stopped by providing a switching element between a memory element group and a node to which a power supply potential VDD or a power supply potential VSS is supplied, as illustrated in FIG. 13A or FIG. 13B.

In such a manner, even in the case where the operation of the CPU is temporarily stopped and the supply of the power supply voltage is stopped, data can be held and the power consumption can be reduced. Specifically, for example, while a user of a personal computer does not input data to an input device such as a keyboard, the operation of the CPU can be stopped, so that the power consumption can be reduced.

Although the CPU is given as an example in this embodiment, the signal processing circuit of the present invention is not limited to be applied to the CPU, but can be applied to an LSI such as a DSP, a custom LSI, or a field programmable gate array (FPGA).

This embodiment can be implemented by being combined with any of the above embodiments as appropriate.

Example 1

A signal processing circuit according to one embodiment of the present invention is used so that a highly reliable electronic device and an electronic device with low power consumption can be provided. In particular, in the case of a portable electronic device which has difficulty in continuously receiving power, when a signal processing circuit with low power consumption according to one embodiment of the present invention is added as a component of the device, an advantage in increasing the continuous operation time can be obtained. Further, by use of a transistor with small off-state current, redundant circuit design which is needed to cover a failure caused by large off-state current is unnecessary; therefore, the integration degree of the signal processing circuit can be increased, and a signal processing circuit having higher functionality can be formed.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as electronic devices which can be provided with the signal processing circuit according to one embodiment of the present invention, mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 18A to 18F.

Figure 18A:
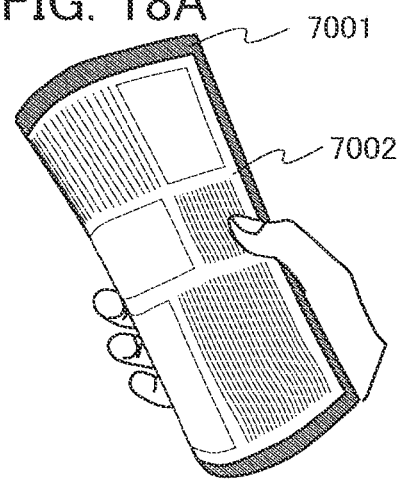
FIGS. 18A to 18F are diagrams illustrating structures of electronic devices.

FIG. 18A illustrates an e-book reader including a housing 7001, a display portion 7002, and the like. The signal processing circuit according to one embodiment of the present invention can be used for an integrated circuit used for controlling driving of the e-book reader. With the use of the signal processing circuit which is one embodiment of the present invention for the integrated circuit for controlling driving of the e-book reader, a highly reliable e-book reader and an e-book reader with low power consumption can be provided. When a flexible substrate is used, the signal processing circuit can have flexibility, whereby a user-friendly e-book reader which is flexible and lightweight can be provided.

Figure 18B:
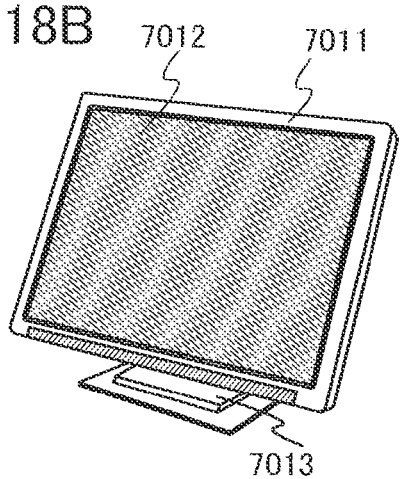

FIG. 18B illustrates a display device including a housing 7011, a display portion 7012, a supporting base 7013, and the like. The signal processing circuit according to one embodiment of the present invention can be used for an integrated circuit used for controlling driving of the display device. With the use of the signal processing circuit which is one embodiment of the present invention for the integrated circuit for controlling driving of the display device, a highly reliable display device and a display device with low power consumption can be provided. Note that a display device includes all display devices for displaying information, such as display devices for personal computers, for receiving television broadcast, and for displaying advertisement, in its category.

Figure 18C:
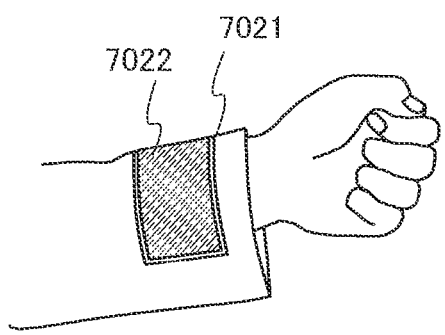

FIG. 18C illustrates a display device including a housing 7021, a display portion 7022, and the like. The signal processing circuit according to one embodiment of the present invention can be used for an integrated circuit used for controlling driving of the display device. With the use of the signal processing circuit which is one embodiment of the present invention for the integrated circuit for controlling driving of the display device, a highly reliable display device and a display device with low power consumption can be provided. Moreover, with the use of a flexible substrate, the signal processing circuit can have flexibility. Thus, a user-friendly display device which is flexible and lightweight can be provided. Accordingly, as illustrated in FIG. 18C, the display device can be used while being fixed to fabric or the like, and an application range of the display device is dramatically widened.

Figure 18D:
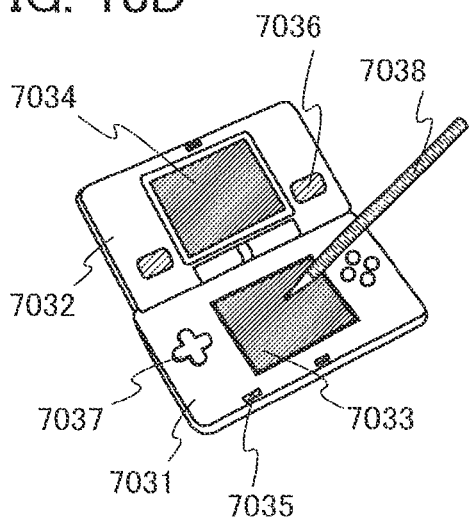

FIG. 18D illustrates a portable game machine including a housing 7031, a housing 7032, a display portion 7033, a display portion 7034, a microphone 7035, speakers 7036, operation keys 7037, a stylus 7038, and the like. The signal processing circuit according to one embodiment of the present invention can be used for an integrated circuit used for controlling driving of the portable game machine. With the use of the signal processing circuit which is one embodiment of the present invention for the integrated circuit for controlling driving of the portable game machine, a highly reliable portable game machine and a portable game machine with low power consumption can be provided. Although the portable game machine illustrated in FIG. 18D has the two display portions 7033 and 7034, the number of display portions included in the portable game machine is not limited thereto.

Figure 18E:
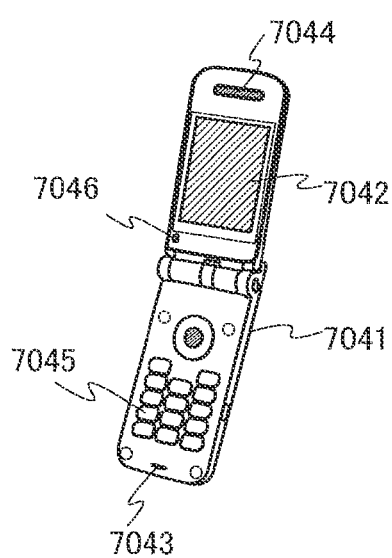

FIG. 18E illustrates a mobile phone including a housing 7041, a display portion 7042, an audio-input portion 7043, an audio-output portion 7044, operation keys 7045, a light-receiving portion 7046, and the like. Light received at the light-receiving portion 7046 is converted into electrical signals, whereby external images can be loaded. The signal processing circuit according to one embodiment of the present invention can be used for an integrated circuit used for controlling driving of the mobile phone. With the use of the signal processing circuit which is one embodiment of the present invention for the integrated circuit for controlling driving of the mobile phone, a highly reliable mobile phone and a mobile phone with low power consumption can be provided.

Figure 18F:
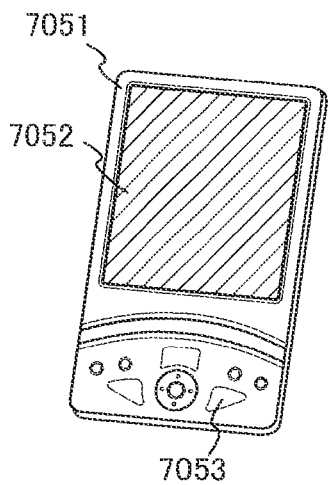

FIG. 18F illustrates a portable information terminal including a housing 7051, a display portion 7052, operation keys 7053, and the like. In the portable information terminal illustrated in FIG. 18F, a modem may be incorporated in the housing 7051. The signal processing circuit according to one embodiment of the present invention can be used for an integrated circuit used for controlling driving of the portable information terminal. With the use of the signal processing circuit which is one embodiment of the present invention for the integrated circuit for controlling driving of the portable information terminal, a highly reliable portable information terminal and a portable information terminal with low power consumption can be provided.

This example can be implemented in combination with any of the above-described embodiments as appropriate.

This application is based on Japanese Patent Application serial no. 2010-009908 filed with Japan Patent Office on Jan. 20, 2010, the entire contents of which are hereby incorporated by reference.

The invention claimed is:

1. A signal processing circuit comprising:
an arithmetic circuit; and
a memory device configured to store data from the arithmetic circuit,
wherein the memory device comprises a plurality of memory elements and a switching element configured to control supply of power supply voltage to the plurality of memory elements,
wherein each of the plurality of memory elements comprises a pair of logic elements configured to hold the data by connection of an output terminal of one of the pair of logic elements to an input terminal of the other of the pair of logic elements and an output terminal of the other of the pair of logic elements to an input terminal of the one of the pair of logic elements, a capacitor, and a transistor which includes a oxide semiconductor in a channel formation region and is configured to control writing of the data to the capacitor, and
wherein the pair of logic elements comprise at least one of an inverter and a clocked inverter.

2. The signal processing circuit according to claim 1, wherein off-state current density of the transistor is less than or equal to 100 zA/µm.

3. The signal processing circuit according to claim 1, wherein the oxide semiconductor is an In—Ga—Zn—O-based oxide semiconductor.

4. The signal processing circuit according to claim 1, wherein a hydrogen concentration of the channel formation region is less than or equal to $5 \times 10^{19}/cm^3$.

5. The signal processing circuit according to claim 1, wherein the signal processing circuit is selected from the group consisting of an LSI comprising a CPU, a DSP and a microcontroller.

6. A signal processing circuit comprising:
a plurality of arithmetic circuits; and
a plurality of memory devices configured to store data from the plurality of arithmetic circuits,
wherein each of the plurality of arithmetic circuits includes a logic circuit configured to carry out arithmetic processing and a first switching element configured to control supply of power supply voltage to the logic circuit,
wherein each of the plurality of memory devices includes a plurality of memory elements and a second switching element configured to control supply of power supply voltage to the plurality of memory elements,
wherein each of the plurality of memory elements includes a pair of logic elements configured to hold the data by connection of an output terminal of one logic element to an input terminal of the other logic element and an output terminal of the other logic element to an input terminal of the one logic element, a capacitor, and a transistor which includes an oxide semiconductor in a channel formation region and is configured to control writing of the data to the capacitor, and
wherein the pair of logic elements comprise at least one of an inverter and a clocked inverter.

7. The signal processing circuit according to claim 6, wherein off-state current density of the transistor is less than or equal to 100 zA/µm.

8. The signal processing circuit according to claim 6, wherein the oxide semiconductor is an In—Ga—Zn—O-based oxide semiconductor.

9. The signal processing circuit according to claim 6, wherein a hydrogen concentration of the channel formation region is less than or equal to $5 \times 10^{19}/cm^3$.

10. The signal processing circuit according to claim 6, wherein the signal processing circuit is selected from the group consisting of an LSI comprising a CPU, a DSP and a microcontroller.

11. A semiconductor device comprising:
a memory element comprising a first logic element comprising at least one of an inverter and a clocked inverter, a second logic element comprising at least one of an inverter and a clocked inverter, a capacitor and a first transistor,
wherein an input terminal of the first logic element is electrically connected to an output terminal of the second logic element,
wherein an input terminal of the second logic element is electrically connected to an output terminal of the first logic element,
wherein one of a source and a drain of the first transistor is electrically connected to one electrode of the capacitor,
wherein the other of the source and the drain of the first transistor is electrically connected to the input terminal of the first logic element, and
wherein the first transistor comprises an oxide semiconductor in a channel formation region.

12. The semiconductor device according to claim 11, further comprising a second transistor,
wherein one of a source and a drain of the second transistor is electrically connected to the input terminal of the first logic element, and
wherein the other of the source and the drain of the second transistor is electrically connected to the output terminal of the second logic element.

13. The semiconductor device according to claim 11, further comprising an arithmetic circuit,
wherein the memory element is configured to store data from the arithmetic circuit.

14. The semiconductor device according to claim 11, wherein off-state current density of the first transistor is less than or equal to 100 zA/µm.

15. The semiconductor device according to claim 11, wherein the oxide semiconductor is an In—Ga—Zn—O-based oxide semiconductor.

16. The semiconductor device according to claim 11, wherein a hydrogen concentration of the channel formation region is less than or equal to $5 \times 10^{19}/cm^3$.

17. The semiconductor device according to claim 11, wherein the semiconductor device is selected from the group consisting of an LSI comprising a CPU, a DSP and a microcontroller.

* * * * *